(12) United States Patent
Kimura et al.

(10) Patent No.: US 9,947,802 B2
(45) Date of Patent: Apr. 17, 2018

(54) MANUFACTURING METHOD OF SEMICONDUCTOR DEVICE, MANUFACTURING METHOD OF ELECTRONIC APPLIANCE, SEMICONDUCTOR DEVICE, DISPLAY DEVICE, MEMORY DEVICE, AND ELECTRONIC APPLIANCE

(71) Applicant: SEMICONDUCTOR ENERGY LABORATORY CO., LTD., Atsugi-shi, Kanagawa-ken (JP)

(72) Inventors: Masayuki Kimura, Kanagawa (JP); Yukiko Tojo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/268,805

(22) Filed: Sep. 19, 2016

(65) Prior Publication Data
US 2017/0092779 A1   Mar. 30, 2017

(30) Foreign Application Priority Data
Sep. 24, 2015   (JP) .................................. 2015-187038

(51) Int. Cl.
*H01L 29/786* (2006.01)
*H01L 21/477* (2006.01)
(Continued)

(52) U.S. Cl.
CPC ...... *H01L 29/78693* (2013.01); *H01L 21/477* (2013.01); *H01L 29/41733* (2013.01); *H01L 29/66969* (2013.01)

(58) Field of Classification Search
CPC ........... H01L 29/7869; H01L 29/78696; H01L 29/4908
(Continued)

(56) References Cited

U.S. PATENT DOCUMENTS 6,512,271 B1    1/2003  Yamazaki et al.
6,803,601 B2 *  10/2004  Nakajima ........... H01L 29/4908
                                                           257/59
(Continued)

FOREIGN PATENT DOCUMENTS

JP    2006-165528    6/2006
JP    2013-175710    9/2013

OTHER PUBLICATIONS

K. Ota et al., "Silicon-Compatable Low Resistance S/D Technologies for High-Performance Top-Gate Self-Aligned InGaZnO TFTs with UTBB (Ultra-Thin Body and BOX) Structures", 2015, Symposium on VLSI Circuits Digest of Technical Papers, Jun. 15, 2015, pp. 214-215.

*Primary Examiner* — Jonathan Han
(74) *Attorney, Agent, or Firm* — Nixon Peabody LLP; Jeffrey L. Costellia

(57) ABSTRACT

A semiconductor device is manufactured by forming an oxide layer, forming an insulating layer and a sacrificial layer over the oxide layer, forming a conductive layer over the insulating layer and the sacrificial layer, and performing heat treatment after the formation of the conductive layer so that a first mixed layer is formed in a region of the oxide layer that is in contact with the conductive layer and a second mixed layer is formed in a region of the sacrificial layer that is in contact with the conductive layer. The first mixed layer includes at least one of elements included in the conductive layer. The second mixed layer includes at least one of elements included in the conductive layer. The resistance value of the first mixed layer is smaller than that of the oxide layer.

14 Claims, 63 Drawing Sheets

(51) Int. Cl.
*H01L 29/417* (2006.01)
*H01L 29/66* (2006.01)

(58) Field of Classification Search
USPC ............ 257/43, E27.111, E29.151; 438/104
See application file for complete search history.

(56) References Cited

U.S. PATENT DOCUMENTS

| | | |
|---|---|---|
| 7,791,072 B2 | 9/2010 | Kumomi et al. |
| 8,237,166 B2 | 8/2012 | Kumomi et al. |
| 8,716,073 B2 | 5/2014 | Yamazaki et al. |
| 8,772,768 B2 | 7/2014 | Yamazaki |
| 8,772,769 B2 | 7/2014 | Yamazaki |
| 9,048,265 B2 | 6/2015 | Hondo et al. |
| 9,076,871 B2 | 7/2015 | Yamazaki et al. |
| 9,105,608 B2 | 8/2015 | Yamazaki |
| 9,166,060 B2 * | 10/2015 | Yamazaki ......... H01L 29/78696 |
| 9,240,488 B2 | 1/2016 | Yamazaki et al. |
| 9,246,011 B2 | 1/2016 | Yamazaki et al. |
| 9,425,217 B2 | 8/2016 | Ishihara et al. |
| 2013/0187152 A1 | 7/2013 | Yamazaki et al. |
| 2013/0187161 A1 | 7/2013 | Yamazaki |
| 2013/0196468 A1 | 8/2013 | Yamazaki |
| 2013/0221347 A1 | 8/2013 | Isobe et al. |
| 2014/0070209 A1 | 3/2014 | Yamazaki et al. |
| 2015/0187952 A1* | 7/2015 | Yamazaki ........... H01L 27/0886 257/43 |
| 2015/0214328 A1* | 7/2015 | Tanaka .............. H01L 21/76892 438/479 |
| 2015/0263141 A1 | 9/2015 | Yamazaki et al. |
| 2017/0018647 A1 | 1/2017 | Yamazaki |

\* cited by examiner

FIG. 1A
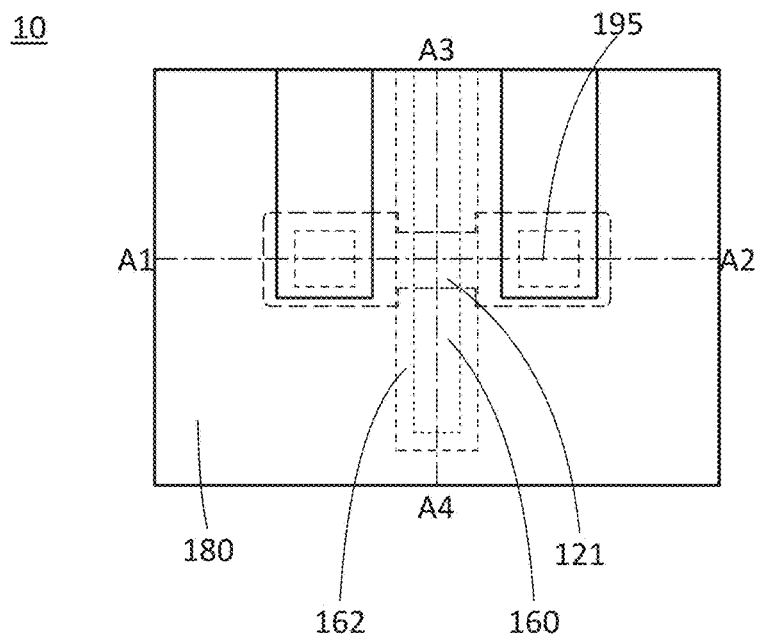
FIG. 1B
FIG. 1C
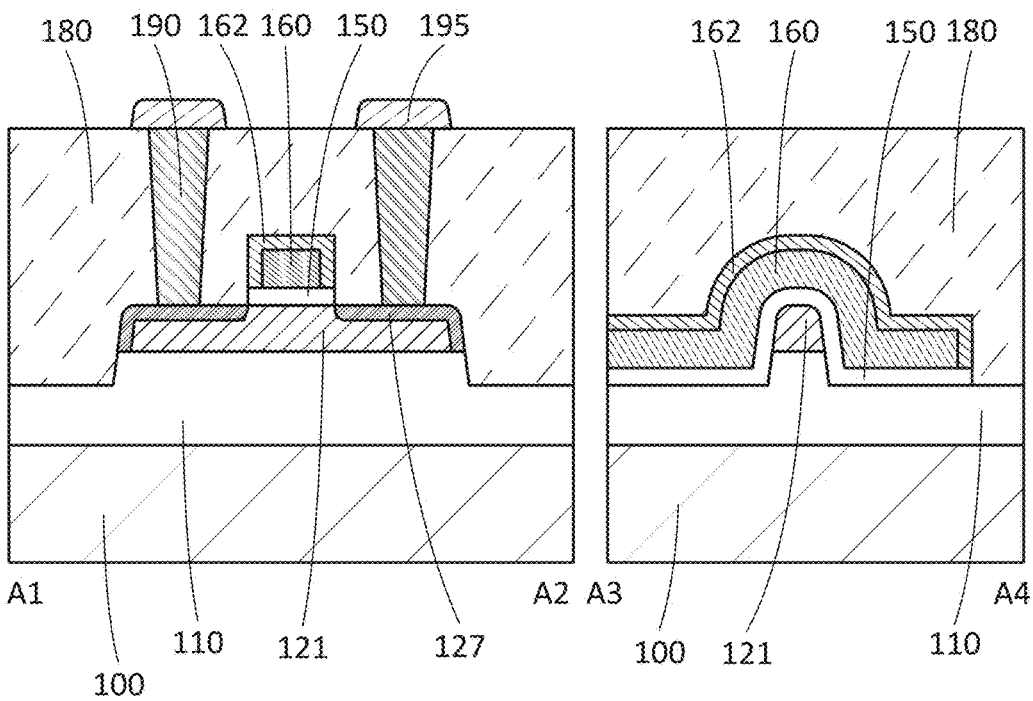

FIG. 2A
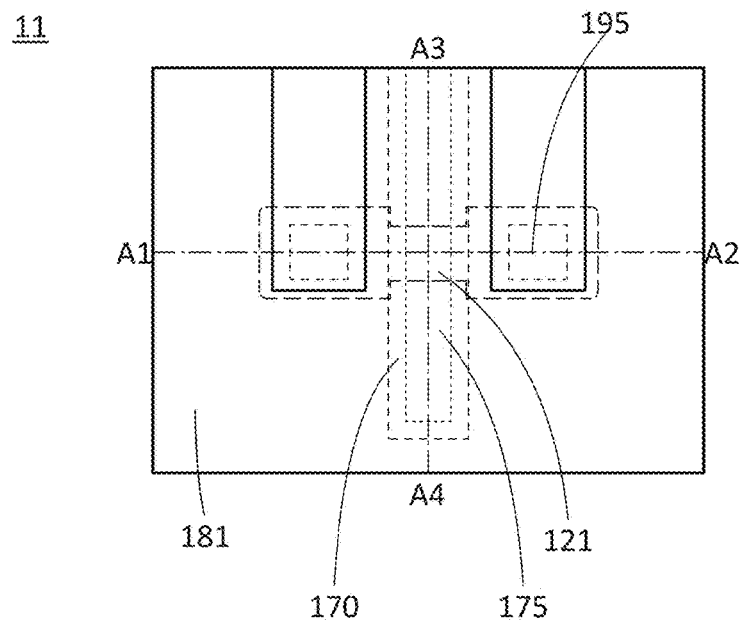
FIG. 2B
FIG. 2C
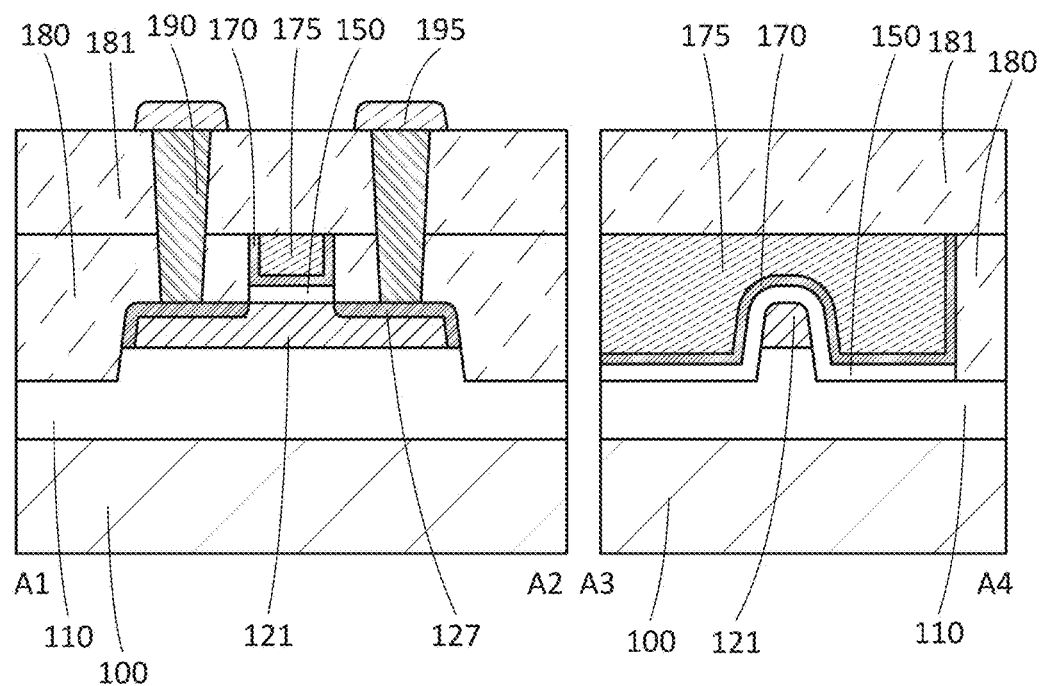

FIG. 3A
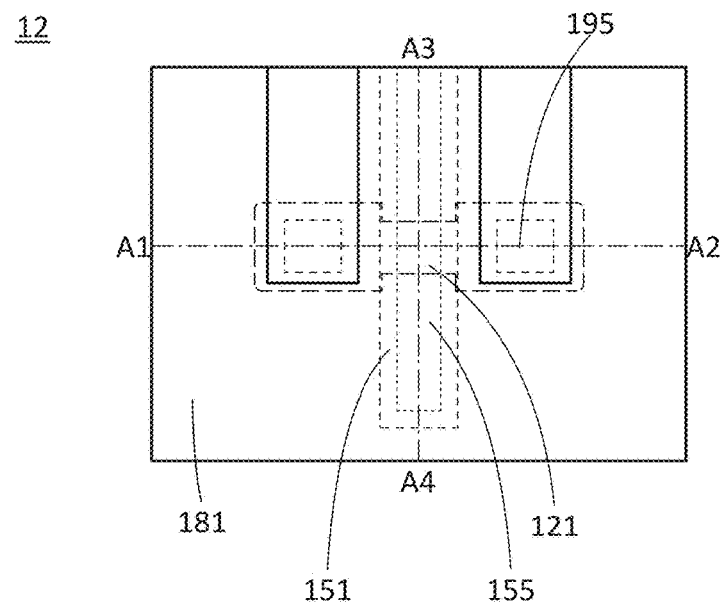
FIG. 3B
FIG. 3C
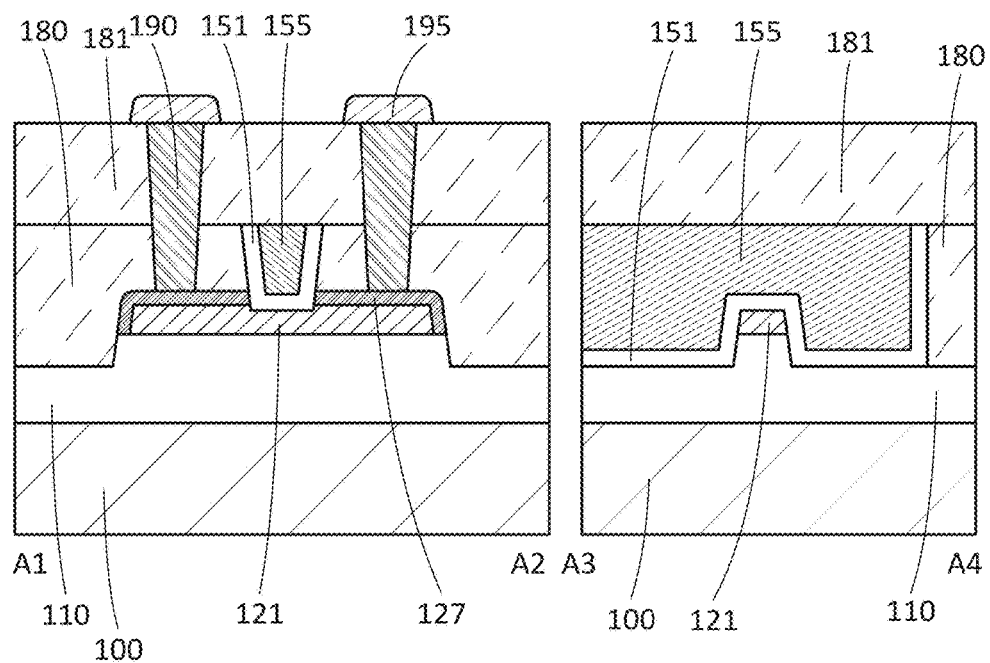

FIG. 6A
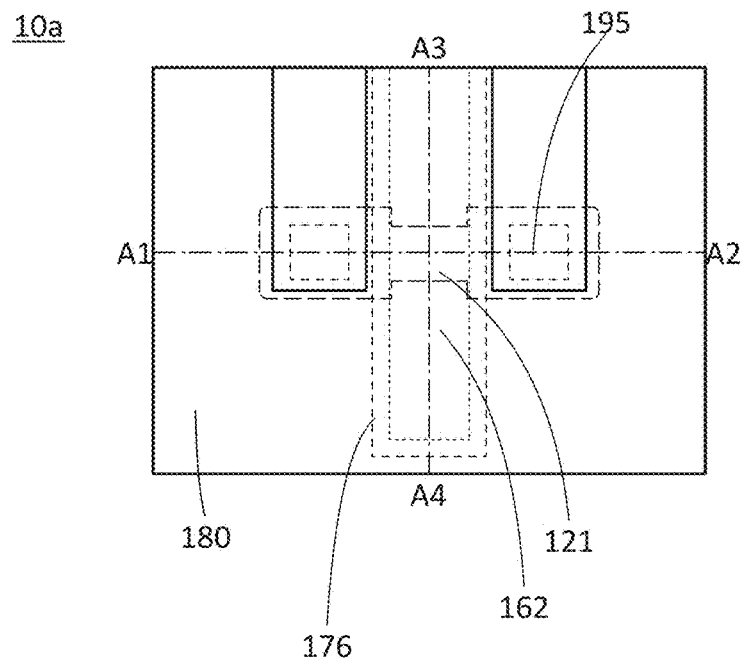
FIG. 6B
FIG. 6C
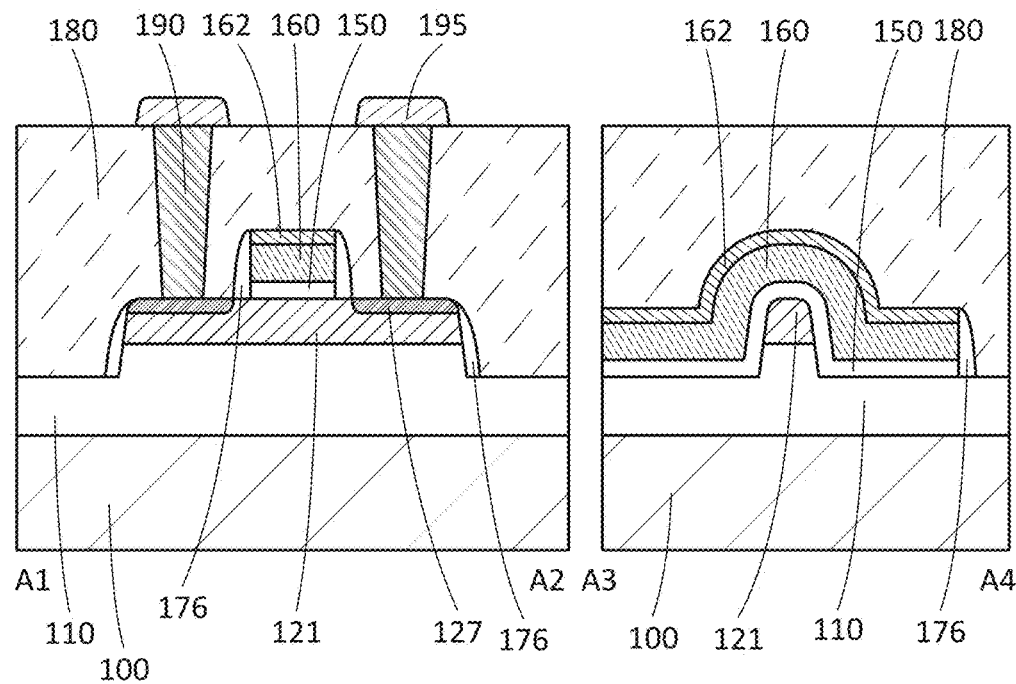

FIG. 8A
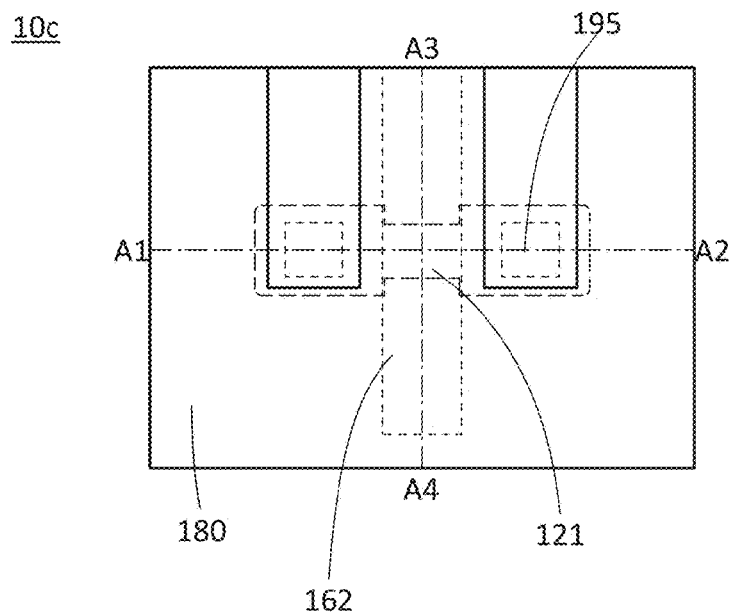
FIG. 8B
FIG. 8C
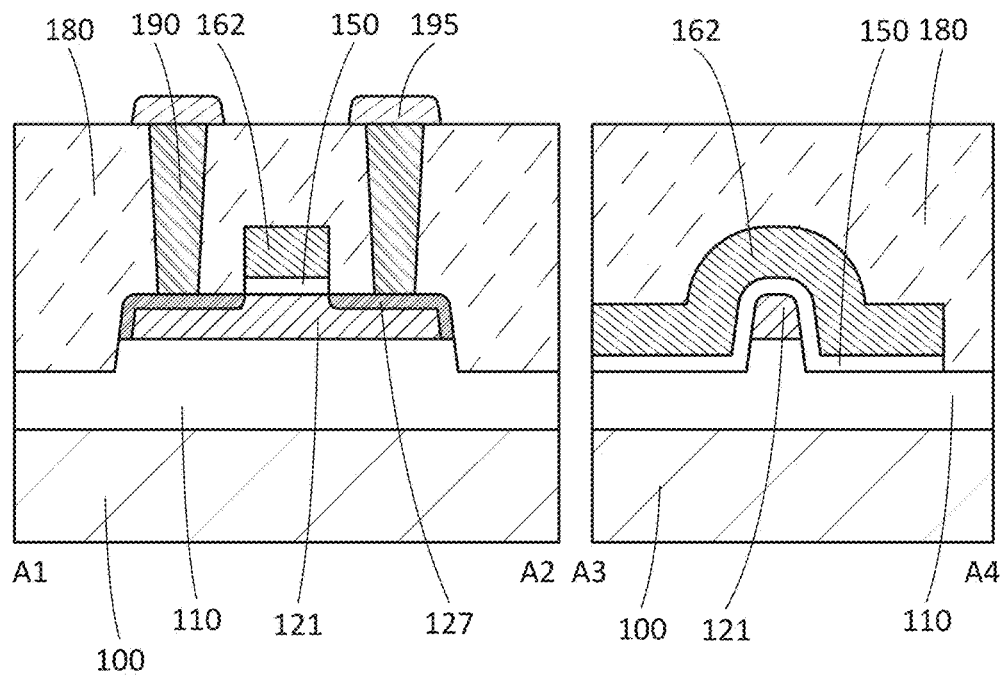

FIG. 10A
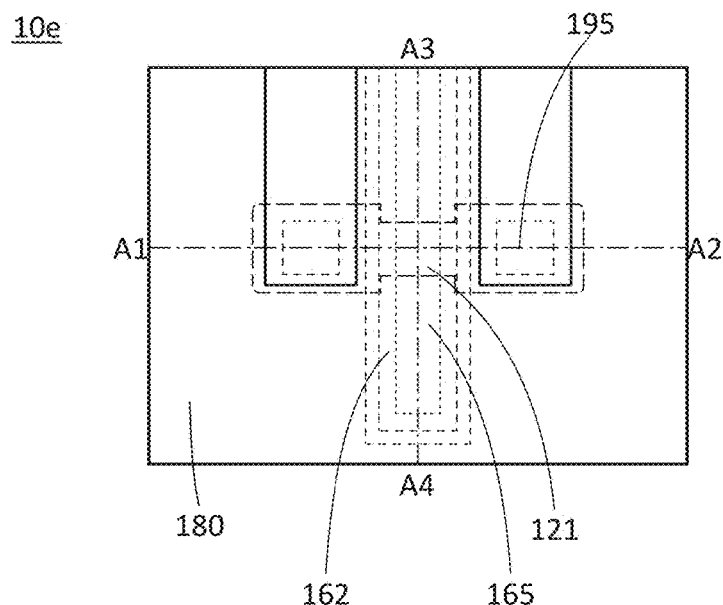
FIG. 10B
FIG. 10C
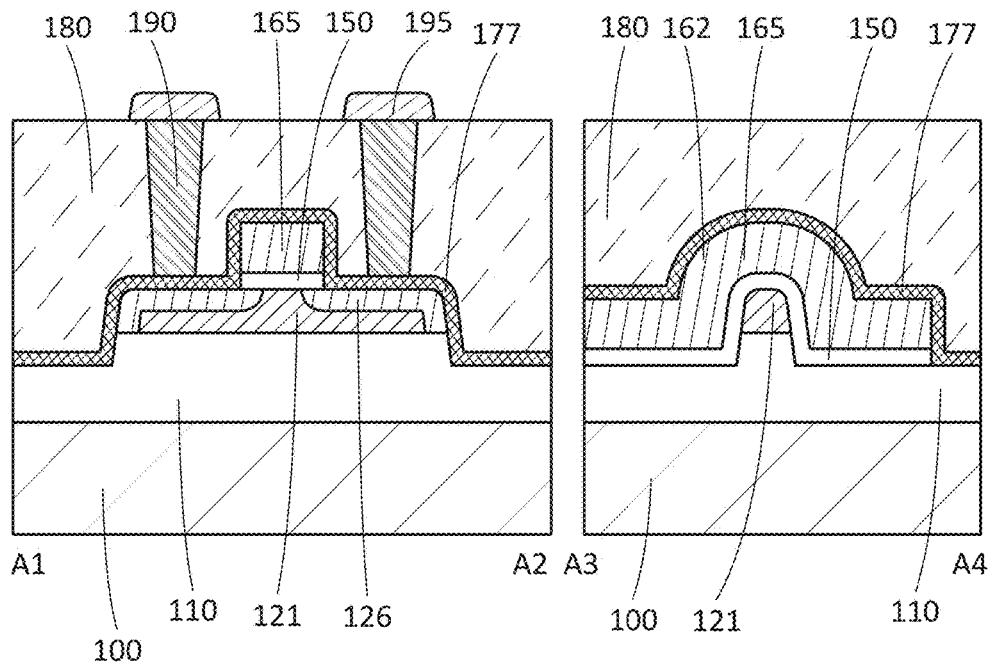

FIG. 13A
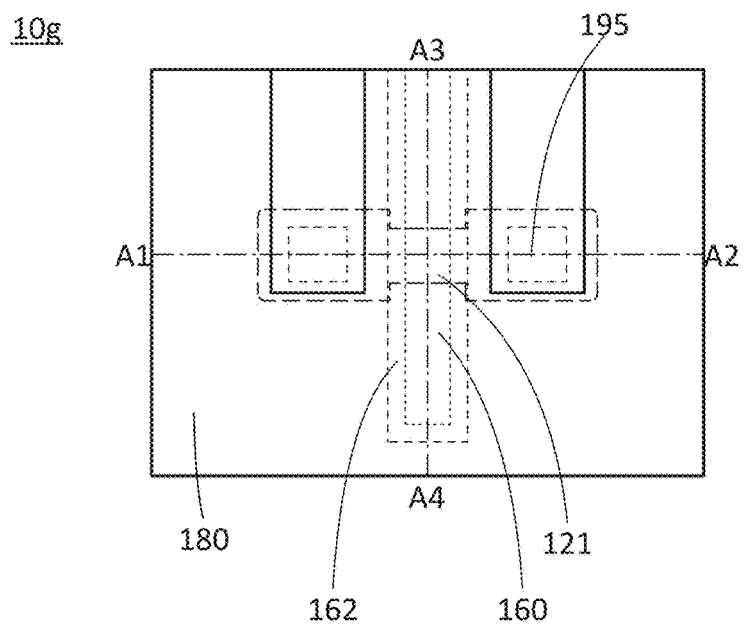
FIG. 13B                    FIG. 13C
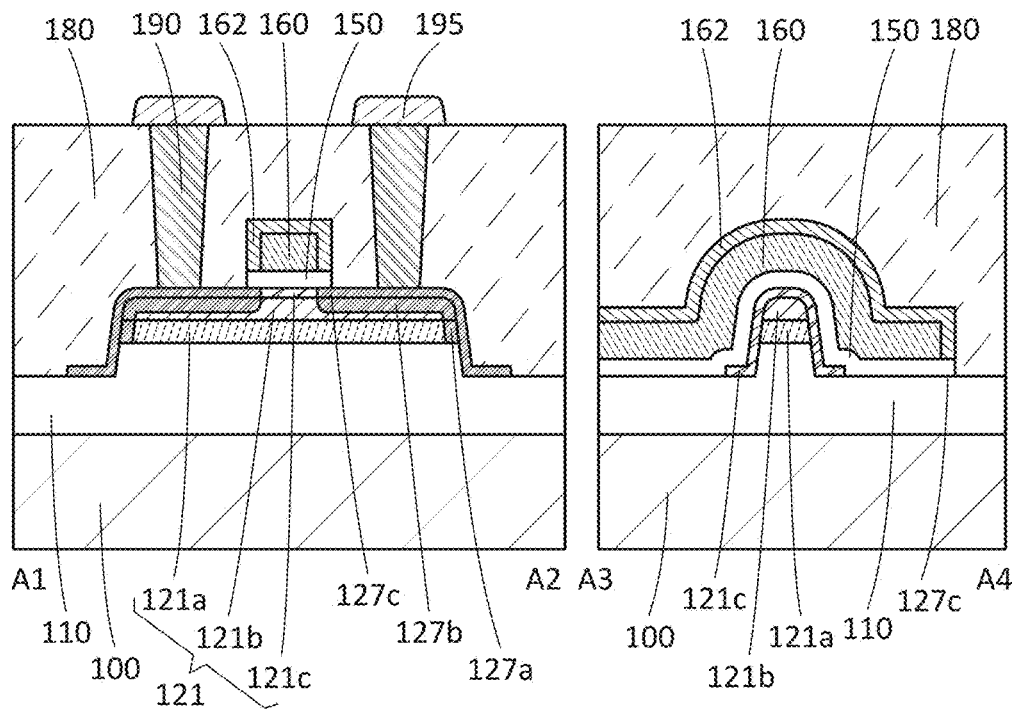

FIG. 17A
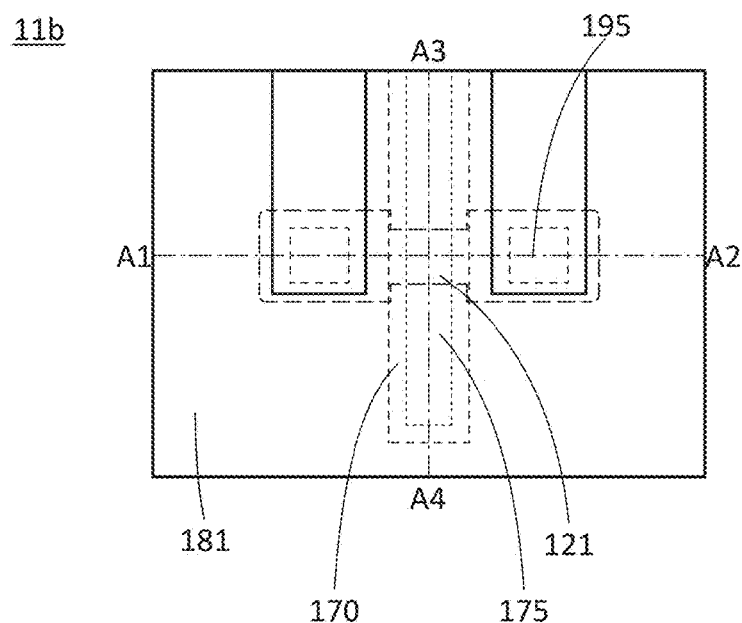
FIG. 17B
FIG. 17C
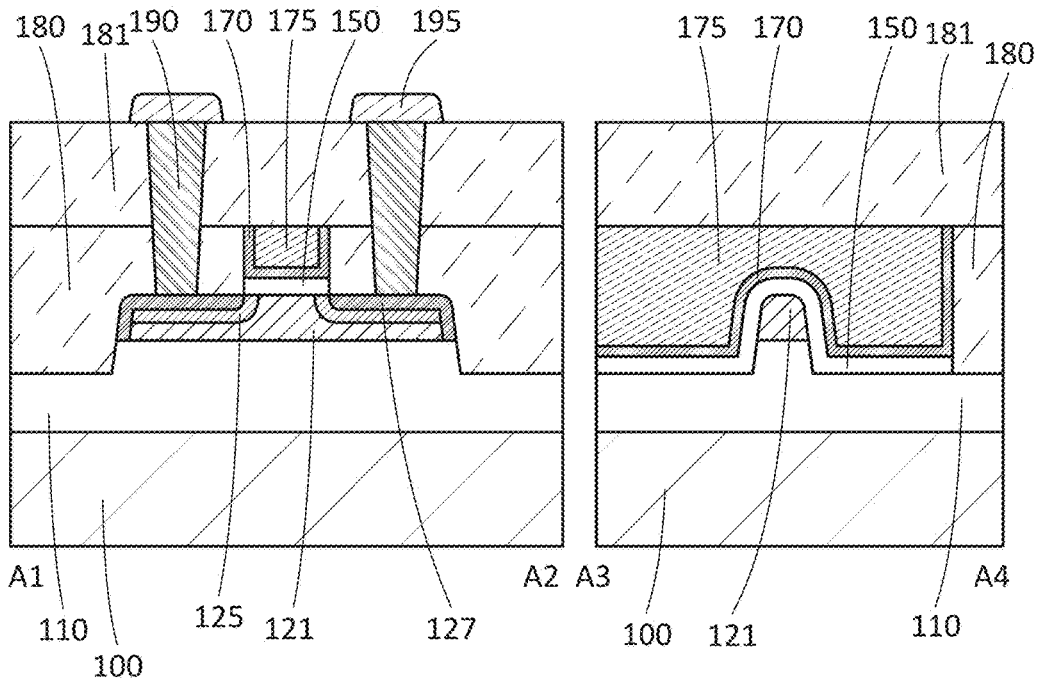

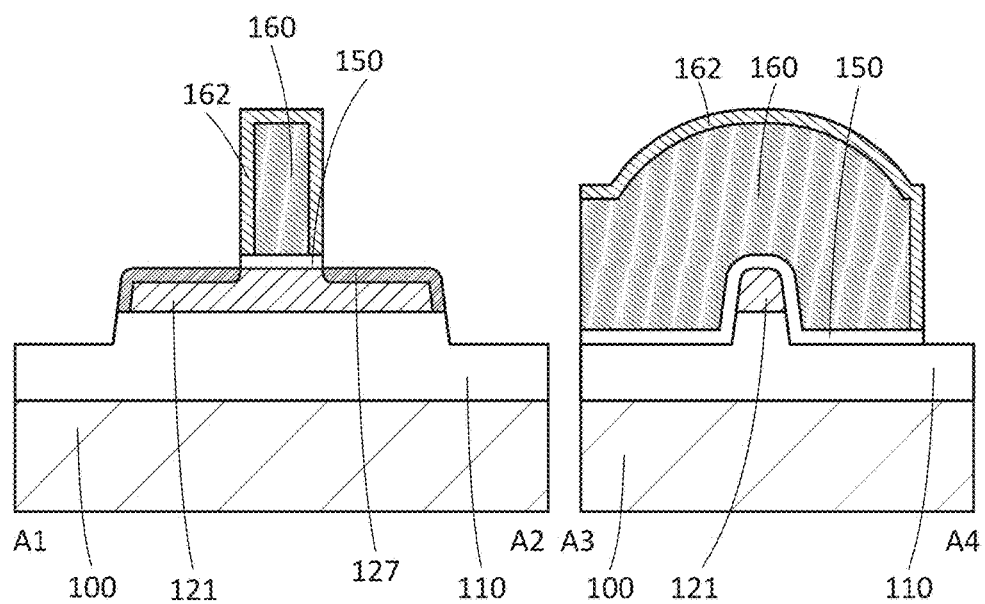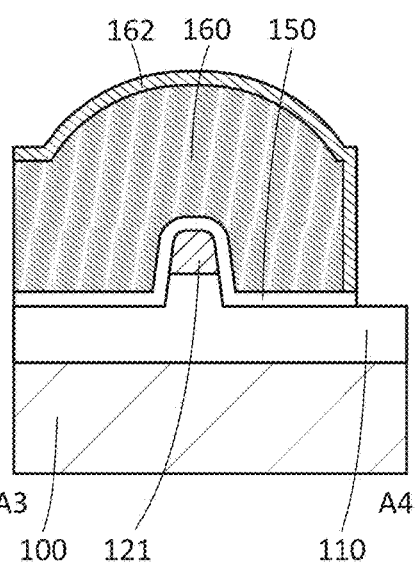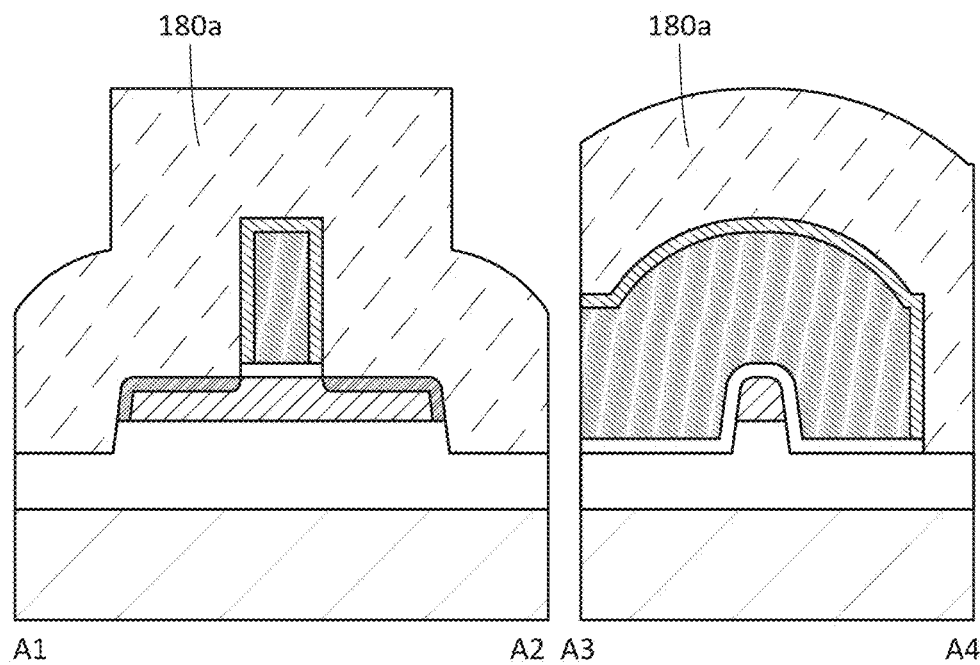

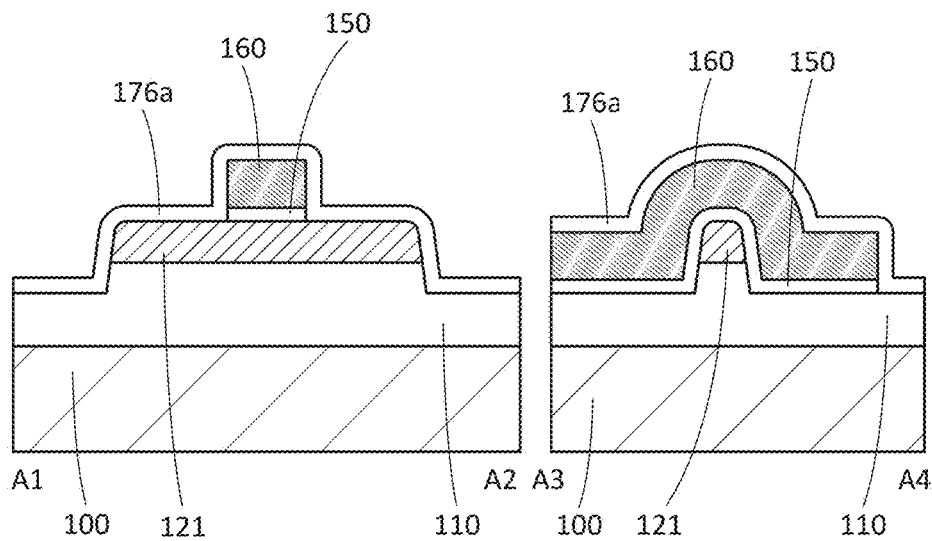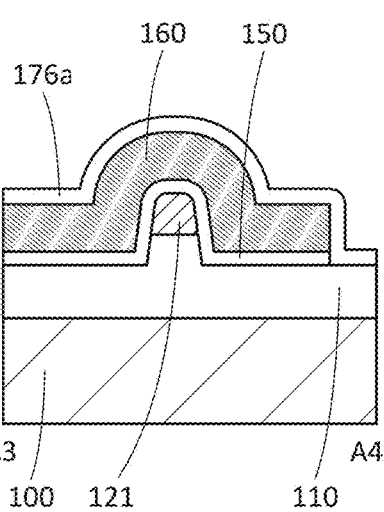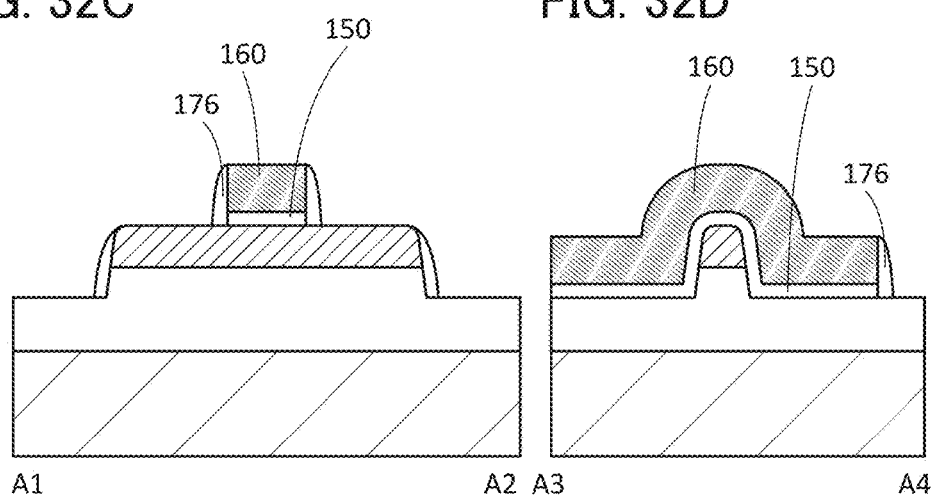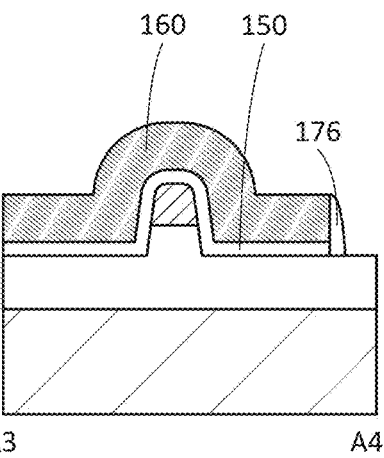

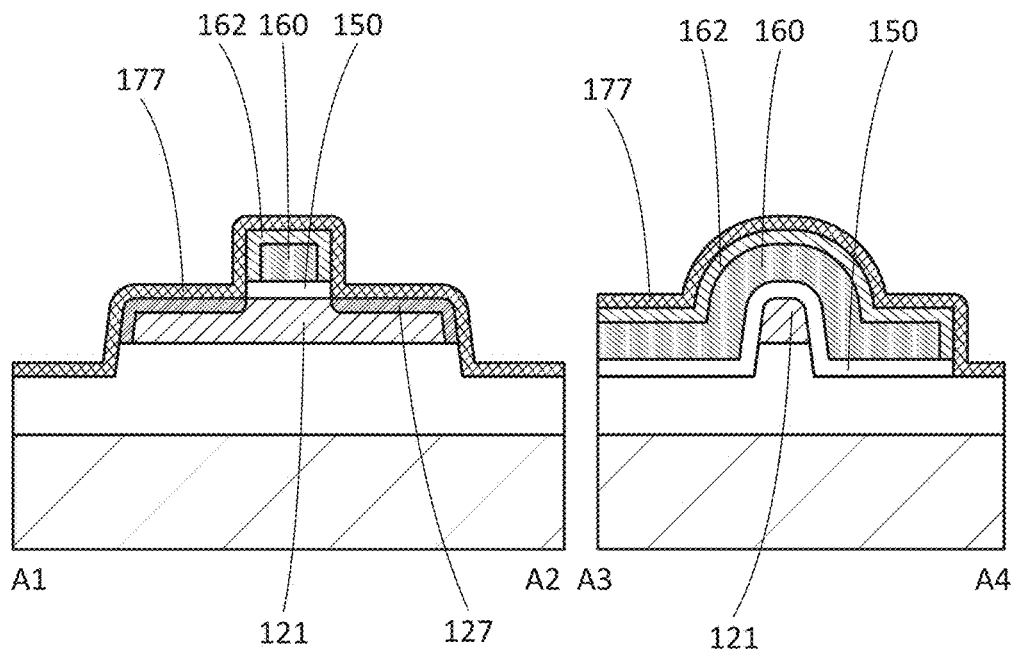
FIG. 35A
FIG. 35B
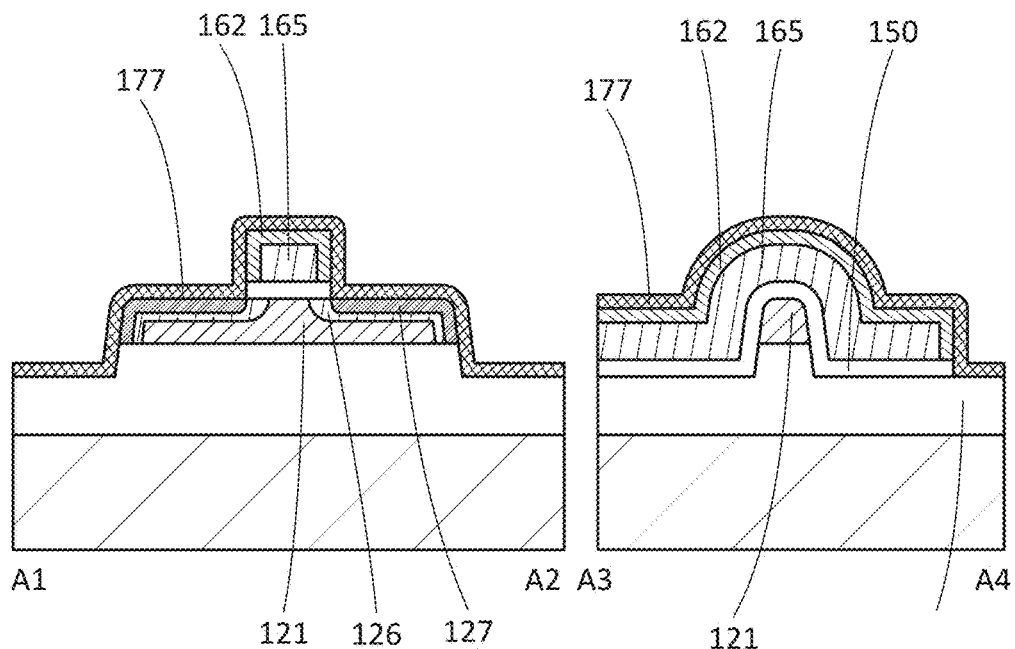
FIG. 35C
FIG. 35D

FIG. 36A
FIG. 36B
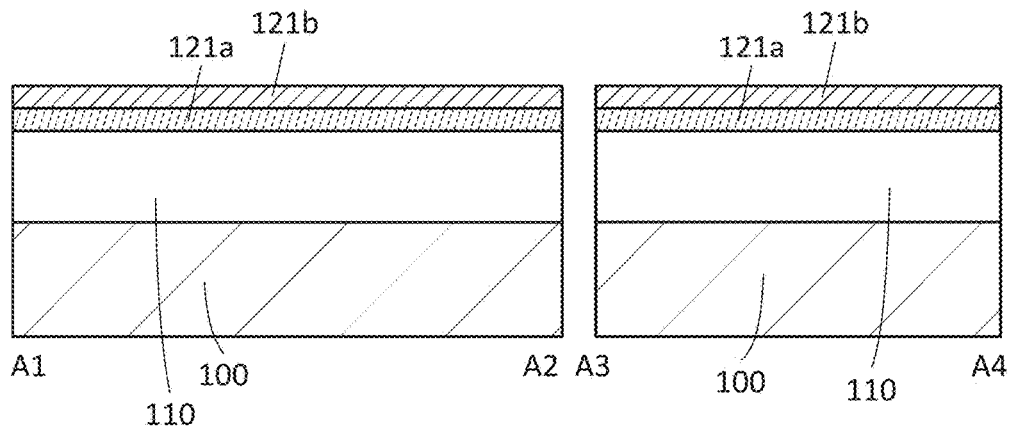
FIG. 36C
FIG. 36D
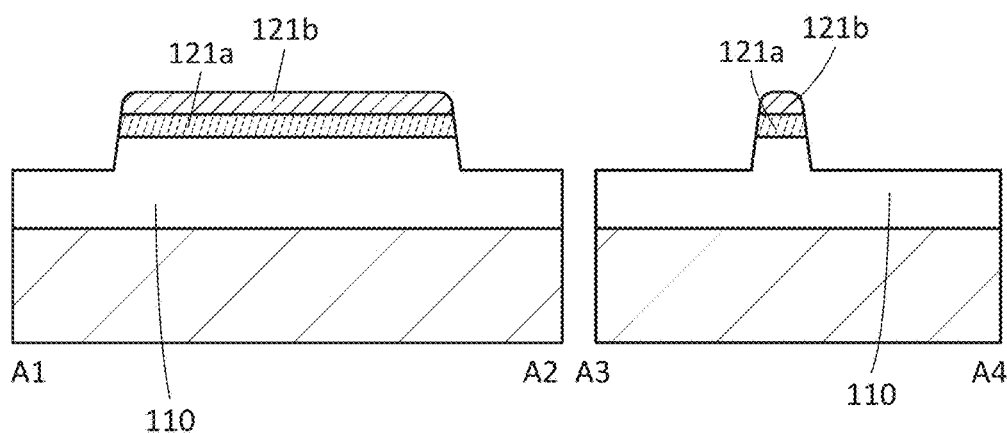
FIG. 36E
FIG. 36F
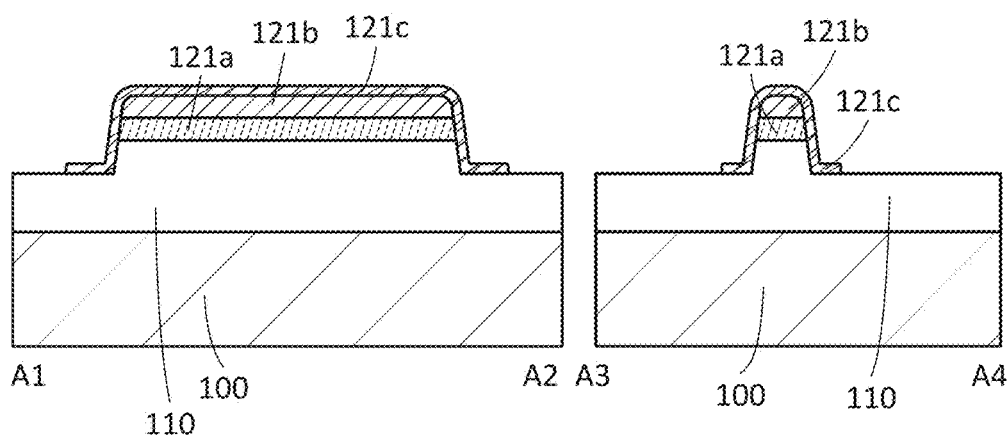

FIG. 40A
FIG. 40B
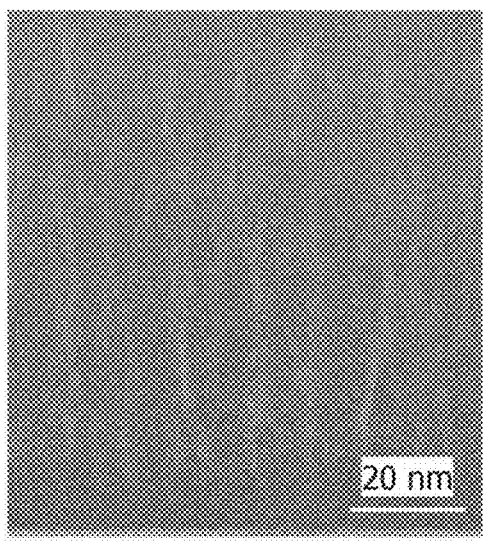
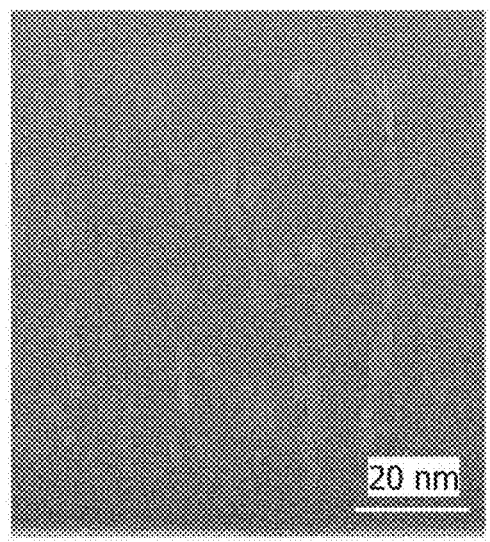

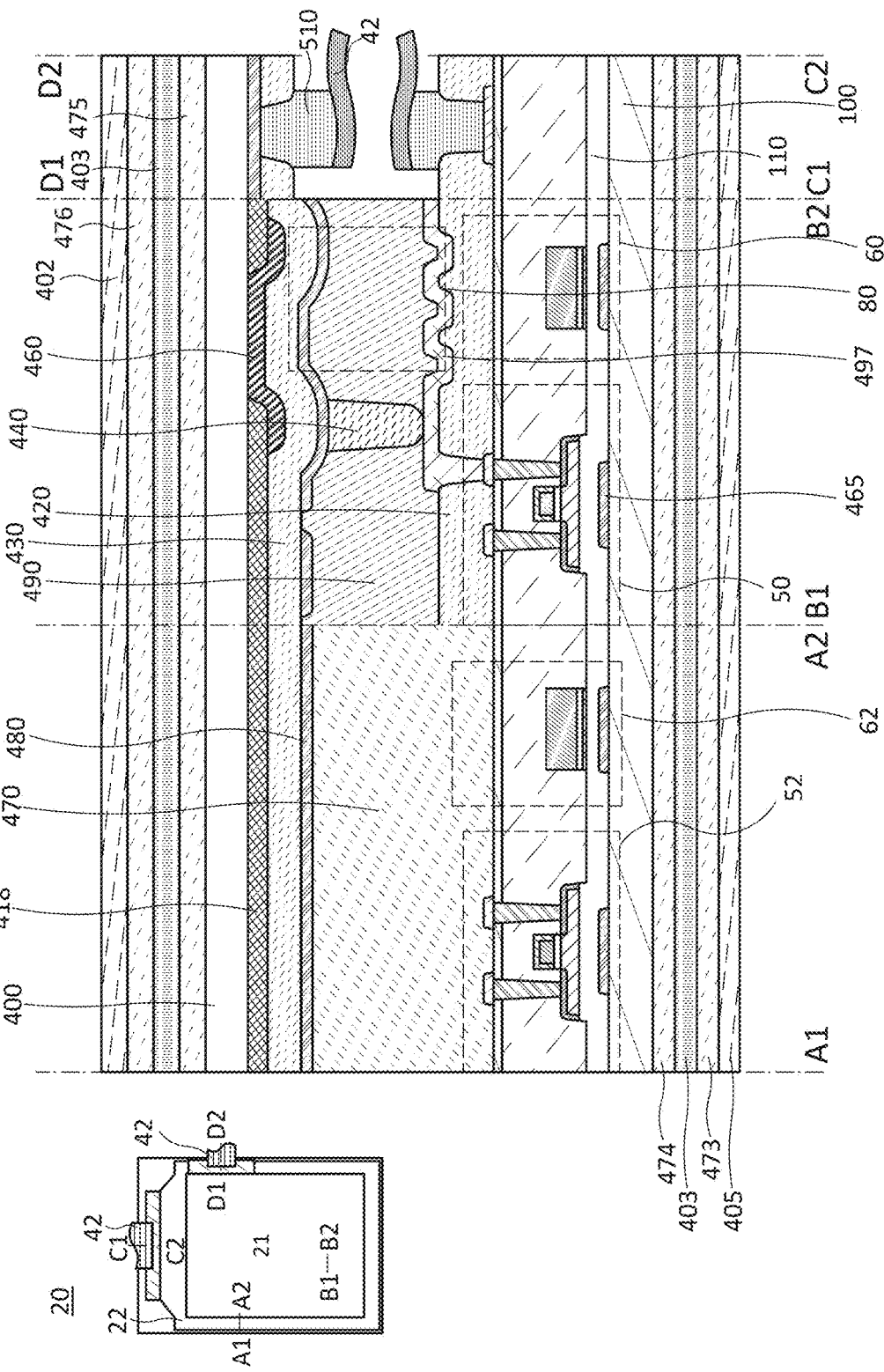

MANUFACTURING METHOD OF SEMICONDUCTOR DEVICE, MANUFACTURING METHOD OF ELECTRONIC APPLIANCE, SEMICONDUCTOR DEVICE, DISPLAY DEVICE, MEMORY DEVICE, AND ELECTRONIC APPLIANCE

BACKGROUND OF THE INVENTION

1. Field of the Invention

The present invention relates to an object, a method, or a manufacturing method. The present invention relates to a process, a machine, manufacture, or a composition of matter. In particular, the present invention relates to, for example, a semiconductor device, a display device, a light-emitting device, a power storage device, an imaging device, a driving method thereof, or a manufacturing method thereof. In particular, one embodiment of the present invention relates to a semiconductor device or a manufacturing method of the semiconductor device.

In this specification and the like, a semiconductor device generally means a device that can function by utilizing semiconductor characteristics. A transistor and a semiconductor circuit are embodiments of the semiconductor device. In some cases, a memory device, a display device, or an electronic appliance includes a semiconductor device.

2. Description of the Related Art

Attention has been focused on a technique for forming a transistor using a semiconductor film formed over a substrate having an insulating surface. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor film has been attracting attention.

For example, Patent Document 1 discloses a transistor that uses an amorphous oxide semiconductor layer containing indium (In), gallium (Ga), and zinc (Zn) as an active layer.

Patent Document 2 and Non-Patent Document disclose a method for manufacturing a transistor in which a conductive layer is formed over an oxide semiconductor layer and heat treatment is performed to reduce the resistance of the oxide semiconductor layer.

REFERENCE

Patent Document

[Patent Document 1] Japanese Published Patent Application No. 2006-165528
[Patent Document 2] Japanese Published Patent Application No. 2013-175710

Non-Patent Document

[Non-Patent Document] 2015 Symposium on VLSI Technology Digest of Technical Papers, T214-T215

SUMMARY OF THE INVENTION

Manufacturing of semiconductor devices with highly integrated transistors requires miniaturization of transistors. In miniaturized transistors, however, capacitance is inevitably formed between a gate electrode and a source or a drain electrode, causing a low response speed of the transistors.

An object of one embodiment of the present invention is to reduce parasitic capacitance by reducing the area where a gate electrode overlaps with a source electrode and the area where the gate electrode overlaps with a drain electrode.

An object of one embodiment of the present invention is to reduce a decrease in the on-state current of a transistor by reducing the contact resistance between a source electrode and a semiconductor layer and the contact resistance between a drain electrode and the semiconductor layer.

An object of one embodiment of the present invention is to provide a semiconductor device including an oxide semiconductor layer with few oxygen vacancies. Another object of one embodiment of the present invention is to provide a miniaturized semiconductor device.

Note that the description of these objects does not preclude the existence of other objects. In one embodiment of the present invention, there is no need to achieve all the objects. Other objects will be apparent from and can be derived from the description of the specification, the drawings, the claims, and the like.

One embodiment of the present invention is a method for manufacturing a semiconductor device including the steps of forming a first oxide layer, selectively processing the first oxide layer to form a second oxide layer, forming a first insulating layer over the second oxide layer, forming a first sacrificial layer over the first insulating layer, selectively processing the first insulating layer and the first sacrificial layer to form a second insulating layer and a second sacrificial layer, forming a conductive layer over the second oxide layer, the second insulating layer, and the second sacrificial layer, and performing heat treatment after the formation of the conductive layer to form a first mixed layer in a region of the second oxide layer that is in contact with the conductive layer and form a second mixed layer in a region of the second sacrificial layer that is in contact with the conductive layer. The first mixed layer includes at least one of elements included in the conductive layer. The second mixed layer includes at least one of elements included in the conductive layer. The conductive layer includes at least one of aluminum, molybdenum, titanium, tantalum, tungsten, nickel, cobalt, and platinum. The resistance value of the first mixed layer is smaller than that of the second oxide layer. The second sacrificial layer and the second mixed layer serve as a gate electrode.

In the above method for manufacturing the semiconductor device of one embodiment of the present invention, preferably, the resistance value of the second mixed layer is smaller than that of the second sacrificial layer.

In the above method for manufacturing the semiconductor device of one embodiment of the present invention, preferably, the conductive layer is removed after the formation of the first mixed layer and the second mixed layer.

One embodiment of the present invention is a method for manufacturing a semiconductor device including the steps of forming a first oxide layer, selectively processing the first oxide layer to form a second oxide layer, forming a first insulating layer over the second oxide layer, forming a first sacrificial layer over the first insulating layer, selectively processing the first insulating layer and the first sacrificial layer to form a second insulating layer and a second sacrificial layer, forming a first conductive layer over the second oxide layer, the second insulating layer, and the second sacrificial layer, performing heat treatment after the formation of the first conductive layer to form a mixed layer in a region of the second oxide layer that is in contact with the first conductive layer, forming a third insulating layer over the mixed layer and the second sacrificial layer, removing part of the third insulating layer to expose a top surface of the second sacrificial layer, removing the second sacrificial layer, and forming a second conductive layer over the second insulating layer. The mixed layer includes at least one of elements included in the first conductive layer. The first conductive layer includes at least one of aluminum, molybdenum, titanium, tantalum, tungsten, nickel, cobalt, and platinum. The resistance value of the mixed layer is smaller than that of the second oxide layer.

In the above method for manufacturing the semiconductor device of one embodiment of the present invention, preferably, oxygen is added to the second semiconductor through the second insulating layer.

In each of the above methods for manufacturing the semiconductor device of one embodiment of the present invention, the first sacrificial layer may include at least one of indium, gallium, and zinc. In the above method for manufacturing the semiconductor device of one embodiment of the present invention, the first sacrificial layer may include silicon.

In each the above methods for manufacturing the semiconductor device of one embodiment of the present invention, preferably, a fourth insulating layer is formed over the second oxide layer and the second sacrificial layer after the formation of the second insulating layer and the second sacrificial layer, and the fourth insulating layer is processed to form a fifth insulating layer in contact with side surfaces of the second insulating layer and the second sacrificial layer.

One embodiment of the present invention is a method for manufacturing a semiconductor device including the steps of forming a first oxide layer, selectively processing the first oxide layer to form a second oxide layer, forming a first conductive layer over the second oxide layer, performing heat treatment after the formation of the first conductive layer to form a mixed layer in a region of the second oxide layer that is in contact with the first conductive layer, forming a first insulating layer over the mixed layer, removing part of the first insulating layer, the mixed layer, and the second oxide layer to form a third oxide layer, forming a second insulating layer over the third oxide layer, and forming a second conductive layer over the second insulating layer. The mixed layer includes at least one of elements included in the first conductive layer. The first conductive layer includes at least one of aluminum, molybdenum, titanium, tantalum, tungsten, nickel, cobalt, and platinum. The resistance value of the mixed layer is smaller than that of the second oxide layer.

In each the above methods for manufacturing the semiconductor device of one embodiment of the present invention, preferably, the first conductive layer is removed after the formation of the mixed layer.

In each of the above methods for manufacturing the semiconductor device of one embodiment of the present invention, preferably, the heat treatment is performed at a temperature higher than or equal to 200° C. and lower than or equal to 400° C.

One embodiment of the present invention is a method for manufacturing an electronic appliance including a semiconductor device, a housing, and a display device or a speaker. The semiconductor device is fabricated by any of the above methods for manufacturing the semiconductor device.

One embodiment of the present invention is a semiconductor device including an oxide layer, a first mixed layer over the oxide layer, an insulating layer over the oxide layer, a conductive layer over the insulating layer, and a second mixed layer over the conductive layer. The first mixed layer includes at least one of elements included in the oxide layer. The oxide layer includes at least one of indium, gallium, and zinc. The first or second mixed layer includes at least one of aluminum, molybdenum, titanium, tantalum, tungsten, nickel, cobalt, and platinum.

In the above semiconductor device of one embodiment of the present invention, preferably, the resistance value of the first mixed layer is smaller than that of the oxide layer.

In the above semiconductor device of one embodiment of the present invention, preferably, the resistance value of the second mixed layer is smaller than that of the conductive layer.

In the above semiconductor device of one embodiment of the present invention, the second mixed layer may include at least one of indium, gallium, and zinc. In the above semiconductor device of one embodiment of the present invention, the second mixed layer may include silicon.

One embodiment of the present invention is a display device including any of the above semiconductor devices and a display element.

One embodiment of the present invention is a memory device including any of the above semiconductor devices (a first semiconductor device) and a second semiconductor device. The second semiconductor device includes at least one of silicon, germanium, silicon germanium, silicon carbide, gallium arsenide, aluminum gallium arsenide, indium phosphide, gallium nitride, and an organic semiconductor.

One embodiment of the present invention is an electronic appliance including any of the above semiconductor devices, a housing, and a display device or a speaker.

According to one embodiment of the present invention, the area where a gate electrode overlaps with a source electrode and the area where the gate electrode overlaps with a drain electrode can be reduced to reduce parasitic capacitance.

According to one embodiment of the present invention, the contact resistance between a source electrode and a semiconductor layer and the contact resistance between a drain electrode and the semiconductor layer can be reduced to reduce a decrease in the on-state current of a transistor.

According to one embodiment of the present invention, a semiconductor device including an oxide semiconductor layer with few oxygen vacancies can be provided. According to another embodiment of the present invention, a miniaturized semiconductor device can be provided.

Note that the description of these effects does not preclude the existence of other effects. In one embodiment of the present invention, there is no need to achieve all the effects. Other effects will be apparent from and can be derived from the description of the specification, the drawings, the claims, and the like.

BRIEF DESCRIPTION OF THE DRAWINGS

In the accompanying drawings:
FIGS. 1A to 1C are a top view and cross-sectional views illustrating a transistor of one embodiment of the present invention;
FIGS. 2A to 2C are a top view and cross-sectional views illustrating a transistor of one embodiment of the present invention;
FIGS. 3A to 3C are a top view and cross-sectional views illustrating a transistor of one embodiment of the present invention;

FIGS. 6A to 6C are a top view and cross-sectional views illustrating a transistor of one embodiment of the present invention;

FIGS. 8A to 8C are a top view and cross-sectional views illustrating a transistor of one embodiment of the present invention;

FIGS. 10A to 10C are a top view and cross-sectional views illustrating a transistor of one embodiment of the present invention;

FIGS. 13A to 13C are a top view and cross-sectional views illustrating a transistor of one embodiment of the present invention;

FIGS. 17A to 17C are a top view and cross-sectional views illustrating a transistor of one embodiment of the present invention;

FIGS. 26A to 26D are cross-sectional views illustrating a method for manufacturing a transistor of one embodiment of the present invention;

FIGS. 32A to 32D are cross-sectional views illustrating a method for manufacturing a transistor of one embodiment of the present invention;

FIGS. 35A to 35D are cross-sectional views illustrating a method for manufacturing a transistor of one embodiment of the present invention;

FIGS. 36A to 36F are cross-sectional views illustrating a method for manufacturing a transistor of one embodiment of the present invention;

FIGS. 40A and 40B are cross-sectional TEM images of an a-like OS;

FIGS. 56A and 56B are a top view and a cross-sectional view of a liquid crystal display device;

DETAILED DESCRIPTION OF THE INVENTION

Figure 4A:
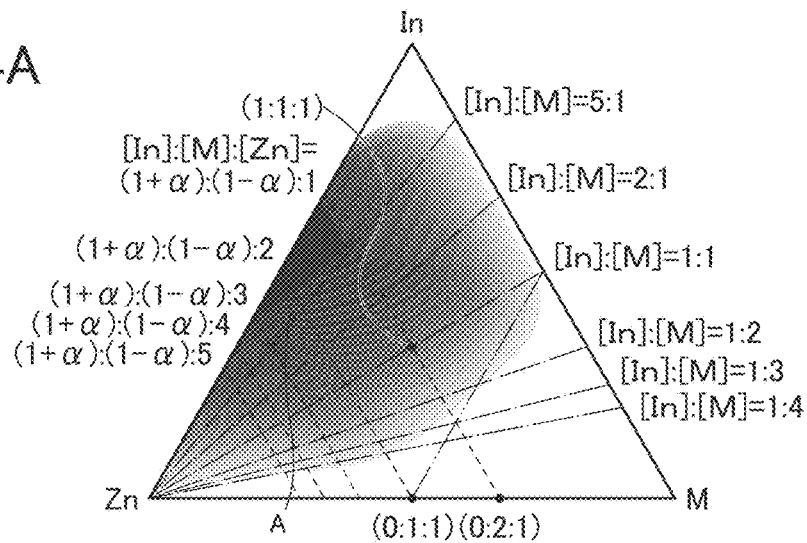
FIGS. 4A to 4C each illustrate the range of an atomic ratio of an oxide of one embodiment of the present invention.

Embodiments of the present invention will be described in detail with the reference to the drawings. Note that the present invention is not limited to the description below, and it is easily understood by those skilled in the art that modes and details disclosed herein can be modified in various ways. Furthermore, the present invention should not be construed as being limited to the description of the embodiments given below. In describing the structures of the invention with reference to the drawings, common reference numerals are used for the same portions in different drawings. Note that the same hatch pattern is applied to similar parts, and the similar parts are not especially denoted by reference numerals in some cases.

A structure in one of the following embodiments can be, for example, applied to, combined with, or replaced with another structure in another embodiment as appropriate, and the resulting structure is also one embodiment of the present invention.

Note that in drawings, the size, the thickness of films (layers), or a region is sometimes exaggerated for simplicity.

In this specification, the terms "film" and "layer" can be interchanged with each other.

In this specification and the like, the terms "portion" and "region" can be interchanged with each other.

A voltage usually refers to a potential difference between a given potential and a reference potential (e.g., a source potential or a ground potential (GND)). A voltage can be referred to as a potential and vice versa. In general, a potential (a voltage) is relative and is determined by the amount relative to a certain potential. Therefore, a potential which is represented as a "ground potential" or the like is not always 0 V. For example, the lowest potential in a circuit may be represented as a "ground potential". Alternatively, a substantially intermediate potential in a circuit may be represented as a "ground potential". In these cases, a positive potential and a negative potential are set using the potential as a reference.

The ordinal numbers such as first and second are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

An impurity in a semiconductor refers to, for example, elements other than the main components of the semiconductor. For example, an element with a concentration of lower than 0.1 atomic % is regarded as an impurity. When an impurity is contained, the density of states (DOS) may be formed in a semiconductor, the carrier mobility may be decreased, or the crystallinity may be decreased. In the case where the semiconductor is an oxide semiconductor, examples of the impurity that changes the characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is a silicon layer, examples of the impurity that changes the characteristics of the semiconductor include oxygen, Group 1 elements except hydrogen, Group 2 elements, Group 13 elements, and Group 15 elements.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions do not necessarily have the same value. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on the transistor structure, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is larger than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, without accurate information on the shape of a semiconductor, it is difficult to measure an effective channel width accurately.

Thus, in this specification, in a top view of a transistor, an apparent channel width a that is the length of a portion where a source and a drain face each other in a region where a semiconductor and a gate electrode overlap with each other is referred to as a surrounded channel width (SCW) in some cases. Also in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from the value obtained by calculation using an effective channel width is obtained in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view", for example.

Note that in this specification, the term "semiconductor" can be replaced with any term for various semiconductors in some cases. For example, the term "semiconductor" can be replaced with the term for a Group 14 semiconductor such as silicon or germanium; an oxide semiconductor; a compound semiconductor such as silicon carbide, germanium silicide, gallium arsenide, indium phosphide, zinc selenide, or cadmium sulfide; or an organic semiconductor.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, structures of a semiconductor device of one embodiment of the present invention will be described with reference to FIG. 1A to FIG. 21C.
<Transistor Structure 1>

Described below is the structure of a transistor 10, which is an example of the semiconductor device of one embodiment of the present invention.

The structure of the transistor 10 will be described with reference to FIGS. 1A to 1C. FIG. 1A is a top view of the transistor 10. FIG. 1B is a cross-sectional view taken along dashed-dotted line A1-A2 in FIG. 1A. FIG. 1C is a cross-sectional view taken along dashed-dotted line A3-A4 in FIG. 1A. A region along dashed-dotted line A1-A2 shows a structure of the transistor 10 in the channel length direction, and a region along dashed-dotted line A3-A4 shows a structure of the transistor 10 in the channel width direction. The channel length direction of a transistor refers to a direction in which carriers move between a source (source region or source electrode) and a drain (drain region or drain electrode). The channel width direction refers to a direction perpendicular to the channel length direction in a plane parallel to a substrate. Note that in FIG. 1A, some components (e.g., an insulating film serving as a protective insulating film) of the transistor 10 are not illustrated to avoid complexity. As in FIG. 1A, some components are not illustrated in some cases in top views of transistors described below.

The transistor 10 includes a substrate 100, an insulating layer 110, an oxide layer 121, a mixed layer 127, an insulating layer 150, a sacrificial layer 160, a mixed layer 162, an insulating layer 180, a conductive layer 190, and a conductive layer 195.

In the transistor 10, the insulating layer 110 is formed over the substrate 100. The oxide layer 121 is formed over the insulating layer 110, the insulating layer 150 is formed over the oxide layer 121, and the sacrificial layer 160 is formed over the insulating layer 150. The mixed layer 127 covers a region of a surface of the oxide layer 121 that is not in contact with the insulating layer 150. At least part of the mixed layer 127 is in contact with a top surface of the oxide layer 121 and another part thereof is in contact with a side surface of the oxide layer 121. The mixed layer 162 covers a surface of the sacrificial layer 160. At least part of the mixed layer 162 is in contact with a top surface of the sacrificial layer 160 and another part thereof is in contact with a side surface of the sacrificial layer 160. Note that the mixed layer 162, the sacrificial layer 160, the insulating layer 150, and the oxide layer 121 overlap with each other. The sacrificial layer 160 and the mixed layer 162 can serve as a gate electrode of the transistor 10.

The oxide layer 121 serves as a semiconductor and preferably includes at least one in a group of elements (hereinafter also referred to as an element group A) consisting of indium, gallium, and zinc.

The mixed layer 127 includes at least one in the element group A included in the oxide layer 121, and at least one in a group of elements (hereinafter also referred to as an element group B) consisting of aluminum, molybdenum, titanium, tantalum, tungsten, nickel, cobalt, and platinum. The mixed layer 127 can be formed by, for example, forming a conductive layer including at least one in the element group B over the oxide layer 121, and then performing heat treatment. In other words, the mixed layer 127 is a layer formed by alloying the oxide layer 121 with the conductive layer formed over the oxide layer 121.

At least part of the mixed layer 127 preferably contains at least one in the element group A and at least one in the element group B each with a proportion of 1% to 99%.

The resistance value of the mixed layer 127 is smaller than that of the oxide layer 121 and thus the mixed layer 127 can serve as a source or a drain region of the transistor 10. The mixed layer 127 can also serve as a conductive layer.

The sacrificial layer 160 is preferably an oxide semiconductor or an oxide conductor each containing at least one of indium, gallium, and zinc (the element group A). Alternatively, the sacrificial layer 160 preferably contains silicon.

The mixed layer 162 includes at least one of the elements included in the sacrificial layer 160, and at least one of aluminum, molybdenum, titanium, tantalum, tungsten, nickel, cobalt, and platinum (the element group B). The mixed layer 162 can be formed by, for example, forming a conductive layer including at least one in the element group B over the sacrificial layer 160, and then performing heat treatment. In other words, the mixed layer 162 is a layer formed by alloying the sacrificial layer 160 with the conductive layer formed over the sacrificial layer 160.

In the case where the sacrificial layer 160 is an oxide semiconductor or an oxide conductor each containing at least one in the element group A, the mixed layer 162 includes at least one in the element group A and at least one in the element group B. At least part of the sacrificial layer 160 preferably contains at least one in the element group A and at least one in the element group B each with a proportion of 1% to 99%.

In the case where the sacrificial layer 160 contains silicon, the mixed layer 162 contains silicon and at least one in the element group B. At least part of the sacrificial layer 160 preferably contains silicon and at least one in the element group B each with a proportion of 1% to 99%.

The contents of elements of the element groups A and B in the mixed layers 127 and 162 can be measured by time-of-flight secondary ion mass spectrometry (TOF-SIMS), X-ray photoelectron spectrometry (XPS), or inductively coupled plasma mass spectrometry (ICP-MS).

The resistance value of the mixed layer 162 is preferably smaller than that of the sacrificial layer 160.

In the transistor 10, the insulating layer 180 is formed over the mixed layer 162. The conductive layer 190 is formed in an opening in the insulating layer 180 and electrically connected to the mixed layer 127. The conductive layer 195 is formed on and in contact with the conductive layer 190. The conductive layer 190 serves as a plug connecting the source or drain region of the transistor 10 and the conductive layer 195.

The above structure allows reducing the parasitic capacitance between the gate electrode and the source region or the parasitic capacitance between the gate electrode and the drain region. As a result, the transistor can operate at high speed; for example, the cutoff frequency characteristics of the transistor 10 can be improved.

In addition, the gate electrode, the source region, and the drain region of the transistor 10 can be formed in a self-aligned manner; thus, the alignment can be facilitated, and a miniaturized transistor can be easily manufactured.

<Transistor Structure 2>

Described next is the structure of a transistor 11, which is another example of the semiconductor device of one embodiment of the present invention.

The structure of the transistor 11 will be described with reference to FIGS. 2A to 2C. FIG. 2A is a top view of the transistor 11. FIG. 2B is a cross-sectional view taken along dashed-dotted line A1-A2 in FIG. 2A. FIG. 2C is a cross-sectional view taken along dashed-dotted line A3-A4 in FIG. 2A.

The transistor 11 includes the substrate 100, the insulating layer 110, the oxide layer 121, the mixed layer 127, the insulating layer 150, a conductive layer 170, a conductive layer 175, the insulating layer 180, an insulating layer 181, the conductive layer 190, and the conductive layer 195.

In the transistor 11, the insulating layer 110 is formed over the substrate 100. The oxide layer 121 is formed over the insulating layer 110, the insulating layer 150 is formed over the oxide layer 121, the conductive layer 170 is formed over the insulating layer 150, and the conductive layer 175 is formed over the conductive layer 170. The mixed layer 127 covers a surface of the oxide layer 121. At least part of the mixed layer 127 is in contact with a top surface of the oxide layer 121 and another part thereof is in contact with a side surface of the oxide layer 121. Note that the conductive layer 175, the conductive layer 170, the insulating layer 150, and the oxide layer 121 overlap with each other. The conductive layer 170 and the conductive layer 175 can serve as a gate electrode of the transistor 11.

For the structure of the oxide layer 121 in the transistor 11, the description on the structure of the oxide layer 121 in the transistor 10 can be referred to.

The mixed layer 127 includes at least one in the element group A included in the oxide layer 121, and at least one of aluminum, molybdenum, titanium, tantalum, tungsten, nickel, cobalt, and platinum (the element group B). The mixed layer 127 can be formed by, for example, forming a conductive layer including at least one in the element group B over the oxide layer 121, and then performing heat treatment. In other words, the mixed layer 127 is a layer formed by alloying the oxide layer 121 with the conductive layer formed over the oxide layer 121.

At least part of the mixed layer 127 preferably contains at least one in the element group A and at least one in the element group B each with a proportion of 1% to 99%.

The contents of elements of the element groups A and B in the mixed layer 127 can be measured by TOF-SIMS, XPS, or ICP-MS.

The resistance value of the mixed layer 127 is preferably smaller than that of the oxide layer 121, in which case the mixed layer 127 can serve as the source or drain region of the transistor 11. The mixed layer 127 can be regarded as a low-resistance region in the oxide layer 121.

In the transistor 11, the insulating layer 180 is formed over the mixed layer 127, and the insulating layer 181 is formed over the insulating layer 180. The conductive layer 190 is formed in an opening in the insulating layers 180 and 181 and electrically connected to the mixed layer 127. The conductive layer 195 is formed on and in contact with the conductive layer 190. The conductive layer 190 serves as a plug connecting the source or drain region of the transistor 11 and the conductive layer 195.

The above structure allows reducing the parasitic capacitance between the gate electrode and the source region or the parasitic capacitance between the gate electrode and the drain region. As a result, the transistor can operate at high speed; for example, the cutoff frequency characteristics of the transistor 11 can be improved.

In addition, the gate electrode, the source region, and the drain region of the transistor 11 can be formed in a self-aligned manner; thus, the alignment can be facilitated, and a miniaturized transistor can be easily manufactured.

<Transistor Structure 3>

Described next is the structure of a transistor 12, which is another example of the semiconductor device of one embodiment of the present invention.

The structure of the transistor 12 will be described with reference to FIGS. 3A to 3C. FIG. 3A is a top view of the transistor 12. FIG. 3B is a cross-sectional view taken along dashed-dotted line A1-A2 in FIG. 3A. FIG. 3C is a cross-sectional view taken along dashed-dotted line A3-A4 in FIG. 3A. A region along dashed-dotted line A1-A2 shows a structure of the transistor 12 in the channel length direction, and a region along dashed-dotted line A3-A4 shows a structure of the transistor 12 in the channel width direction. Note that in FIG. 3A, some components (e.g., an insulating film serving as a protective insulating film) of the transistor 12 are not illustrated to avoid complexity.

The transistor 12 includes the substrate 100, the insulating layer 110, the oxide layer 121, the mixed layer 127, an insulating layer 151, a conductive layer 155, the insulating layer 180, the insulating layer 181, the conductive layer 190, and the conductive layer 195.

In the transistor 12, the insulating layer 110 is formed over the substrate 100, and the oxide layer 121 is formed over the insulating layer 110. The mixed layer 127 covers a region of a surface of the oxide layer 121 that is not in contact with the insulating layer 110. At least part of the mixed layer 127 is in contact with a top surface of the oxide layer 121 and another part thereof is in contact with a side surface of the oxide layer 121. The insulating layer 180 is formed over the mixed layer 127. The insulating layer 151 is formed in an opening provided in the insulating layer 180 and the mixed layer 127 and touches the top surface of the oxide layer 121. The conductive layer 155 is formed over the insulating layer 151. The conductive layer 155 can serve as the gate electrode of the transistor 12.

For the structure of the oxide layer 121 in the transistor 12, the description on the structure of the oxide layer 121 in the transistor 10 can be referred to.

The mixed layer 127 includes at least one in the element group A included in the oxide layer 121, and at least one of aluminum, molybdenum, titanium, tantalum, tungsten, nickel, cobalt, and platinum (the element group B). The mixed layer 127 can be formed by, for example, forming a conductive layer including at least one in the element group B over the oxide layer 121, and then performing heat treatment. In other words, the mixed layer 127 is a layer formed by alloying the oxide layer 121 with the conductive layer formed over the oxide layer 121.

At least part of the mixed layer 127 preferably contains at least one in the element group A and at least one in the element group B each with a proportion of 1% to 99%.

The contents of elements of the element groups A and B in the mixed layer 127 can be measured by TOF-SIMS, XPS, or ICP-MS.

The resistance value of the mixed layer 127 is preferably smaller than that of the oxide layer 121, in which case the mixed layer 127 can serve as the source or drain region of the transistor 12. The mixed layer 127 can be regarded as a low-resistance region in the oxide layer 121.

In the transistor 12, the insulating layer 180 is formed over the mixed layer 127, and the insulating layer 181 is formed over the insulating layer 180. The conductive layer 190 is formed in an opening in the insulating layers 180 and 181 and electrically connected to the mixed layer 127. The conductive layer 195 is formed on and in contact with the conductive layer 190. The conductive layer 190 serves as a plug connecting the source or drain region of the transistor 12 and the conductive layer 195.

The above structure allows reducing the parasitic capacitance between the gate electrode and the source region or the parasitic capacitance between the gate electrode and the drain region. As a result, the transistor can operate at high speed; for example, the cutoff frequency characteristics of the transistor 12 can be improved.

In addition, the gate electrode, the source region, and the drain region of the transistor 12 can be formed in a self-aligned manner; thus, the alignment can be facilitated, and a miniaturized transistor can be easily manufactured.

<Components of Transistor>

Components of the transistors in this embodiment will be described below.

<<Substrate 100>>

A glass substrate, a ceramic substrate, a quartz substrate, a sapphire substrate, or the like can be used as the substrate 100. Alternatively, a single crystal semiconductor substrate or a polycrystalline semiconductor substrate of silicon or silicon carbide, a compound semiconductor substrate of silicon germanium, a silicon on insulator (SOI) substrate, or the like can be used. Still alternatively, any of these substrates provided with a semiconductor element may be used. The substrate 100 is not limited to a simple supporting substrate, and may be a substrate where a device such as a transistor is formed. In that case, at least one of the gate, the source, and the drain of the transistor may be electrically connected to the device.

Alternatively, a flexible substrate may be used as the substrate 100. As a method for providing the transistor over a flexible substrate, there is a method in which the transistor is formed over a non-flexible substrate and then the transistor is separated and transferred to the substrate 100 that is a flexible substrate. In that case, a separation layer is preferably provided between the non-flexible substrate and the transistor. As the substrate 100, a sheet, a film, or a foil containing a fiber may be used, for example. The substrate 100 may have elasticity. The substrate 100 may have a property of returning to its original shape when bending or pulling is stopped. Alternatively, the substrate 100 may have a property of not returning to its original shape. The thickness of the substrate 100 is, for example, greater than or equal to 5 μm and less than or equal to 700 μm, preferably greater than or equal to 10 μm and less than or equal to 500 μm, and further preferably greater than or equal to 15 μm and less than or equal to 300 μm. When the substrate 100 has a small thickness, the weight of the semiconductor device can be reduced. When the substrate 100 has a small thickness, even in the case of using glass or the like, the substrate 100 might have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 100 because of its low coefficient of linear expansion.

<<Insulating Layer 110>>

As the insulating layer 110, an insulating film containing one or more of silicon (Si), nitrogen (N), oxygen (O), fluorine (F), hydrogen (H), aluminum (Al), gallium (Ga), germanium (Ge), yttrium (Y), zirconium (Zr), lanthanum (La), neodymium (Nd), hafnium (Hf), and tantalum (Ta) can be used.

The insulating layer 110 can have a function of supplying oxygen to the oxide layer 121 as well as a function of preventing diffusion of impurities from the substrate 100.

For this reason, the insulating layer 110 is preferably an insulating film containing oxygen, and further preferably an insulating film having an oxygen content higher than that in the stoichiometric composition. For example, the insulating layer 110 is a film in which the amount of released oxygen converted into oxygen atoms is $1.0 \times 10^{19}$ atoms/cm$^3$ or more in TDS analysis. Note that the temperature of the film surface in the TDS analysis is preferably higher than or equal to 100° C. and lower than or equal to 700° C., or higher than or equal to 100° C. and lower than or equal to 500° C. In the case where the substrate 100 is provided with another device as described above, the insulating layer 110 also has a function of an interlayer insulating film. In that case, the insulating layer 110 is preferably subjected to planarization treatment such as chemical mechanical polishing (CMP) treatment so as to have a flat surface.

When the insulating layer 110 contains fluorine, fluorine gasified from the insulating layer can stabilize an oxygen vacancy in the oxide layer 121.

<<Oxide Layer 121>>

Oxides used for the oxide layer 121 will be described below.

An oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide contains indium, an element M, and zinc is considered. Note that the element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in the oxide of the present invention are described with reference to FIGS. 4A to 4C. Note that the proportion of oxygen atoms is not shown in FIGS. 4A to 4C. The terms of the atomic ratio of indium, the element M, and zinc contained in the oxide are denoted by [In], [M], and [Zn], respectively.

Figure 4B:
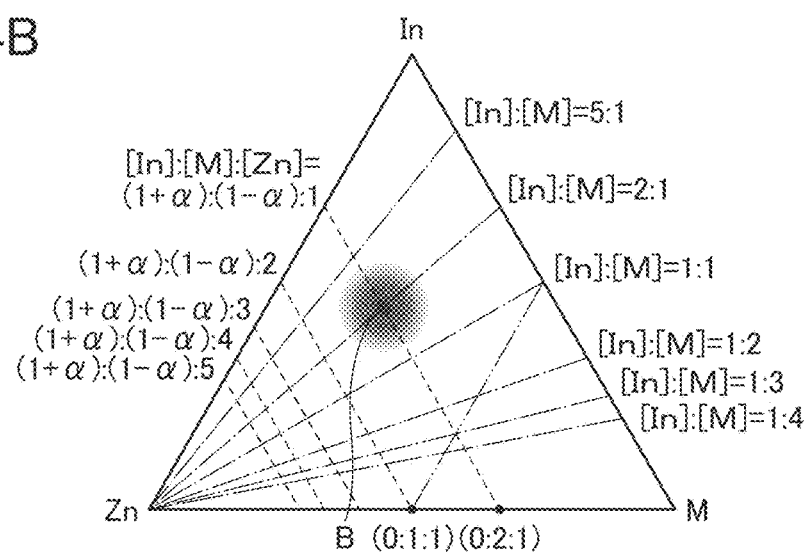
Figure 4C:
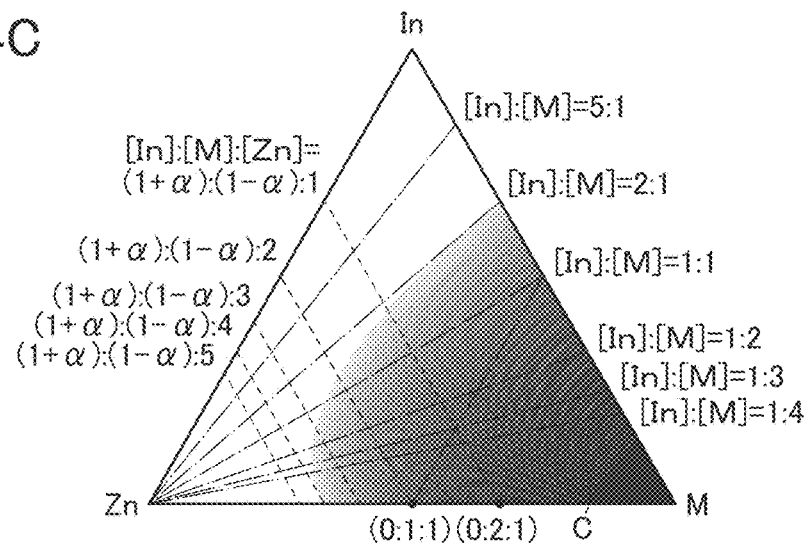

In FIGS. 4A to 4C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

Dashed-double dotted lines indicate a line where the atomic ratio [In]:[M]:[Zn] is $(1+\gamma):2:(1-\gamma)$, where $-1 \leq \gamma \leq 1$. An oxide with an atomic ratio [In]:[M]:[Zn] that is equal to or close to 0:2:1 in FIGS. 4A to 4C is likely to have a spinel crystal structure.

FIGS. 4A and 4B show examples of the preferred ranges of the atomic ratio of indium, the element M, and zinc contained in the oxide of one embodiment of the present invention.

Figure 5:
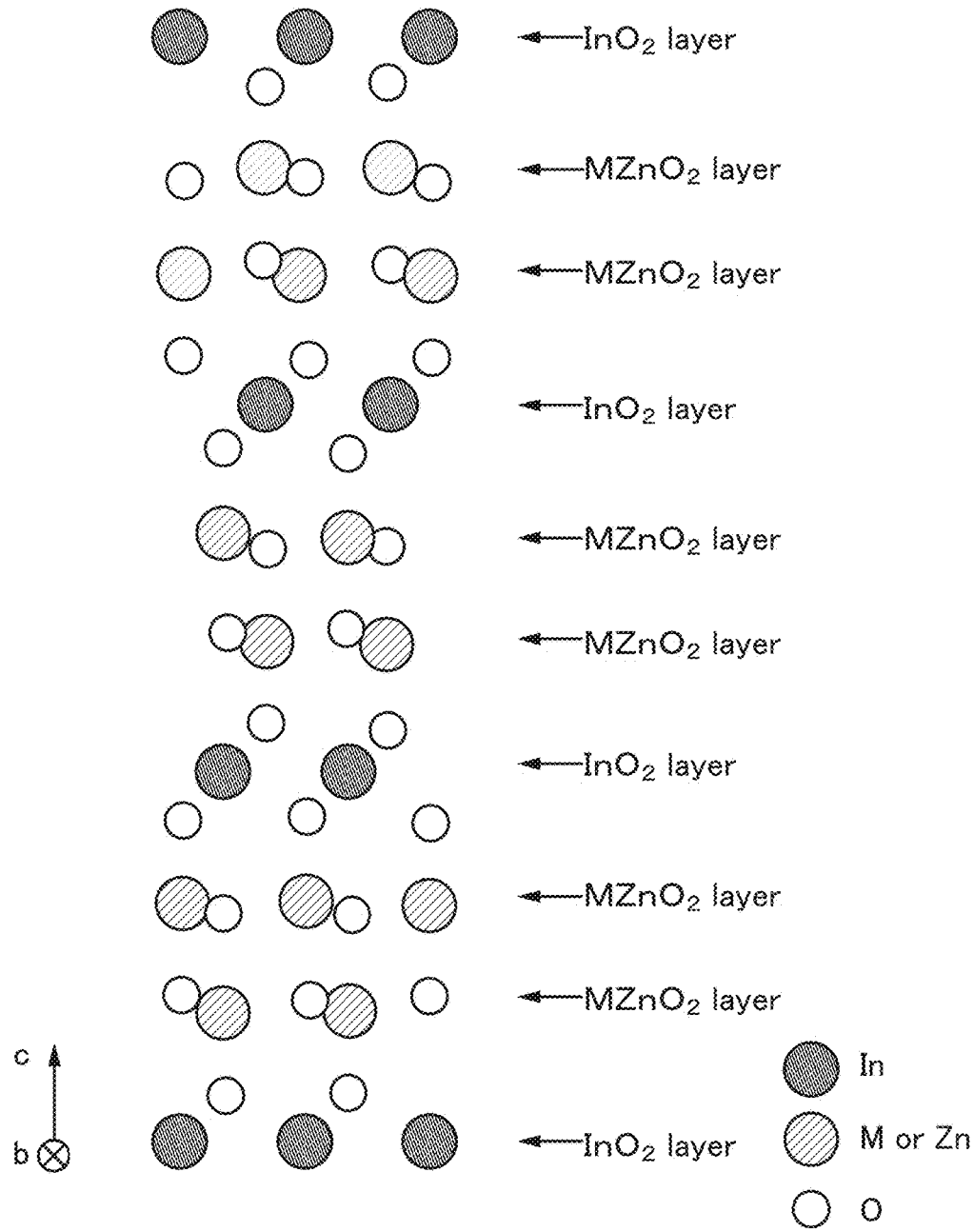
FIG. 5 illustrates an InMZnO$_4$ crystal.

As an example, FIG. 5 shows a crystal structure of InMZnO$_4$ whose atomic ratio [In]:[M]:[Zn] is 1:1:1. The crystal structure shown in FIG. 5 is InMZnO$_4$ observed from a direction parallel to a b-axis. Note that a metal element in an MZnO$_2$ layer in FIG. 5 represents the element M or zinc. In that case, the proportion of the element M is the same as the proportion of zinc. The element M and zinc can be replaced with each other and are arranged randomly.

InMZnO$_4$ has a layered crystal structure (also referred to as a layered structure) and includes, as shown in FIG. 5, two MZnO$_2$ layers containing the element M and zinc for every InO$_2$ layer containing indium.

Indium and the element M can be replaced with each other. Therefore, when the element M in the MZnO$_2$ layer is replaced with indium, the layer can also be referred to as an In$_a$M$_{1-a}$ZnO$_2$ layer ($0 < a \leq 1$). In that case, a layered structure that includes two In$_a$M$_{1-a}$ZnO$_2$ layers for every InO$_2$ layer is obtained. Also, when indium in the InO$_2$ layer is replaced with the element M, the layer can be referred to as an In$_{1-a}$M$_a$O$_2$ layer ($0 \leq a \leq 1$). In that case, a layered structure that includes two MZnO$_2$ layers for every In$_{1-a}$M$_a$O$_2$ layer is obtained.

An oxide whose atomic ratio [In]:[M]:[Zn] is 1:1:2 has a layered structure that includes three MZnO$_2$ layers for every InO$_2$ layer. In other words, if [Zn] is higher than [In] and [M], the proportion of the MZnO$_2$ layer to the InO$_2$ layer increases when the oxide is crystallized.

Note that in the case where the number of MZnO$_2$ layers for every InO$_2$ layer is not an integer in the oxide, the oxide might have plural kinds of layered structures where the number of MZnO$_2$ layers for every InO$_2$ layer is an integer. For example, in the case of [In]:[M]:[Zn]=1:1:1.5, the oxide might have the following layered structures: a layered structure of two MZnO$_2$ layers for every InO$_2$ layer and a layered structure of three MZnO$_2$ layers for every InO$_2$ layer.

For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have a higher carrier mobility (electron mobility). This is because in an oxide containing indium, the element M, and zinc, the s orbital of heavy metal mainly contributes to carrier transfer, and when the indium content in the oxide is increased, overlaps of the s orbitals of indium atoms are increased; therefore, an oxide having a high content of indium has a higher carrier mobility than an oxide having a low content of indium.

In contrast, carrier mobility decreases as the indium content and the zinc content in an oxide become lower. Thus, with an atomic ratio of [In]:[M]:[Zn]=0:1:0 and the vicinity thereof (e.g., a region C in FIG. 4C), insulation performance becomes better.

Accordingly, an oxide of one embodiment of the present invention preferably has an atomic ratio represented by a region A in FIG. 4A. With the atomic ratio, a layered structure with a high carrier mobility and a few grain boundaries is easily obtained.

A region B in FIG. 4B represents an atomic ratio of [In]:[M]:[Zn]=4:2:3 to 4.1 and the vicinity thereof. The vicinity includes, for example, an atomic ratio of [In]:[M]:[Zn]=5:3:4. An oxide with an atomic ratio represented by the region B is an excellent oxide that has particularly high crystallinity and high carrier mobility.

Note that the condition where an oxide forms a layered structure is not uniquely determined by an atomic ratio. There is a difference in the degree of difficulty in forming a layered structure among atomic ratios. Even with the same atomic ratio, whether a layered structure is formed or not depends on the formation condition. Therefore, the illustrated regions each represent an atomic ratio with which an oxide has a layered structure, and boundaries of the regions A to C are not clear.

Next, the case where the oxide is used for a transistor is described.

Note that when the oxide is used for a transistor, carrier scattering or the like at a grain boundary can be reduced; thus, the transistor can have a high field-effect mobility and also have high reliability.

An oxide with a low carrier density is preferably used for the transistor. For example, an oxide whose carrier density is lower than $8 \times 10^{11}/cm^3$, preferably lower than $1 \times 10^{11}/cm^3$, more preferably lower than $1 \times 10^{10}/cm^3$, and greater than or equal to $1 \times 10^{-9}/cm^3$ is used.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. Examples of the impurities include hydrogen, nitrogen, alkali metal, alkaline earth metal, iron, nickel, and silicon.

Here, the influence of impurities in the oxide is described.

When silicon or carbon that is a Group 14 element is contained in the oxide, defect states are formed. Thus, the concentration of silicon or carbon (measured by secondary ion mass spectrometry (SIMS)) is set to be lower than or equal to $2 \times 10^{18}$ atoms/cm$^3$, preferably lower than or equal to $2 \times 10^{17}$ atoms/cm$^3$ in the oxide or around an interface with the oxide.

When the oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide. Specifically, the concentration of alkali metal or alkaline earth metal measured by SIMS is set to be lower than or equal to $1 \times 10^{18}$ atoms/cm$^3$, preferably lower than or equal to $2 \times 10^{16}$ atoms/cm$^3$.

When containing nitrogen, the oxide easily becomes n-type by generation of electrons serving as carriers and an increase of carrier density. Thus, a transistor whose semiconductor includes an oxide containing nitrogen is likely to be normally-on. For this reason, nitrogen in the oxide is preferably reduced as much as possible; for example, the concentration of nitrogen in the oxide measured by SIMS is set to be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, and still more preferably lower than or equal to $5 \times 10^{17}$ atoms/cm$^3$.

Hydrogen contained in an oxide reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, hydrogen in the oxide is preferably reduced as much as possible. Specifically, the concentration of hydrogen in the oxide measured by SIMS is set to be lower than $1 \times 10^{20}$ atoms/cm$^3$, preferably lower than $1 \times 10^{19}$ atoms/cm$^3$, more preferably lower than $5 \times 10^{18}$ atoms/cm$^3$, and still more preferably lower than $1 \times 10^{18}$ atoms/cm$^3$.

When an oxide with sufficiently reduced impurity concentration is used for a channel formation region in a transistor, the transistor can have stable electrical characteristics.

<<Sacrificial Layer 160>>

The sacrificial layer 160 can be formed using a material similar to that of the oxide layer 121, or a material containing silicon, silicon oxide, silicon nitride, or the like.

A metal atom may be added to these materials, in which case the resistance of the sacrificial layer 160 can be reduced.

<<Insulating Layer 150>>

The insulating layer 150 can contain oxygen (O), nitrogen (N), fluorine (F), aluminum (Al), magnesium (Mg), silicon (Si), gallium (Ga), germanium (Ge), yttrium (Y), zirconium (Zr), lanthanum (La), neodymium (Nd), hafnium (Hf), tantalum (Ta), titanium (Ti), or the like. For example, the insulating layer 150 can contain one or more of aluminum oxide ($AlO_x$), magnesium oxide ($MgO_x$), silicon oxide ($SiO_x$), silicon oxynitride ($SiO_xN_y$), silicon nitride oxide ($SiN_xO_y$), silicon nitride ($SiN_x$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), and tantalum oxide ($TaO_x$). The insulating layer 150 may be a stack of any of the above materials. The insulating layer 150 may contain lanthanum (La), nitrogen, zirconium (Zr), or the like as an impurity.

The insulating layer 150 preferably contains a large amount of oxygen. Oxygen contained in the insulating layer 150 diffuses into the oxide layer 121 by heat treatment. Accordingly, oxygen vacancies (Vo) in the oxide layer 121 can be reduced.

An example of a stacked-layer structure of the insulating layer 150 will be described. The insulating layer 150 contains, for example, oxygen, nitrogen, silicon, or hafnium. Specifically, the insulating layer 150 preferably contains hafnium oxide and silicon oxide or silicon oxynitride.

Hafnium oxide has a higher dielectric constant than silicon oxide and silicon oxynitride. Therefore, the insulating layer 150 using hafnium oxide can have a larger thickness than the insulating layer 150 using silicon oxide, so that leakage current due to tunnel current can be reduced. That is, it is possible to provide a transistor with a low off-state current. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

A surface over which the hafnium oxide with a crystalline structure is formed might have interface states due to defects. The interface state serves as a trap center in some cases. Therefore, when hafnium oxide is provided near a channel region of a transistor, the electrical characteristics of the transistor might deteriorate because of the interface state. In order to reduce the adverse effect of the interface state, in some cases, it is preferable to separate the channel region of the transistor and the hafnium oxide from each other by providing another film therebetween. The film has a buffer function. The film having a buffer function may be included in the insulating layer 150 or included in an oxide semiconductor film. That is, the film having a buffer function can be formed using silicon oxide, silicon oxynitride, an oxide semiconductor layer, or the like. Note that the film having a buffer function is formed using, for example, a semiconductor or an insulator having a larger energy gap than a semiconductor to be the channel region. Alternatively, the film having a buffer function is formed using, for example, a semiconductor or an insulator having lower electron affinity than a semiconductor to be the channel region. Further alternatively, the film having a buffer function is formed using, for example, a semiconductor or an insulator having higher ionization energy than a semiconductor to be the channel region.

In some cases, the threshold voltage of a transistor can be controlled by trapping an electric charge in an interface state (trap center) at the surface over which the hafnium oxide with a crystalline structure is formed. In order to make the electric charge exist stably, for example, an insulator having a larger energy gap than hafnium oxide may be provided between the channel region and the hafnium oxide. Alternatively, a semiconductor or an insulator having lower electron affinity than hafnium oxide may be provided. The film having a buffer function may be formed using a semiconductor or an insulator having higher ionization energy than hafnium oxide. With the use of such an insulator, an electric charge trapped in the interface state is less likely to be released; accordingly, the electric charge can be held for a long period of time.

Examples of such an insulator include silicon oxide and silicon oxynitride. In order to make the interface state in the insulating layer 150 trap an electric charge, an electron is transferred from the oxide layer 121 toward the gate electrode. As a specific example, the potential of the gate electrode is kept higher than the potential of the source or drain electrode at high temperatures (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a desired amount of electrons is trapped in interface states in the insulating layer 150 or the like shifts in the positive direction. The amount of electrons to be trapped (the amount of change in threshold voltage) can be controlled by adjusting a voltage of the sacrificial layer 160 or time in which the voltage is applied. Note that the location in which an electric charge is trapped is not necessarily limited to the inside of the insulating layer 150 as long as an electric charge can be trapped therein. A stacked film having a similar structure may be used as a different insulating layer.

<<Insulting Layer 180>>

The insulatng layer 180 can be formed using a material similar to that of the insulating layer 150.

The insulating layer 180 may be a stacked layer. The insulating layer 180 preferably contains oxygen more than that in the stoichiometric composition. Oxygen released from the insulating layer 180 can be diffused into the channel formation region in the oxide layer 121 through the insulating layer 150, so that oxygen vacancies formed in the channel formation region can be filled with the oxygen. In this manner, stable electrical characteristics of the transistor can be achieved.

<<Conductive Layers 170 and 175>>

The conductive layers 170 and 175 can contain a material such as aluminum (Al), titanium (Ti), chromium (Cr), cobalt (Co), nickel (Ni), copper (Cu), yttrium (Y), zirconium (Zr), molybdenum (Mo), ruthenium (Ru), silver (Ag), tantalum (Ta), tungsten (W), or silicon (Si). When a stack of the conductive layers 170 and 175 is used as an electrode layer, a material containing nitrogen, such as a nitride of any of the above materials, may be used for any of the layers.

<<Conductive Layer 190>>

The conductive layer 190 can be formed using a material similar to that of the conductive layer 170.

<<Conductive Layer 195>>

The conductive layer 195 can be formed using a material similar to that of the conductive layer 170.

Modification examples of the transistors 10, 11, and 12 will be described. Note that in the description of the modification examples, structures similar to those of the transistors 10, 11, and 12 are not described in some cases.

<Modification Example of Transistor 10>

Modification examples of the transistor 10 illustrated in FIGS. 1A to 1C are described below with reference to FIG. 6A to FIG. 15C.

A transistor 10a illustrated in FIGS. 6A to 6C is different from the transistor 10 in including an insulating layer 176. The insulating layer 176 is provided in contact with the side surfaces of the insulating layer 150 and the sacrificial layer 160, so that the mixed layer 162 is formed in contact with only the top surface of the sacrificial layer 160. Note that the insulating layer 176 can serve as a sidewall oxide film (also referred to as a sidewall), and prevents an effective channel length of the transistor 10a from decreasing when the mixed layer 127 is formed. Note that the insulating layer 176 is also in contact with the side surfaces of the insulating layer 110, the oxide layer 121, and the mixed layer 127.

The insulating layer 176 can be formed using a material similar to that of the insulating layer 150.

Figure 7A:
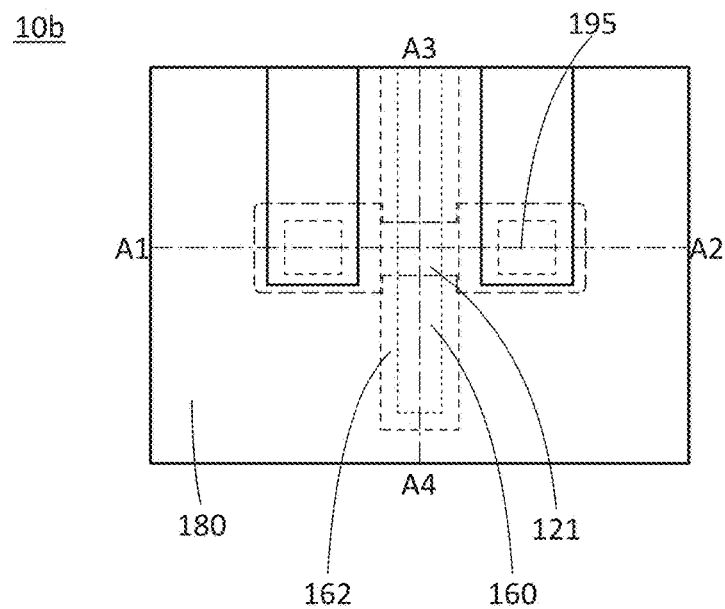
FIGS. 7A to 7C are a top view and cross-sectional views illustrating a transistor of one embodiment of the present invention.
Figures 7B, 7C:
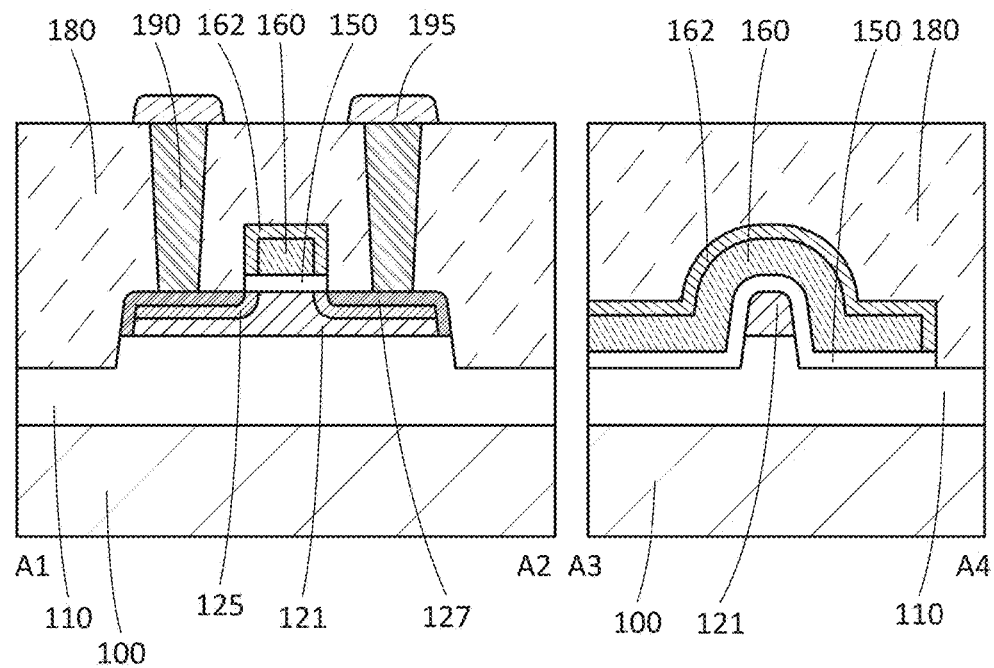

A transistor 10b illustrated in FIGS. 7A to 7C is different from the transistor 10 in including a low-resistance region 125. The low-resistance region 125 includes one or more of hydrogen, nitrogen, fluorine, helium, neon, argon, krypton, xenon, boron, and phosphorus. The low-resistance region 125 prevents deterioration of the transistor 10b due to hot-carrier injection.

A transistor 10c illustrated in FIGS. 8A to 8C is different from the transistor 10 in that the sacrificial layer 160 is not provided and the mixed layer 162 is formed over the insulating layer 150. In the transistor 10c, the mixed layer 162 is formed by forming a conductive layer including at least one of aluminum, molybdenum, titanium, tantalum, tungsten, nickel, cobalt, and platinum (the element group B) over a sacrificial layer, and then performing heat treatment so that the whole sacrificial layer is the mixed layer 162.

Figure 9A:
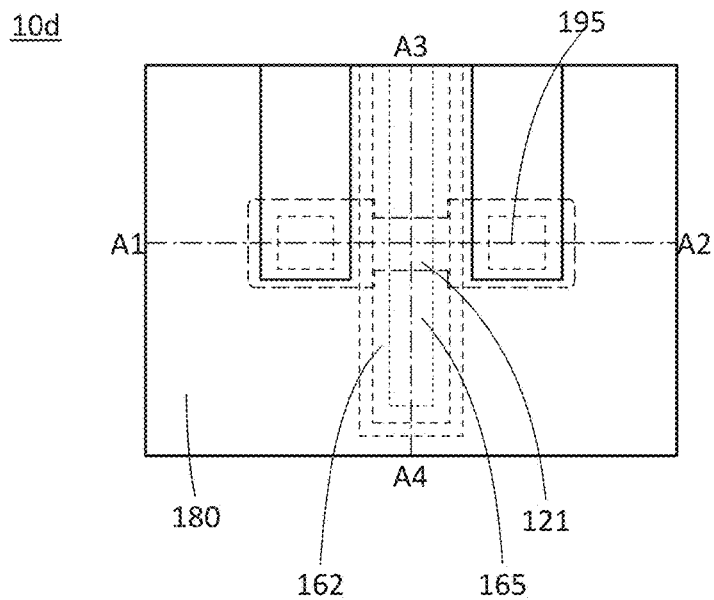
FIGS. 9A to 9C are a top view and cross-sectional views illustrating a transistor of one embodiment of the present invention.
Figures 9B, 9C:
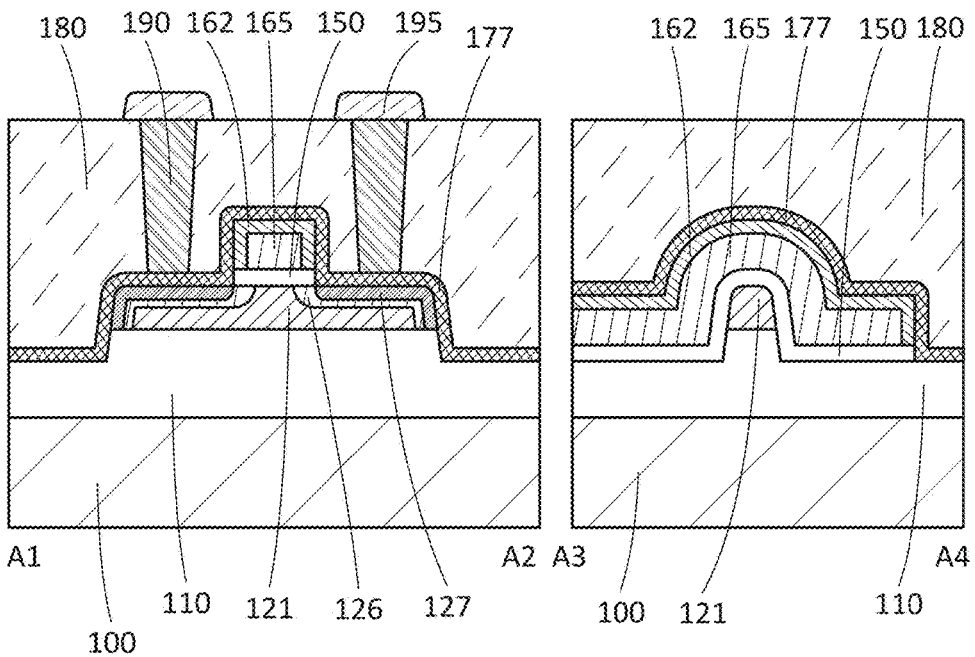

A transistor 10d illustrated in FIGS. 9A to 9C is different from the transistor 10 in that an insulating layer 177 is formed over the mixed layers 127 and 162 and a sacrificial layer 165 is provided. The sacrificial layer 165 is an oxide conductor obtained by supplying nitrogen and/or hydrogen to an oxide layer from the insulating layer 177 through the mixed layer 162 to increase carrier density, and can serve as an electrode. A low-resistance region 126 in the oxide layer 121 is also an oxide conductor obtained by supplying nitrogen or hydrogen from the insulating layer 177 to increase carrier density. Note that in such a transistor provided with the insulating layer 177, the insulating layer 177 is in contact with the sacrificial layer 165 in the case where the mixed layer 162 is not provided, which facilitates the entry of nitrogen and/or hydrogen from the insulating layer 177 and further increases the carrier density of the sacrificial layer 165.

For example, an insulating layer containing hydrogen or nitrogen, that is, an insulating layer capable of releasing hydrogen or nitrogen, typically, a silicon nitride film, is used as the insulating layer 177. The insulating layer capable of releasing hydrogen preferably has a hydrogen concentration of $1\times10^{22}$ atoms/cm$^3$ or higher. When such an insulating layer is formed, hydrogen or nitrogen can be supplied to the sacrificial layer 165.

A transistor 10e illustrated in FIGS. 10A to 10C is different from the transistor 10 in that the mixed layers 127 and 162 are not formed and the insulating layer 177 is formed in contact with the oxide layer 121 and the sacrificial layer 165. In the transistor 10e, the sacrificial layer 165 is an oxide conductor obtained by supplying nitrogen or hydrogen to an oxide layer from the insulating layer 177 to increase carrier density. The low-resistance region 126 in the oxide layer 121 is also an oxide conductor obtained by supplying nitrogen or hydrogen from the insulating layer 177 in contact with the low-resistance region 126 to increase carrier density. In the transistor 10e, the low-resistance region 126 can serve as a source or a drain region of the transistor 10e.

Figure 11A:
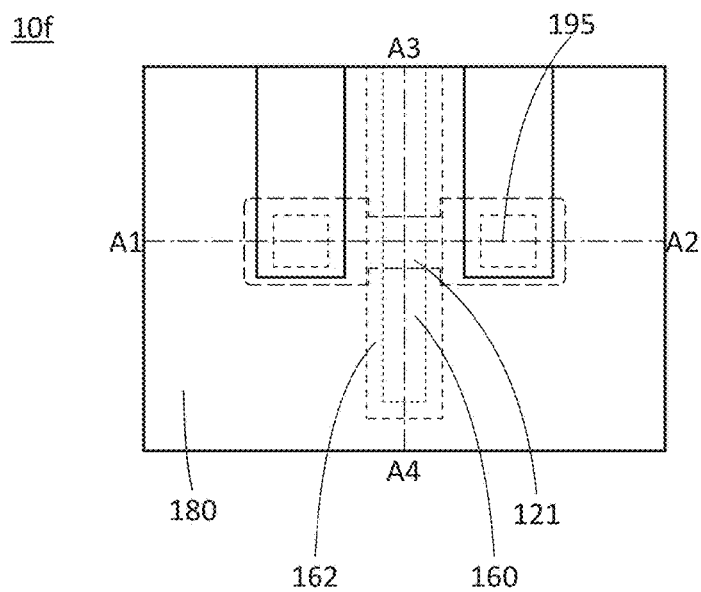
FIGS. 11A to 11C are a top view and cross-sectional views illustrating a transistor of one embodiment of the present invention.
Figures 11B, 11C:
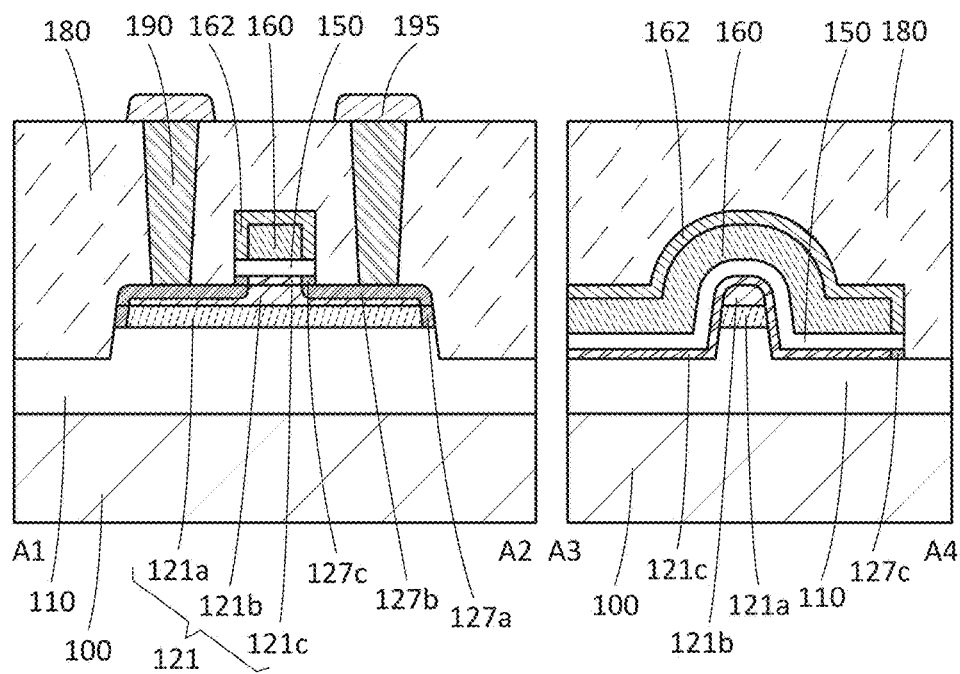

A transistor 10f illustrated in FIGS. 11A to 11C is different from the transistor 10 in that the oxide layer 121 includes an oxide insulating layer 121a, an oxide semiconductor layer 121b, and an oxide insulating layer 121c. In the transistor 10f, the oxide insulating layer 121a is formed over the insulating layer 110, the oxide semiconductor layer 121b is formed in contact with a top surface of the oxide insulating layer 121a, and the oxide insulating layer 121c is formed in contact with a top surface of the oxide semiconductor layer 121b. A mixed layer 127a is formed in contact with a side surface of the oxide insulating layer 121a, a mixed layer 127b is formed in contact with top and side surfaces of the oxide semiconductor layer 121b, and a mixed layer 127c is formed in contact with a side surface of the oxide insulating layer 121c.

In the transistor 10f, the end portions of the mixed layers 127a and 127b are substantially aligned, and the end portions of the mixed layer 127c, the insulating layer 150, and the mixed layer 162 are substantially aligned.

Note that one embodiment of the present invention is not limited to the structure of the transistor 10f in which the oxide layer 121 includes the oxide insulating layer 121a, the oxide semiconductor layer 121b, and the oxide insulating layer 121c. For example, the oxide layer 121 may include the oxide semiconductor layer 121b and the oxide insulating layer 121c and the insulating layer 110 may be in contact with the oxide semiconductor layer 121b.

<<Oxide Insulating Layer 121a, Oxide Semiconductor Layer 121b, and Oxide Insulating Layer 121c>>

A band diagram of insulators that are in contact with the stacked structure of the oxide insulating layer 121a, the oxide semiconductor layer 121b, and the oxide insulating layer 121c and a band diagram of insulators that are in contact with the stacked structure of the oxide semiconductor layer 121b and the oxide insulating layer 121c are described with reference to FIGS. 12A and 12B. Note that in the description of FIGS. 12A and 12B, an oxide of the oxide insulating layer 121a is referred to as S1, an oxide of the oxide semiconductor layer 121b is referred to as S2, and an oxide of the oxide insulating layer 121c is referred to as S3.

Figure 12A:
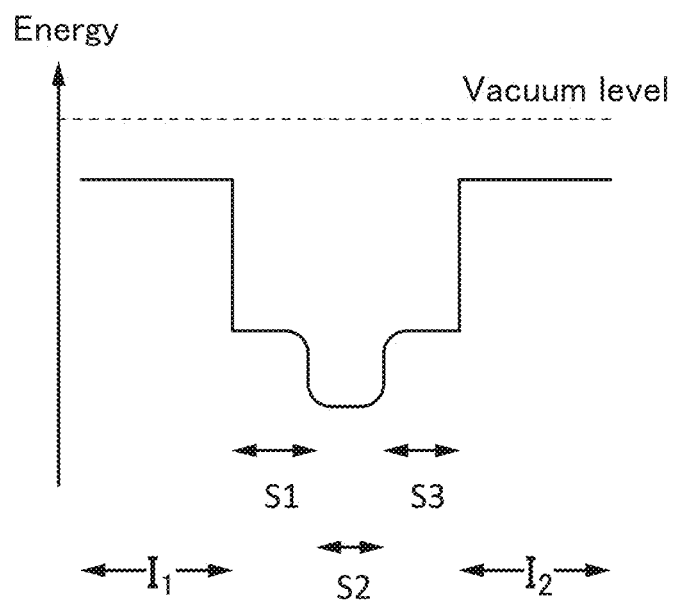
FIGS. 12A and 12B each illustrate a band structure in a stacked-layer structure of an oxide.

FIG. 12A is an example of the band diagram of a stacked structure including an insulator I1, the oxide S1, the oxide S2, the oxide S3, and an insulator I2 in a film thickness direction. FIG. 12B is an example of the band diagram of a stacked structure including the insulator I1, the oxide S2, the oxide S3, and the insulator I2 in a film thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2. Typically, a difference in the energy level between the conduction band minimum of the oxide S2 and the conduction band minimum of each of the oxides S1 and S3 is preferably greater than or equal to 0.15 eV or greater than or equal to 0.5 eV, and less than or equal to 2 eV or less than or equal to 1 eV. That is, a difference in the electron affinity between each of the oxides S1 and S3 and the oxide S2 is preferably greater than or equal to 0.15 eV or greater than or equal to 0.5 eV, and less than or equal to 2 eV or less than or equal to 1 eV.

Figure 12B:
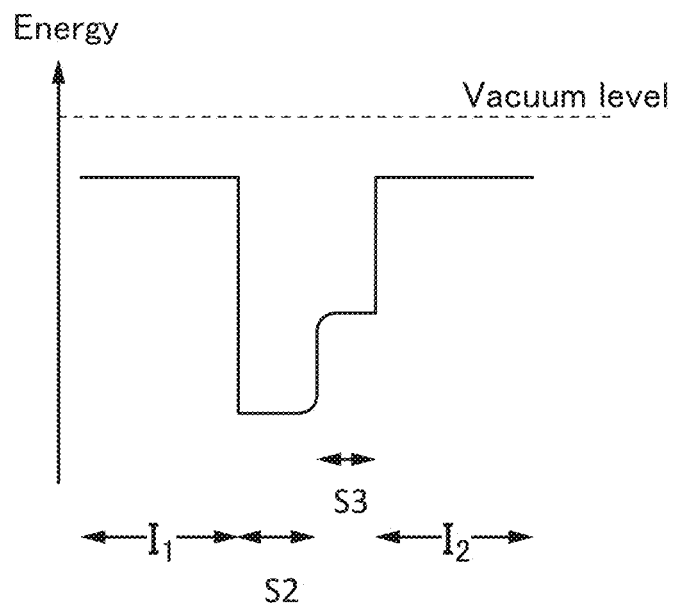

As shown in FIGS. 12A and 12B, the energy level of the conduction band minimum of each of the oxides S1 to S3 is gradually varied. In other words, the energy level of the conduction band minimum is continuously varied or continuously connected. In order to obtain such a band diagram, the density of defect states in a mixed layer formed at the interface between the oxides S1 and S2 or the interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor shifts in a positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxides S1 and S2, and the interface between the oxides S2 and S3 mainly function as a channel region. For example, an oxide with high insulation performance and the atomic ratio represented by the region C in FIG. 4C may be used as the oxides S1 and S3. The region C in FIG. 4C shows the atomic ratio of [In]:[M]:[Zn]=0:1:0 or a neighborhood thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

Note that the structure of the oxide semiconductor layer will be described in detail in Embodiment 3.

A transistor 10g illustrated in FIGS. 13A to 13C is different from the transistor 10f in that the oxide insulating layer 121c and the mixed layer 127c are formed to cover the side surface of the mixed layer 127a, part of the side and top surfaces of the mixed layer 127b, and part of the top surface of the oxide semiconductor layer 121b.

Figure 14A:
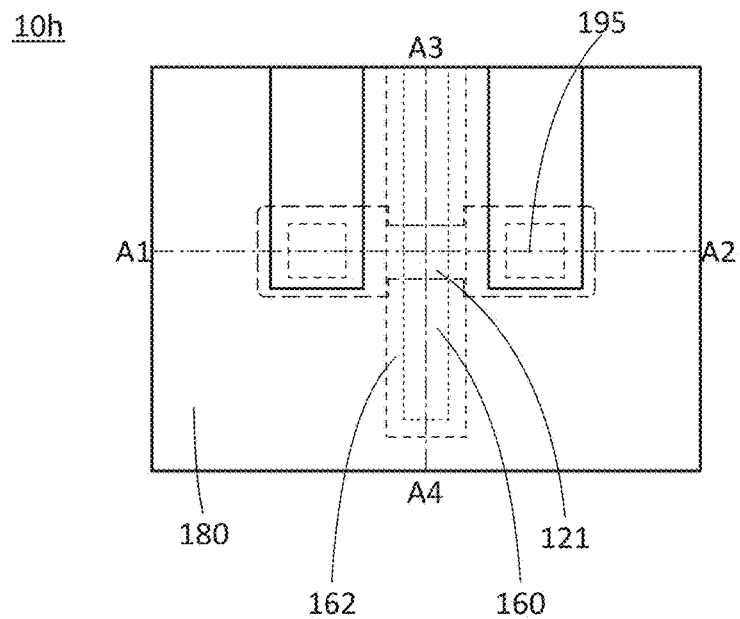
FIGS. 14A to 14C are a top view and cross-sectional views illustrating a transistor of one embodiment of the present invention.
Figures 14B, 14C:
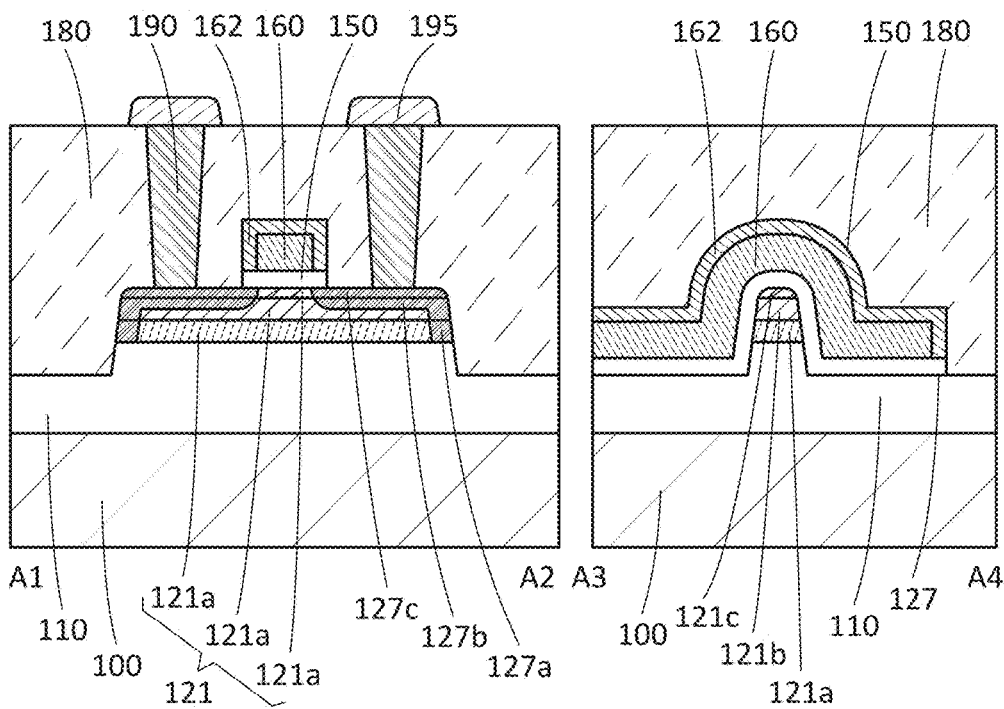

A transistor 10h illustrated in FIGS. 14A to 14C is different from the transistors 10f and 10g in that the end portions of the mixed layers 127a, 127b, and 127c are substantially aligned.

Figure 15A:
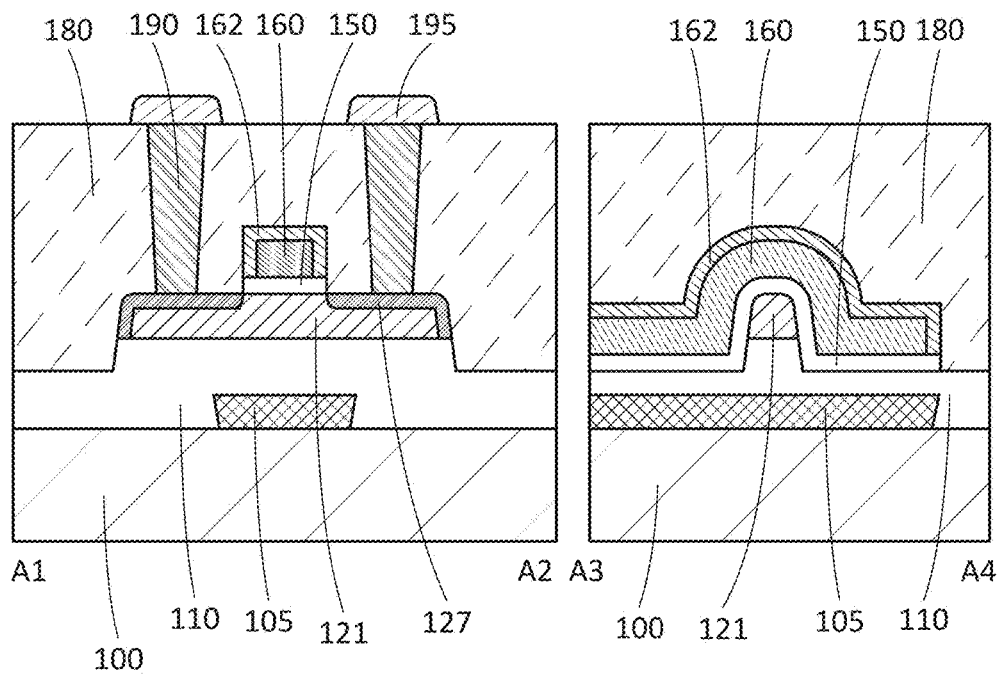
FIGS. 15A to 15C are cross-sectional views illustrating a transistor of one embodiment of the present invention.
Figure 15B:
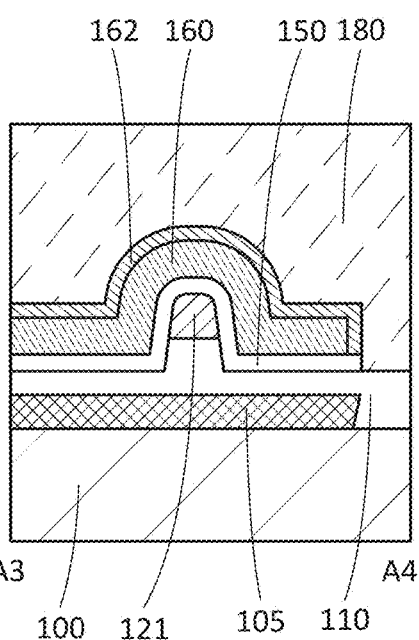
Figure 15C:
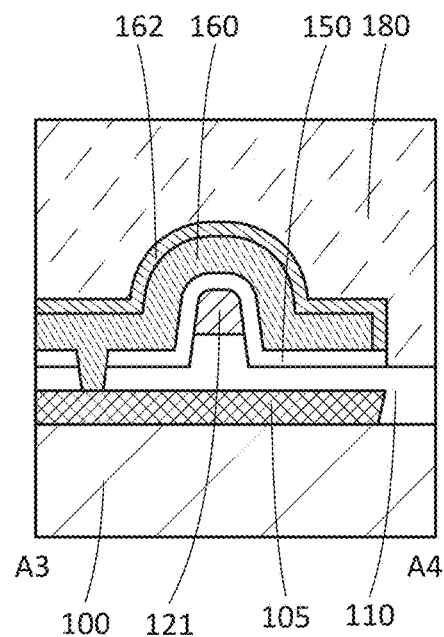

A transistor illustrated in FIGS. 15A to 15C is different from the transistor 10 in including a conductive layer 105.

Note that FIG. 15A illustrates a structure of the transistor in the channel length direction and FIG. 15B illustrates a structure of the transistor in the channel width direction. FIG. 15C illustrates another example of the structure of the transistor in the channel width direction.

<<<Conductive Layer 105>>>

The conductive layer 105 can be formed using a material similar to that of the conductive layer 190. The conductive layer 105 may be a single layer or a stacked layer.

The conductive layer 105 can have a function similar to that of the sacrificial layer 160 and the mixed layer 162. The conductive layer 105, and the sacrificial layer 160 and the mixed layer 162 may be configured to be applied with the same potential or different potentials.

Note that the sacrificial layer 160 and the conductive layer 105 may be electrically connected to each other as illustrated in FIG. 15C.

In the transistor including the conductive layer 105, the insulating layer 110 can have a structure and a function similar to those of the insulating layer 150.

When the conductive layer 105 is provided, the electrical characteristics (e.g., a threshold voltage) of the transistor can be controlled.

<Modification Example of Transistor 11>

Modification examples of the transistor 11 illustrated in FIGS. 2A to 2C are described below with reference to FIG. 16A to FIG. 19C.

Figure 16A:
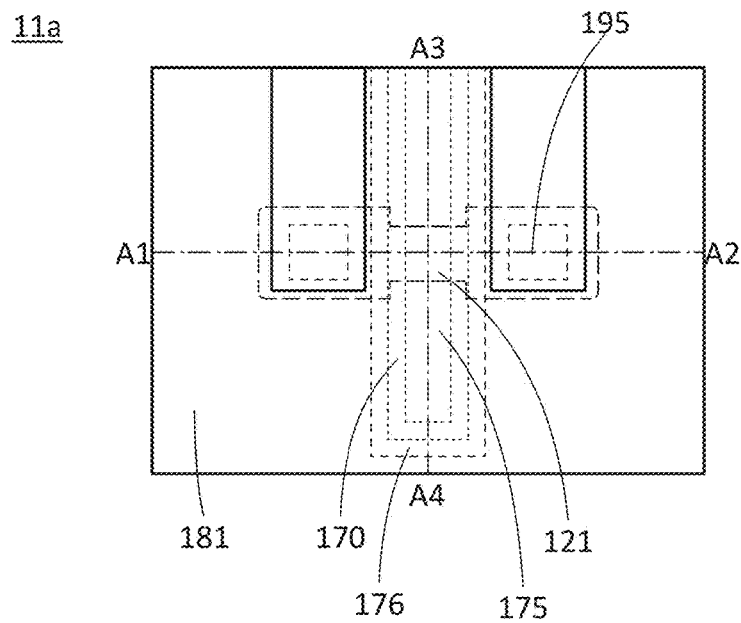
FIGS. 16A to 16C are a top view and cross-sectional views illustrating a transistor of one embodiment of the present invention.
Figures 16B, 16C:
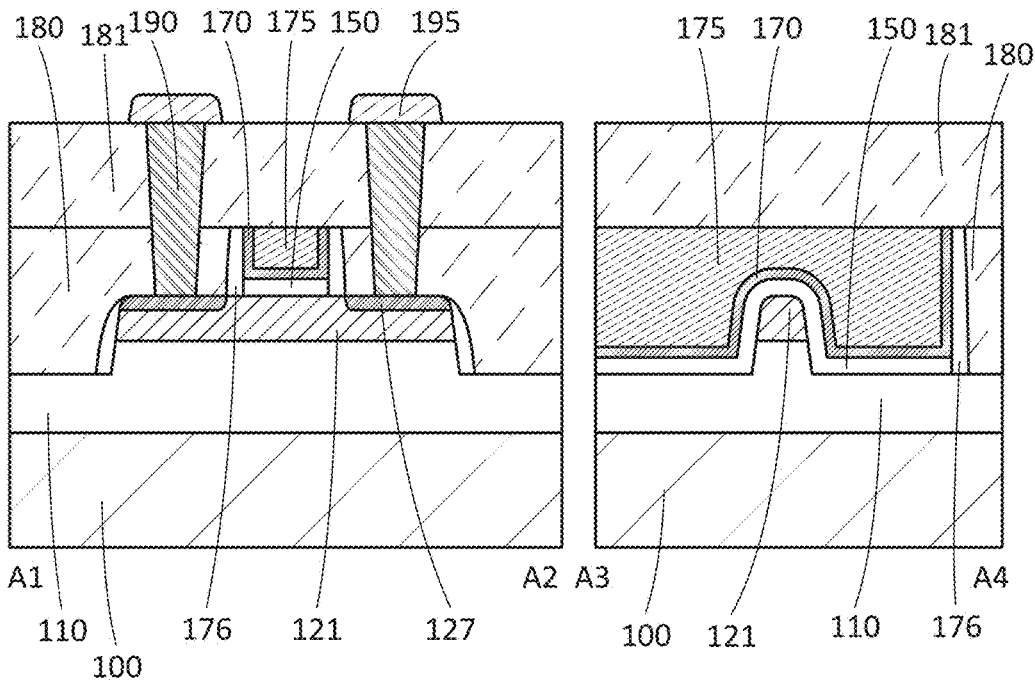

A transistor 11a illustrated in FIGS. 16A to 16C is different from the transistor 11 in including the insulating layer 176. The insulating layer 176 is in contact with the side surfaces of the insulating layer 150 and the conductive layer 170. In the manufacturing process of the transistor 11, a semiconductor and a conductor are made in contact and then are alloyed by heating to form the mixed layer 127. In some cases, the alloyed region expands to reach not only a region where the semiconductor and the conductor are in contact but also a channel formation region under the gate electrode. This might reduce an effective channel length of the transistor. The insulating layer 176 prevents the alloyed region from reaching the channel formation region, which can prevent the effective channel length from decreasing unintentionally. Note that the insulating layer 176 is also in contact with side surfaces of the insulating layer 110, the oxide layer 121, and the mixed layer 127.

A transistor 11b illustrated in FIGS. 17A to 17C is different from the transistor 11 in including the low-resistance region 125. The low-resistance region 125 includes one or more of hydrogen, nitrogen, fluorine, helium, neon, argon, krypton, xenon, boron, and phosphorus. The low-resistance region 125 prevents deterioration of the transistor 11b due to hot-carrier injection.

Figure 18A:
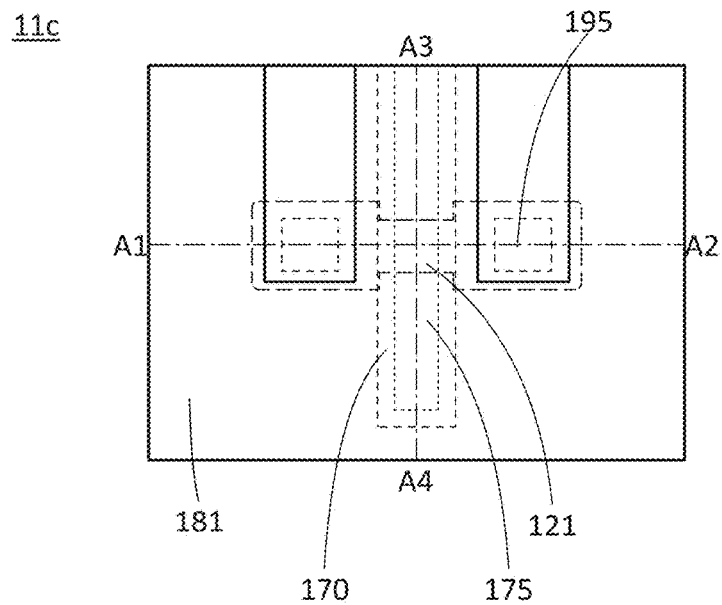
FIGS. 18A to 18C are a top view and cross-sectional views illustrating a transistor of one embodiment of the present invention.
Figures 18B, 18C:
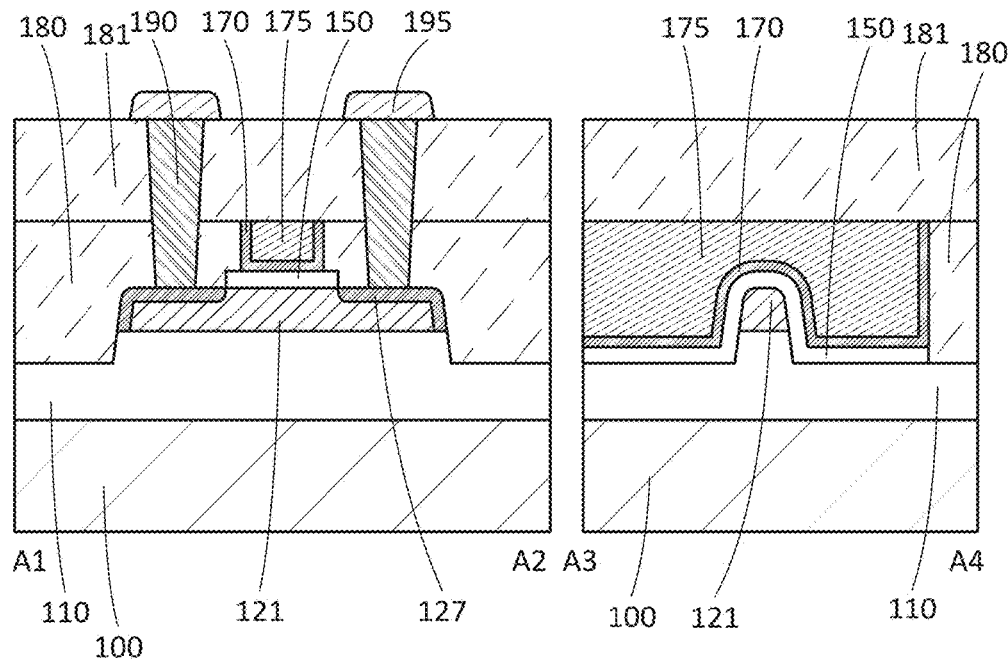

A transistor 11c illustrated in FIGS. 18A to 18C is different from the transistor 11 in that the length of the conductive layer 170 in the channel length direction is smaller than that of the insulating layer 150 in the channel length direction. In the transistor 11c where the insulating layer 150 has a shape such that an end portion extends beyond end portions of the conductive layers 170 and 175, the aforementioned alloyed region can be prevented from reaching the channel formation region. This can prevent the effective channel length from decreasing unintentionally.

Figure 19A:
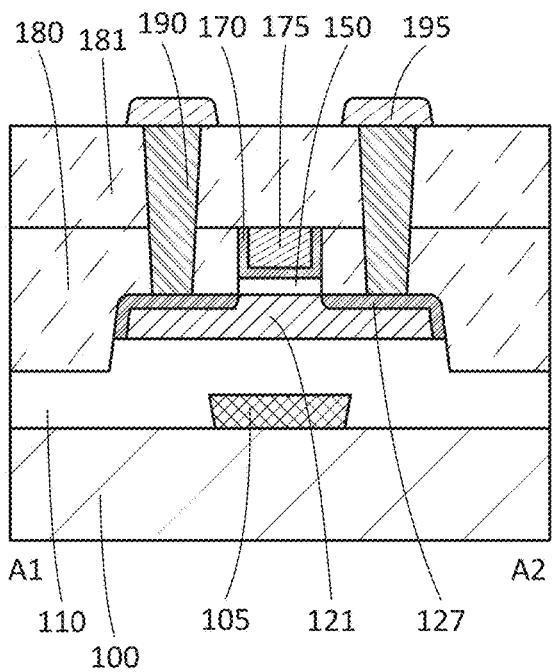
FIGS. 19A to 19C are cross-sectional views illustrating a transistor of one embodiment of the present invention.
Figure 19B:
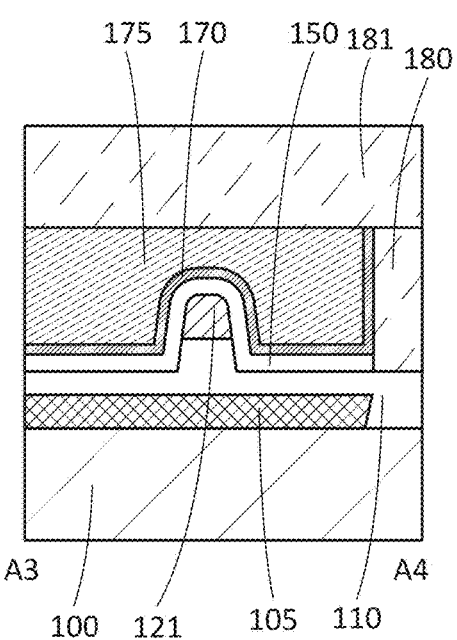
Figure 19C:
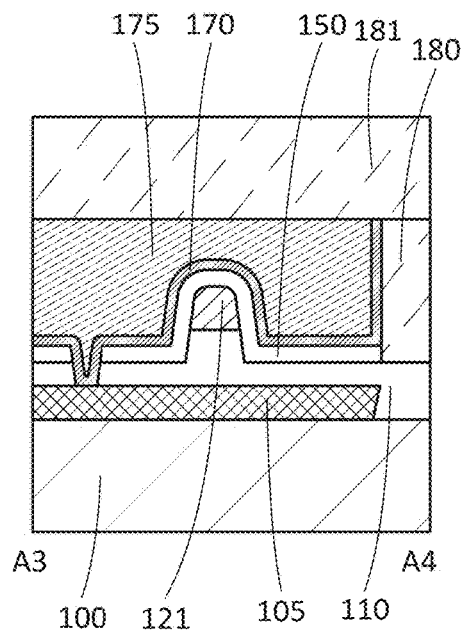

A transistor 11d illustrated in FIGS. 19A to 19C is different from the transistor 11 in including the conductive layer 105. Note that FIG. 19A illustrates a structure of the transistor in the channel length direction and FIG. 19B illustrates a structure of the transistor in the channel width direction. FIG. 19C illustrates another example of the structure of the transistor in the channel width direction.

The conductive layer 105 can have a function similar to that of the conductive layers 170 and 175. The conductive layer 105, and the conductive layers 170 and 175 may be configured to be applied with the same potential or different potentials.

Note that the conductive layers 170 and 105 may be electrically connected to each other as illustrated in FIG. 19C.

With the above structure, the electrical characteristics (e.g., a threshold voltage) of the transistor 11d can be controlled.

<Modification Example of Transistor 12>

Modification examples of the transistor 12 illustrated in FIGS. 3A to 3C are described below with reference to FIG. 20A to FIG. 22C.

Figure 20A:
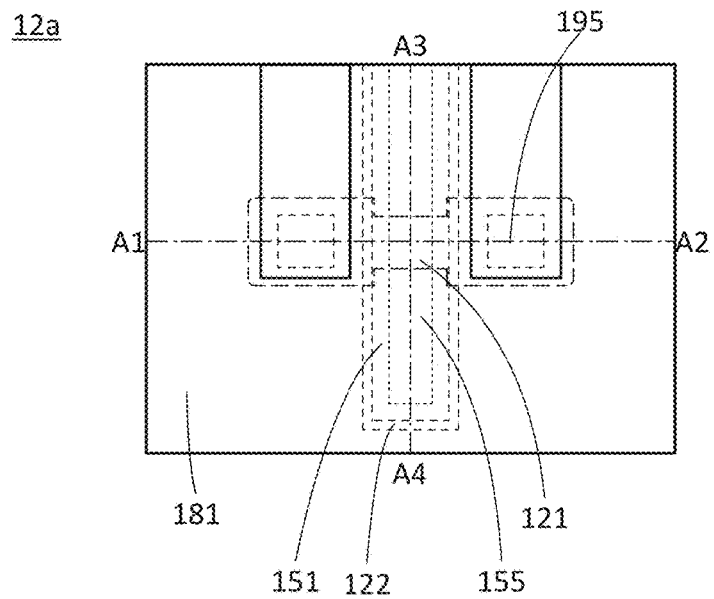
FIGS. 20A to 20C are a top view and cross-sectional views illustrating a transistor of one embodiment of the present invention.
Figures 20B, 20C:
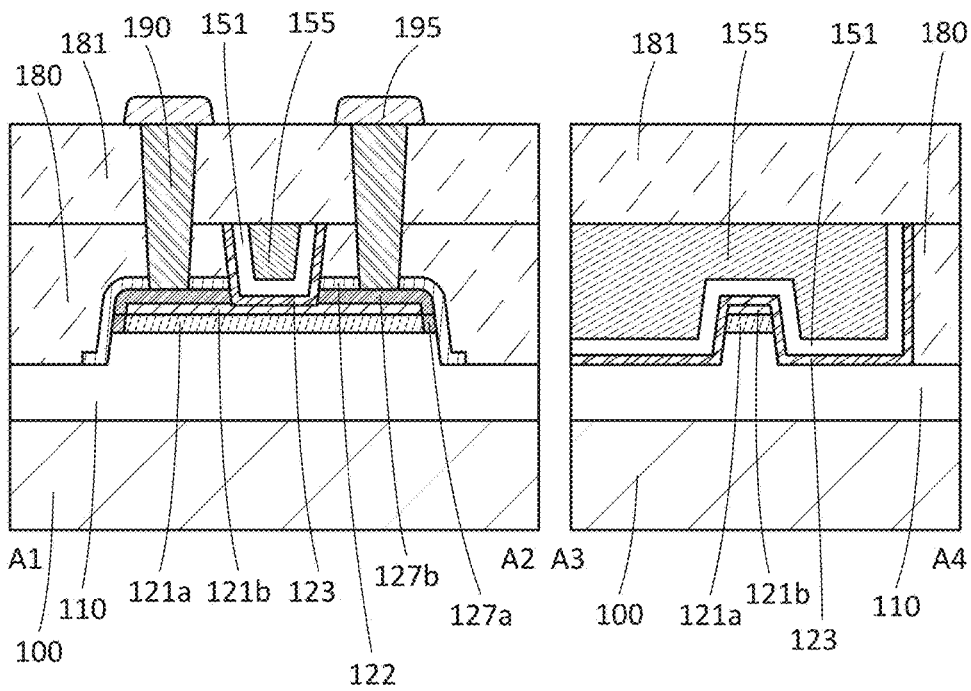

A transistor 12a illustrated in FIGS. 20A to 20C is different from the transistor 12 in including the oxide insulating layer 121a, the oxide semiconductor layer 121b, an oxide insulating layer 122, and an oxide insulating layer 123. In the transistor 12a, the oxide insulating layer 121a is formed over the insulating layer 110, and the oxide semiconductor layer 121b is formed in contact with a top surface of the oxide insulating layer 121a. The mixed layer 127a is in contact with a side surface of the oxide insulating layer 121a, and the mixed layer 127b is in contact with top and side surfaces of the oxide semiconductor layer 121b. The oxide insulating layer 122 is formed in contact with top and side surfaces of the mixed layer 127b and a side surface of the mixed layer 127a. The insulating layer 180 is formed over the oxide insulating layer 122. The oxide insulating layer 123 is formed in an opening provided in the insulating layer 180 and the mixed layer 127b and touches the oxide semiconductor layer 121b. The insulating layer 151 is formed over the oxide insulating layer 123, and the conductive layer 155 is formed over the insulating layer 151.

The oxide insulating layers 122 and 123 may have a structure similar to that of the oxide insulating layer 121c described in other structures of the transistors. Note that a modification example of the transistor 12 may include only one of the oxide insulating layers 122 and 123.

Figure 21A:
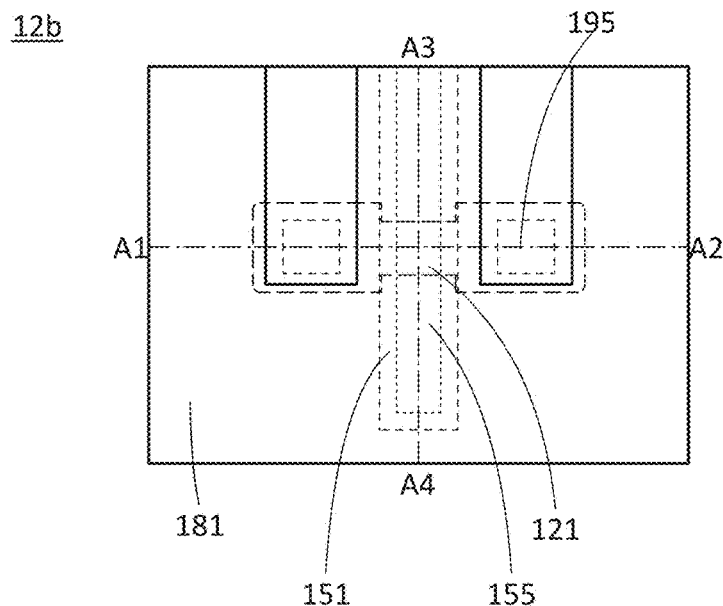
FIGS. 21A to 21C are a top view and cross-sectional views illustrating a transistor of one embodiment of the present invention.
Figures 21B, 21C:
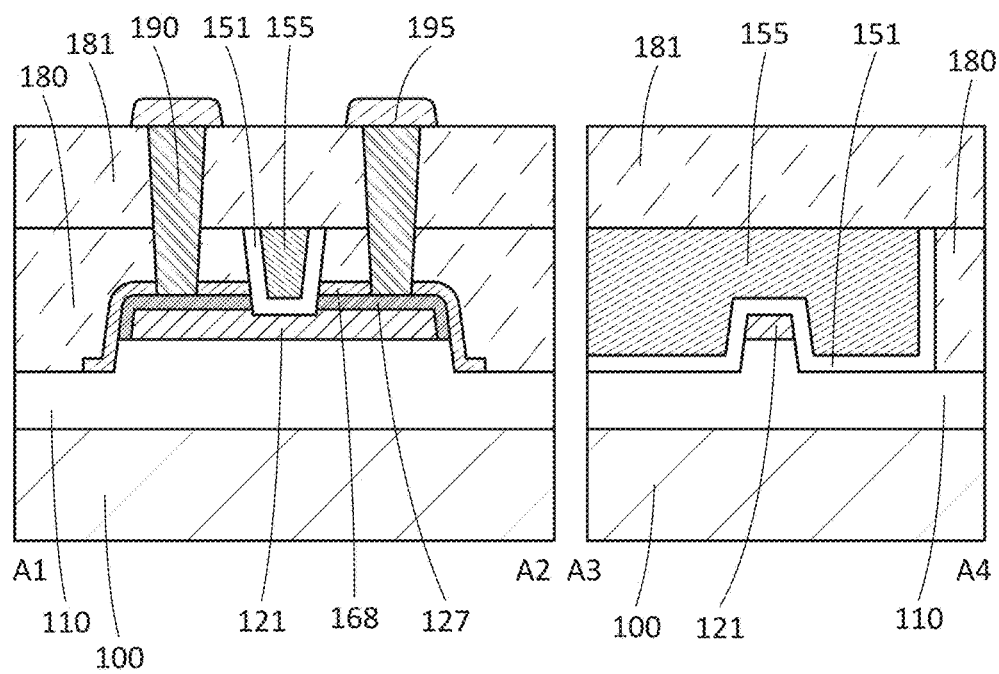

A transistor 12b illustrated in FIGS. 21A to 21C is different from the transistor 12a in including a conductive layer 168. The conductive layer 168 is formed over the mixed layer 127.

The conductive layer 168 includes at least one of aluminum, molybdenum, titanium, tantalum, tungsten, nickel, cobalt, and platinum (the element group B). The mixed layer 127 is formed by forming the conductive layer 168 over the oxide layer 121, and then performing heat treatment.

In the aforementioned transistors 10, 11, and 12, and modification examples thereof, the conductive layer 168 is removed after the formation of the mixed layer 127. Alternatively, the conductive layer 168 may remain as in the transistor 12b.

In FIGS. 21A to 21C, the conductive layer 190 is formed in an opening provided in the insulating layer 181, the insulating layer 180, and the conductive layer 168 and touches the mixed layer 127; however, one embodiment of the present invention is not limited thereto. For example, the conductive layer 190 may be formed in an opening provided in the insulating layers 181 and 180 to touch the conductive layer 168, and is not necessarily in contact with the mixed layer 127. Also in that case, the conductive layer 190 and the mixed layer 127 can be electrically connected through the conductive layer 168.

Figure 22A:
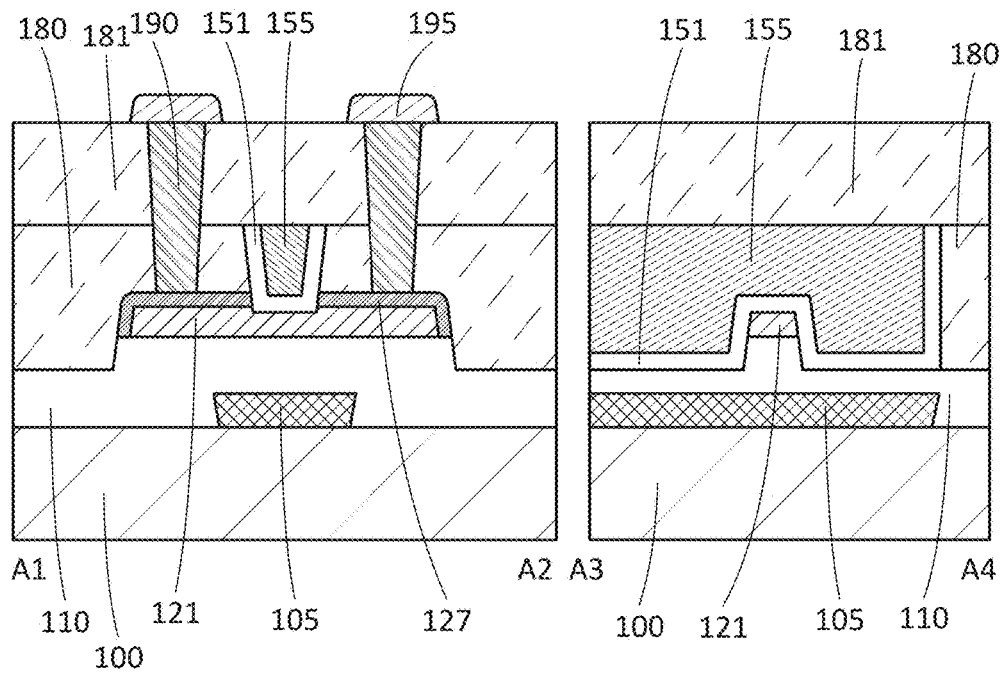
FIGS. 22A to 22C are cross-sectional views illustrating a transistor of one embodiment of the present invention.
Figure 22B:
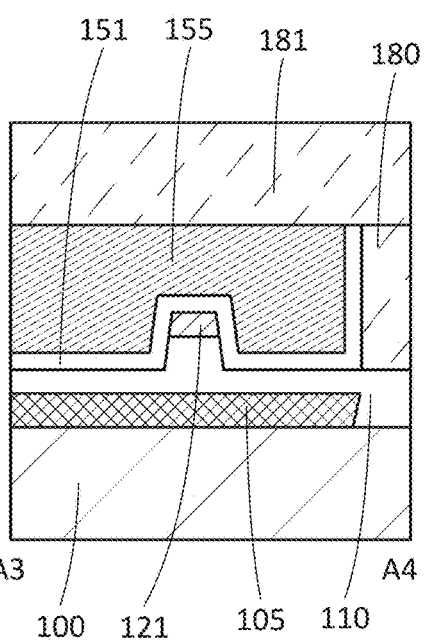
Figure 22C:
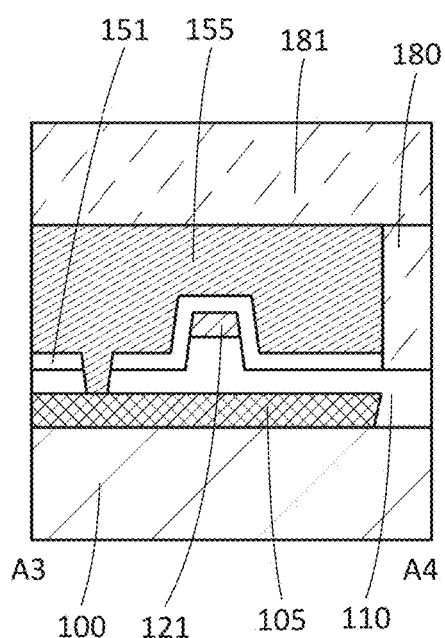

A transistor illustrated in FIGS. 22A to 22C is different from the transistor 12 in including the conductive layer 105. Note that FIG. 22A illustrates a structure of the transistor in the channel length direction and FIG. 22B illustrates a structure of the transistor in the channel width direction. FIG. 22C illustrates another example of the structure of the transistor in the channel width direction.

The conductive layer 105 can have a function similar to that of the conductive layer 155. The conductive layer 105 and the conductive layer 155 may be configured to be applied with the same potential or different potentials.

Note that the conductive layers 155 and 105 may be electrically connected to each other as illustrated in FIG. 22C.

When the conductive layer 155 is provided, the electrical characteristics (e.g., a threshold voltage) of the transistor can be controlled.

Note that this embodiment can be combined with any of the other embodiments in this specification as appropriate.

Embodiment 2

In this embodiment, manufacturing methods of a semiconductor device of one embodiment of the present invention will be described with reference to FIG. 23A to FIG. 36F. Note that what is described in the above embodiment is not repeatedly described in some cases.

<Manufacturing Method of Transistor 1>

A manufacturing method of the transistor 10 described in the above embodiment in FIGS. 1A to 1C will be described with reference to FIG. 23A to FIG. 25D. Note that FIGS. 23A, 23C, 23E, 24A, 24C, 25A, and 25C illustrate structures of the transistor in the channel length direction, and FIGS. 23B, 23D, 23F, 24B, 24D, 25B, and 25D illustrate structures of the transistor in the channel width direction.

First, the substrate 100 is prepared. Any of the aforementioned substrates can be used for the substrate 100.

Next, the insulating layer 110 is formed over the substrate 100.

The insulating layer 110 can be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the PECVD method, a high quality film can be obtained at relatively low temperatures. The TCVD method does not use plasma and thus causes less plasma damage to an object. For example, a wiring, an electrode, an element (e.g., transistor or capacitor), or the like included in a semiconductor device might be charged up by receiving electric charges from plasma. In that case, accumulated electric charges might break the wiring, electrode, element, or the like included in the semiconductor device. Such plasma damage is not caused in the TCVD method, and thus the yield of a semiconductor device can be increased. In addition, since plasma damage does not occur in the deposition by the TCVD method, a film with few defects can be obtained.

The ALD method also causes less plasma damage to an object. Thus, a film with few defects can be obtained by the ALD method.

Unlike in a deposition method in which particles ejected from a target or the like are deposited, in the CVD method and the ALD method, a film is formed by reaction at a surface of an object. Thus, the CVD method and the ALD method enable favorable step coverage almost regardless of the shape of an object. In particular, the ALD method enables excellent step coverage and excellent thickness uniformity and can be favorably used for covering a surface of an opening with a high aspect ratio, for example. For that reason, a formed film is less likely to have a pinhole or the like. Note that the ALD method has a relatively low deposition rate; thus, it is sometimes preferable to combine the ALD method with another deposition method with a high deposition rate such as the CVD method.

When the CVD method or the ALD method is used, the composition of a film to be formed can be controlled with the flow rate ratio of source gases. For example, by the CVD method or the ALD method, a film with a desired composition can be formed by adjusting the flow rate ratio of the source gases. Moreover, with the CVD method or the ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, the time taken for the deposition can be reduced because the time taken for transfer and pressure adjustment is omitted. Thus, semiconductor devices can be manufactured with improved productivity.

In a conventional deposition apparatus utilizing a CVD method, one or a plurality of source gases for reaction are simultaneously supplied to a chamber at the time of deposition. In a deposition apparatus utilizing an ALD method, a source gas (also called precursor) for reaction and a gas serving as a reactant are alternately introduced into a chamber, and then the gas introduction is repeated. Note that the gases to be introduced can be switched using the respective switching valves (also referred to as high-speed valves).

For example, deposition is performed in the following manner. First, precursors are introduced into a chamber and adsorbed onto a substrate surface (first step). Here, the precursors are adsorbed onto the substrate surface, whereby a self-limiting mechanism of surface chemical reaction works and no more precursors are adsorbed onto a layer of the precursors over the substrate. Note that the proper range of substrate temperatures at which the self-limiting mechanism of surface chemical reaction works is also referred to as an ALD window. The ALD window depends on the temperature characteristics, vapor pressure, decomposition temperature, and the like of a precursor. Next, an inert gas (e.g., argon or nitrogen) or the like is introduced into the chamber, so that excessive precursors, a reaction product, and the like are released from the chamber (second step). Instead of introduction of an inert gas, vacuum evacuation can be performed to release excessive precursors, a reaction product, and the like from the chamber. Then, a reactant (e.g., an oxidizer such as $H_2O$ or $O_3$) is introduced into the chamber to react with the precursors adsorbed onto the substrate surface, whereby part of the precursors is removed while the molecules of the film are adsorbed onto the substrate (third step). After that, introduction of an inert gas or vacuum evacuation is performed, whereby excessive reactant, a reaction product, and the like are released from the chamber (fourth step).

A first single layer can be formed on the substrate surface in the above manner. By performing the first to fourth steps again, a second single layer can be stacked over the first single layer. With the introduction of gases controlled, the first to fourth steps are repeated plural times until a film having a desired thickness is obtained, whereby a thin film with excellent step coverage can be formed. The thickness of the thin film can be adjusted by the number of repetition times; therefore, an ALD method makes it possible to adjust a thickness accurately and thus is suitable for manufacturing a minute transistor.

In an ALD method, a film is formed through reaction of the precursor using thermal energy. An ALD method in which the reactant becomes a radical state with the use of plasma in the above-described reaction of the reactant is sometimes called a plasma ALD method. An ALD method in which reaction between the precursor and the reactant is performed using thermal energy is sometimes called a thermal ALD method.

With the ALD method, an extremely thin film can be formed to have a uniform thickness. In addition, the coverage of an uneven surface with the film is high.

When the plasma ALD method is employed, the film can be formed at a lower temperature than when the thermal ALD method is employed. With the plasma ALD method, for example, the film can be formed without decreasing the deposition rate even at 100° C. or lower. Furthermore, in the plasma ALD method, any of a variety of reactants, including a nitrogen gas, can be used without being limited to an oxidizer; therefore, it is possible to form various kinds of films of not only an oxide but also a nitride, a fluoride, a metal, and the like.

In the case where the plasma ALD method is employed, as in an inductively coupled plasma (ICP) method or the like, plasma can be generated apart from a substrate. When plasma is generated in this manner, plasma damage can be minimized.

The top or bottom surface of the oxide layer 121 to be formed later preferably has high planarity. Thus, to improve the planarity, the top surface of the insulating layer 110 may be subjected to planarization treatment such as CMP.

Figure 23A:
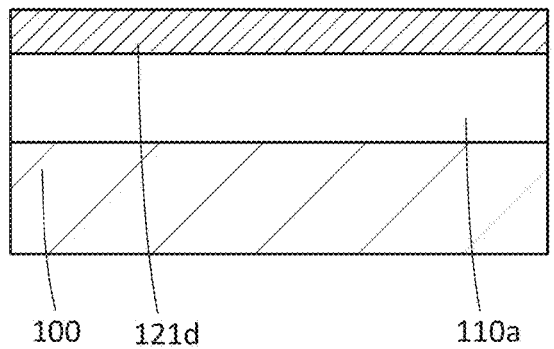
FIGS. 23A to 23F are cross-sectional views illustrating a method for manufacturing a transistor of one embodiment of the present invention.
Figure 23B:
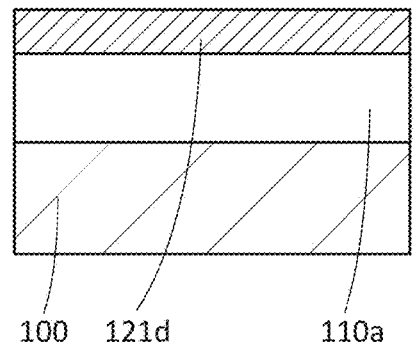
Figure 23C:
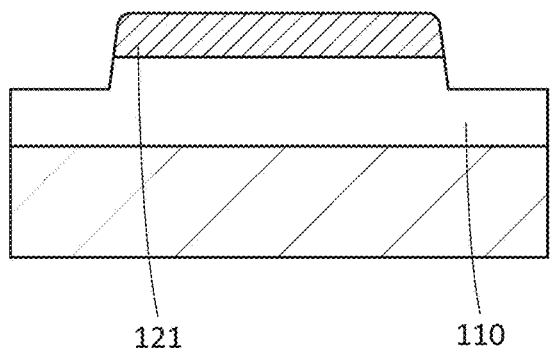
Figure 23D:
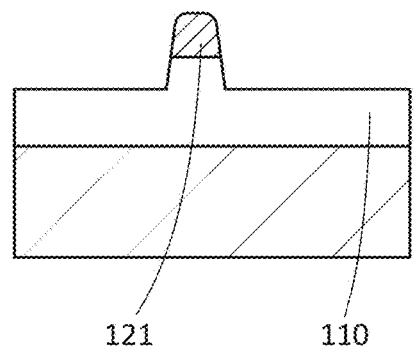

Next, an oxide layer 121$d$ is formed as illustrated in FIGS. 23A and 23B. For the oxide layer 121$d$, any of the above described oxide layers can be used. The oxide layer 121$d$ can be formed by a sputtering method, a CVD method, an MBE method, a PLD method, an ALD method, or the like.

Then, a resist or the like is formed over the oxide layer 121$d$. The oxide layer 121$d$ is processed with use of the resist or the like, whereby the oxide layer 121 is formed (see FIGS. 23C and 23D). Note that an exposed surface of the insulating layer 110 is sometimes removed when the oxide layer 121 is formed.

Here, heat treatment (first heat treatment) is preferably performed. The heat treatment is performed in an oxygen-containing atmosphere at a temperature higher than or equal to 200° C. and lower than or equal to 400° C. This heat treatment results in a reduction in oxygen vacancies formed in the oxide layer 121.

Figure 23E:
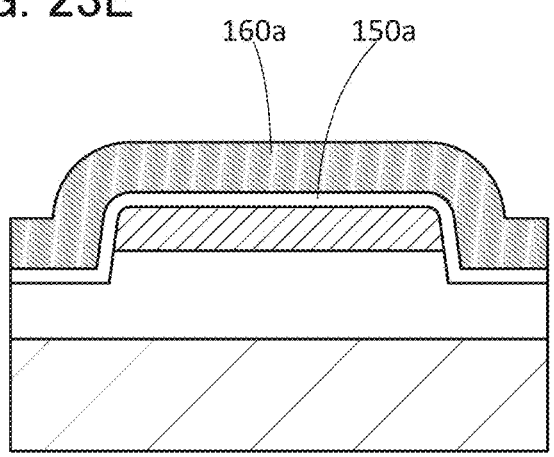
Figure 23F:
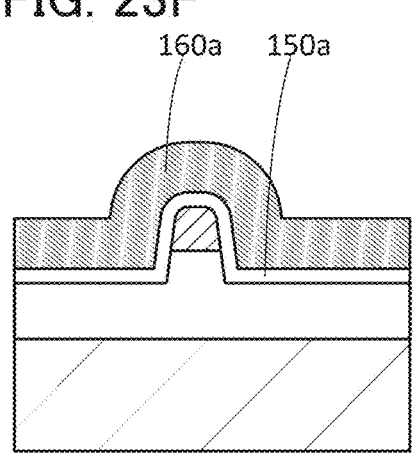

Next, an insulating layer 150$a$ and a sacrificial layer 160$a$ are formed as illustrated in FIGS. 23E and 23F.

For the insulating layer 150$a$, any of the above described insulating layers can be used. The insulating layer 150$a$ can be formed by a sputtering method, a CVD method, an MBE method, a PLD method, an ALD method, or the like.

In the case where an oxide is used for the sacrificial layer 160$a$, the sacrificial layer 160$a$ can be formed in a manner similar to that of the aforementioned oxide layer 121$d$. In the case where silicon, silicon oxide, silicon nitride, or the like is used for the sacrificial layer 160$a$, the sacrificial layer 160$a$ can be formed by a sputtering method, a CVD method, an MBE method, a PLD method, an ALD method, or the like.

Then, a resist or the like is formed over the sacrificial layer 160$a$. The insulating layer 150$a$ and the sacrificial layer 160$a$ are processed with use of the resist or the like, whereby the insulating layer 150 and the sacrificial layer 160 are formed (see FIGS. 24A and 24B). Here, after the insulating layer 150 and the sacrificial layer 160 are formed so that end portions of side surfaces in the channel length direction are substantially aligned, only the sacrificial layer 160 may be selectively etched by wet etching or the like using the same mask. When the etching is performed in this manner, the length of the sacrificial layer 160 in the channel length direction can be smaller than the length of the insulating layer 150 in the channel length direction.

Here, second heat treatment is preferably performed. The second heat treatment may be performed in a manner similar to that of the first heat treatment. The second heat treatment results in a reduction in oxygen vacancies formed in the oxide layer 121.

Figure 24A:
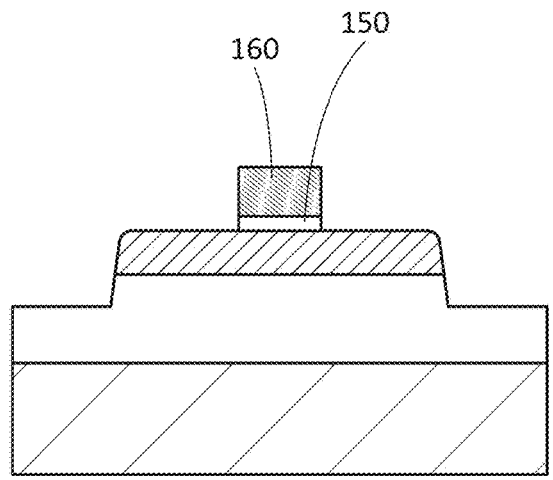
FIGS. 24A to 24D are cross-sectional views illustrating a method for manufacturing a transistor of one embodiment of the present invention.
Figure 24B:
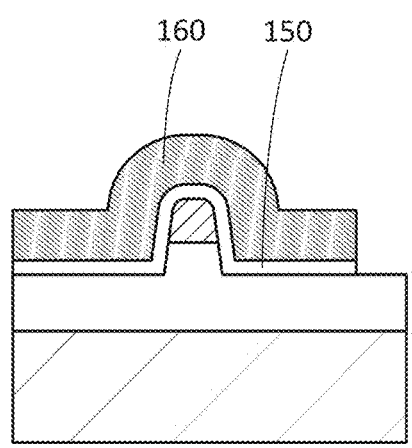
Figure 24C:
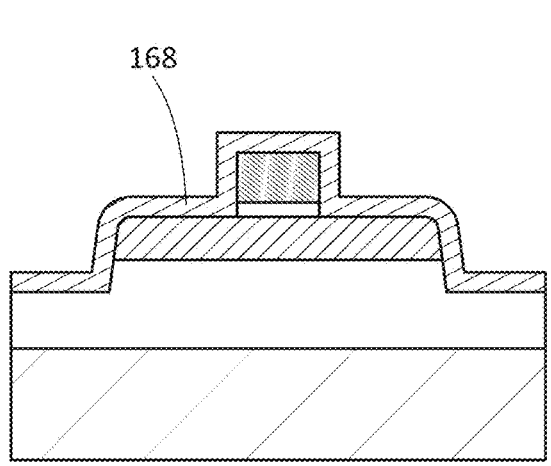
Figure 24D:
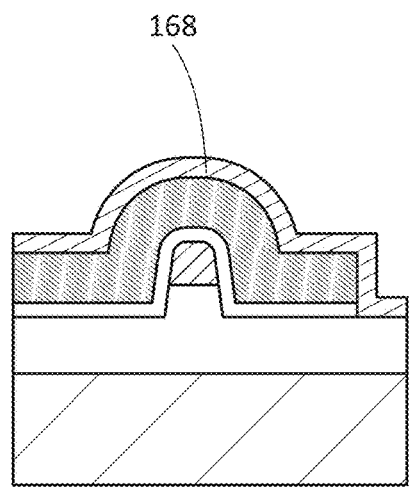

Next, the conductive layer 168 is formed (see FIGS. 24C and 24D). As well as a metal material such as titanium (Ti), molybdenum (Mo), tungsten (W), chromium (Cr), vanadium (V), niobium (Nb), tantalum (Ta), zirconium (Zr), or hafnium (Hf), a nitride film of such a metal material can be used for the conductive layer 168. The conductive layer 168 can be formed by a sputtering method, a CVD method, an MBE method, a PLD method, an ALD method, or the like.

After the conductive layer 168 is formed, third heat treatment is preferably performed. The third heat treatment may be performed in, for example, an oxygen-containing atmosphere. The third heat treatment allows a metal atom contained in the conductive layer 168 to diffuse into the oxide layer 121 and the sacrificial layer 160. As a result, the mixed layer 127 can be formed in a region of the oxide layer 121 that is in contact with the conductive layer 168, and the mixed layer 162 can be formed in a region of the sacrificial layer 160 that is in contact with the conductive layer 168 (see FIGS. 25A and 25B).

In the mixed layer 127, an alloy is sometimes made of the oxide layer 121 and the metal atom contained in the conductive layer 168. In the mixed layer 162, an alloy is sometimes made of the sacrificial layer 160 and the metal atom contained in the conductive layer 168.

Note that the mixed layers 127 and 162 expand to reach the conductive layer 168 in some cases.

Figure 25A:
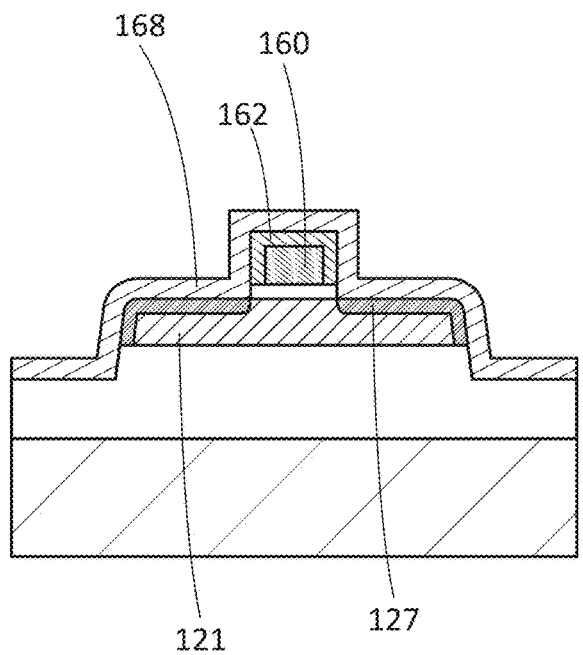
FIGS. 25A to 25D are cross-sectional views illustrating a method for manufacturing a transistor of one embodiment of the present invention.
Figure 25B:
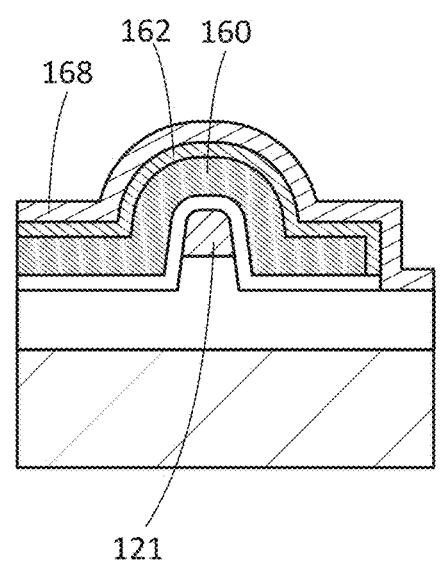
Figure 25C:
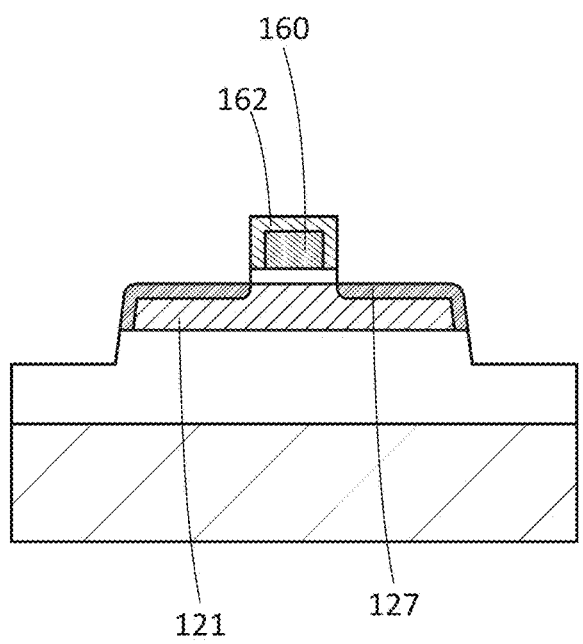
Figure 25D:
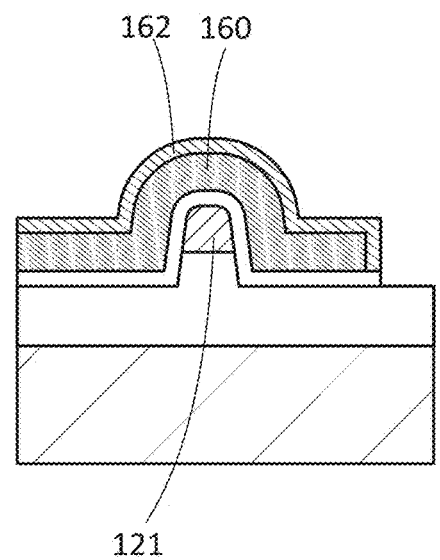

After the formation of the mixed layers 127 and 162, the conductive layer 168 is removed by wet etching or dry etching (see FIGS. 25C and 25D). For example, the conductive layer 168 can be removed by a hydrogen peroxide solution, a mixture of a hydrogen peroxide solution and sulfuric acid, or a mixture of a hydrogen peroxide solution and ammonium water.

Here, fourth heat treatment is preferably performed. The fourth heat treatment may be performed in a manner similar to that of the first heat treatment. The fourth heat treatment results in a reduction in oxygen vacancies formed in the oxide layer 121.

In the above manner, the mixed layer 127 having a smaller resistance value than the oxide layer 121 can be formed. In addition, the mixed layer 162 having a smaller resistance value than the sacrificial layer 160 can be formed.

After that, the insulating layer 180, the conductive layer 190, and the conductive layer 195 are formed (not illustrated).

An insulating layer to be the insulating layer 180 is formed in a manner similar to that of the insulating layer 110. After the formation, the insulating layer is preferably subjected to planarization treatment.

Next, the insulating layer is etched by dry etching to form an opening therein.

Subsequently, a conductive layer to be the conductive layer 190 is formed in the opening, and then planarization treatment is performed, whereby the conductive layer 190 is formed.

Next, a conductive layer to be the conductive layer 195 is formed over the conductive layer 190. To form the conductive layer 195, the conductive layer is processed by a photolithography method, a nanoimprinting method, or the like.

The transistor 10 can be manufactured by the above manufacturing method (see FIGS. 1A to 1C). With the above manufacturing method, an extremely miniaturized transistor whose channel length is less than or equal to 100 nm, less than or equal to 30 nm, or less than or equal to 20 nm can be manufactured.

<Manufacturing Method of Transistor 2>

A manufacturing method of the transistor 11 described in the above embodiment in FIGS. 2A to 2C will be described with reference to FIG. 26A to FIG. 28D. Note that FIGS. 26A, 26C, 27A, 27C, 27E, 28A, and 28C illustrate structures of the transistor in the channel length direction, and FIGS. 26B, 26D, 27B, 27D, 27F, 28B, and 28D illustrate structures of the transistor in the channel width direction.

First, with a method similar to the above manufacturing method of the transistor 10, the insulating layer 110, the oxide layer 121, the mixed layer 127, the insulating layer 150, the sacrificial layer 160, and the mixed layer 162 are formed over the substrate 100 (see FIGS. 26A and 26B).

Then, as illustrated in FIGS. 26C and 26D, an insulating layer 180a is formed. The insulating layer 180a can be formed in a manner similar to that for forming an insulating layer to be the insulating layer 180 in the transistor 10.

Figure 27A:
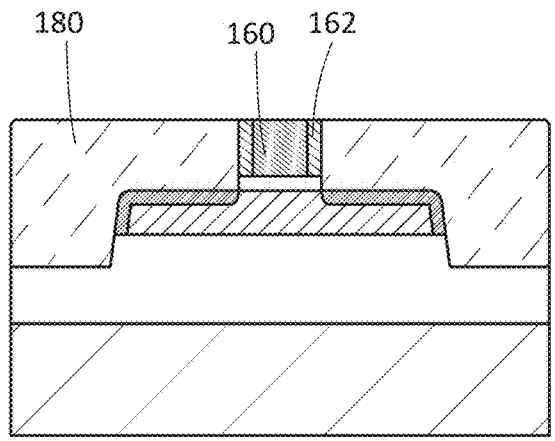
FIGS. 27A to 27F are cross-sectional views illustrating a method for manufacturing a transistor of one embodiment of the present invention.
Figure 27B:
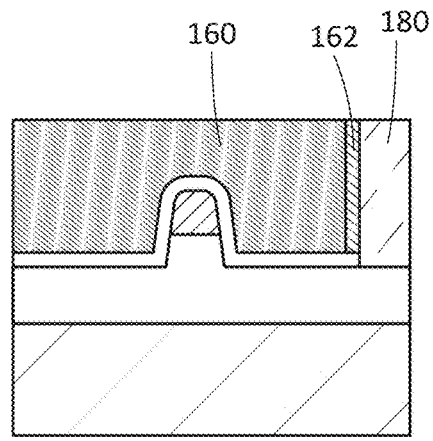

Next, as illustrated in FIGS. 27A and 27B, part of the insulating layer 180a and part of the mixed layer 162 are removed to expose a top surface of the sacrificial layer 160. At this time, the sacrificial layer 160 may be partly removed. This process can be performed by CMP or etching.

Figure 27C:
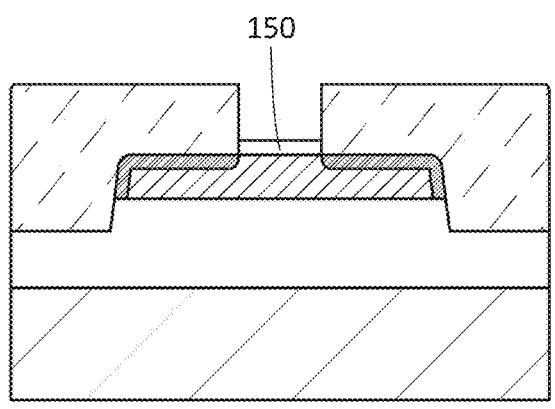
Figure 27D:
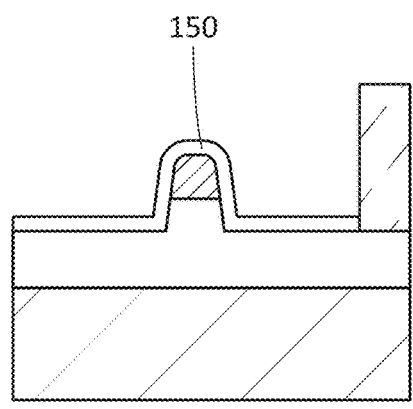

Next, as illustrated in FIGS. 27C and 27D, the sacrificial layer 160 and the mixed layer 162 are removed by etching to expose the insulating layer 150.

Figure 27E:
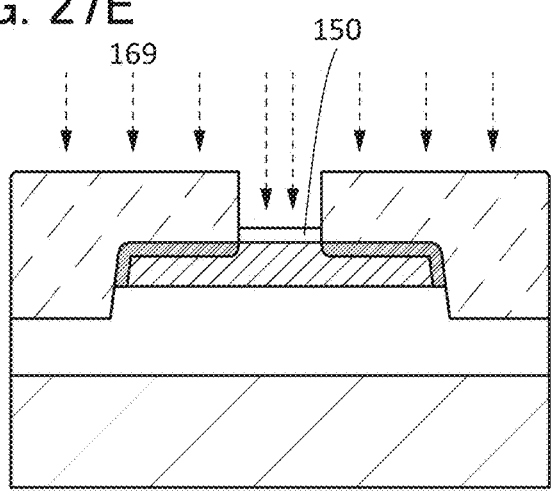
Figure 27F:
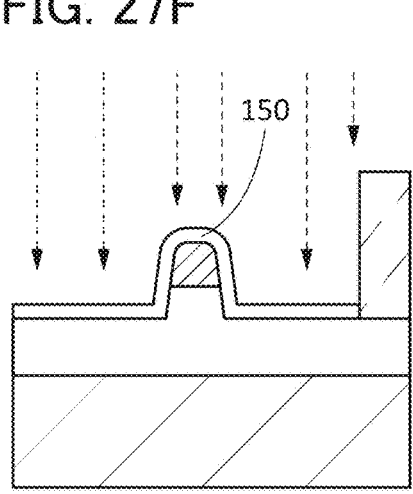

After that, as illustrated in FIGS. 27E and 27F, oxygen 169 is added by heat treatment, ion implantation, high-density plasma treatment, or the like. The addition of oxygen results in a reduction in oxygen vacancies formed in the channel region of the oxide layer 121.

The heat treatment is preferably performed in an oxygen-containing atmosphere or an air atmosphere at a temperature higher than or equal to 400° C. In the case where the heat treatment is performed after a conductive layer containing a metal such as aluminum, tungsten, or copper is formed over the substrate, the conductive layer might have a problem such as a hillock, migration, oxidation, or diffusion. In this manufacturing method, however, the conductive layer is formed after the heat treatment, which suppresses the occurrence of the problem.

High-density plasma may be generated using microwaves. For the high-density plasma treatment, for example, an oxidation gas such as oxygen or nitrous oxide may be used. Alternatively, a mixed gas of an oxidation gas and a rare gas such as He, Ar, Kr, or Xe may be used. In the high-density plasma treatment, a bias may be applied to the substrate. This allows oxygen ions and the like in the plasma to be extracted to the substrate side. The high-density plasma treatment may be performed while the substrate is being heated. For example, in the case where the high-density plasma treatment is performed instead of the heat treatment, the similar effect can be obtained at a temperature lower than the heat treatment temperature.

Figure 28A:
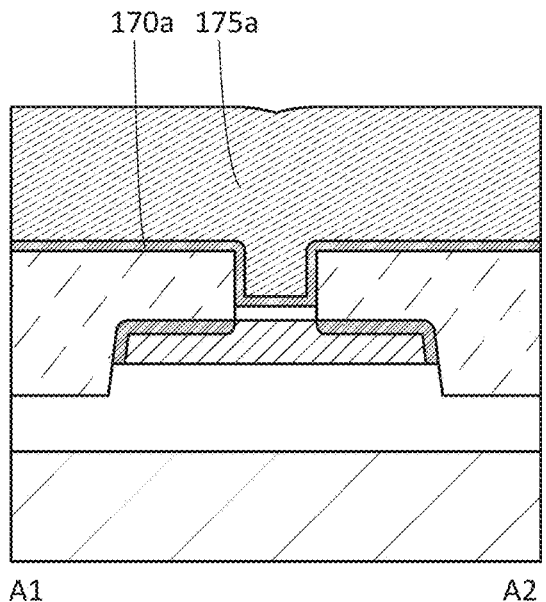
FIGS. 28A to 28D are cross-sectional views illustrating a method for manufacturing a transistor of one embodiment of the present invention.
Figure 28B:
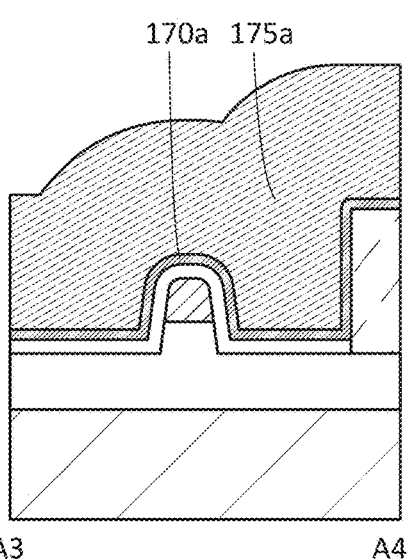

Then, as illustrated in FIGS. 28A and 28B, a conductive layer 170a and a conductive layer 175a are formed. The conductive layer can be formed by a sputtering method, a CVD method, an MBE method, a PLD method, an ALD method, or the like.

Figure 28C:
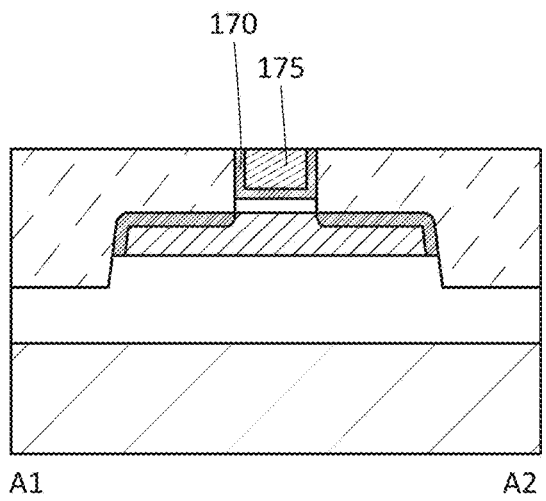
Figure 28D:
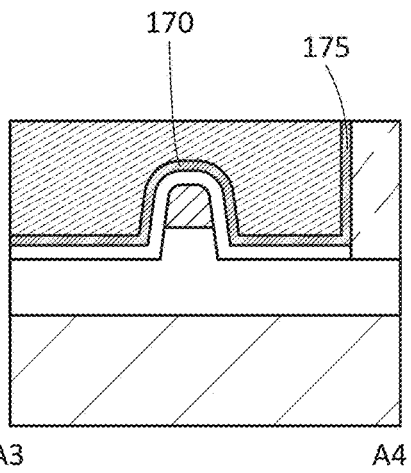

Next, CMP treatment is performed to form the conductive layers 170 and 175 (see FIGS. 28C and 28D).

With the above manufacturing method, the sacrificial layer 160 and the mixed layer 162 can be removed and the conductive layers 170 and 175 having a smaller resistance value than the sacrificial layer 160 and the mixed layer 162 can be formed.

Then, an insulating layer to be the insulating layer 181 is formed in a manner similar to that for forming the insulating layer 110. The insulating layer is preferably planarized after the formation.

After that, the conductive layers 190 and 195 are formed with a method similar to the manufacturing method of the transistor 10, so that the transistor 11 can be formed (see FIGS. 2A to 2C).

<Manufacturing Method of Transistor 3>

A manufacturing method of the transistor 12 described in the above embodiment in FIGS. 3A to 3C will be described with reference to FIG. 29A to FIG. 31D. Note that FIGS. 29A, 29C, 29E, 30A, 30C, 30E, 31A, and 31C illustrate structures of the transistor in the channel length direction, and FIGS. 29B, 29D, 29F, 30B, 30D, 30F, 31B, and 31D illustrate structures of the transistor in the channel width direction. Note that the same method as the aforementioned manufacturing methods of the other transistors is not repeatedly described in some cases.

Figure 29A:
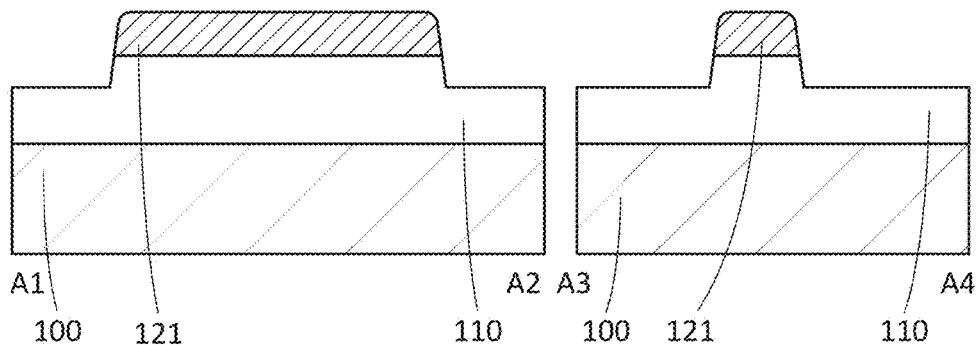
FIGS. 29A to 29F are cross-sectional views illustrating a method for manufacturing a transistor of one embodiment of the present invention.
Figure 29B:
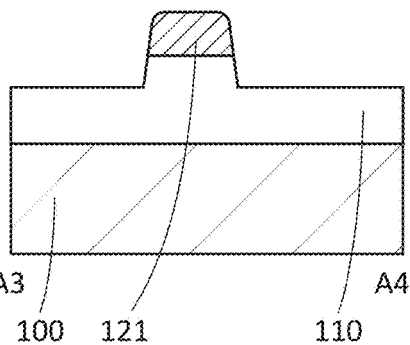

First, with a method similar to the above manufacturing method of the transistor 10, the insulating layer 110 and the oxide layer 121 are formed over the substrate 100 (see FIGS. 29A and 29B).

Figure 29C:
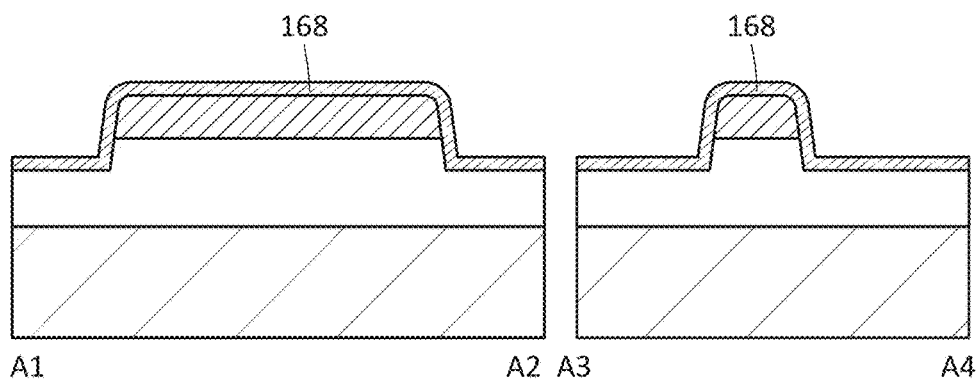
Figure 29D:
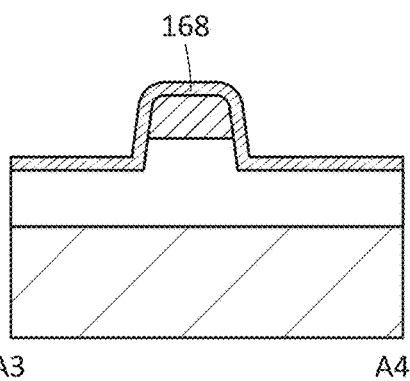

Then, as illustrated in FIGS. 29C and 29D, the conductive layer 168 is formed.

Figure 29E:
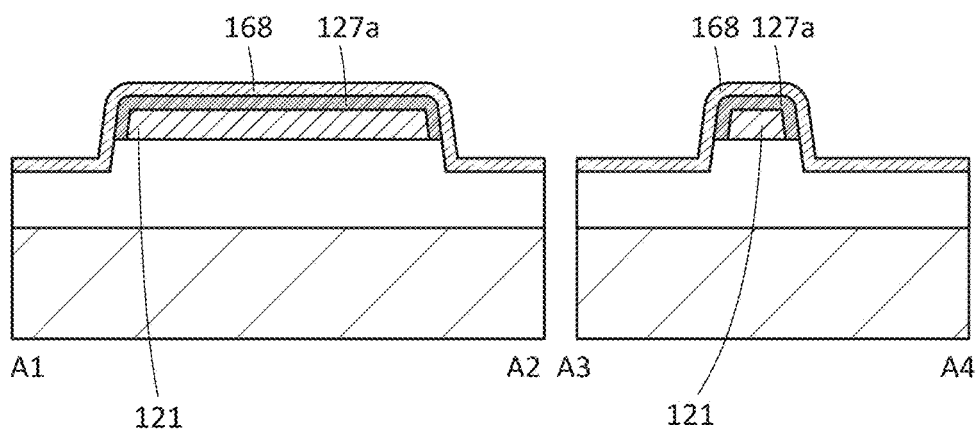
Figure 29F:
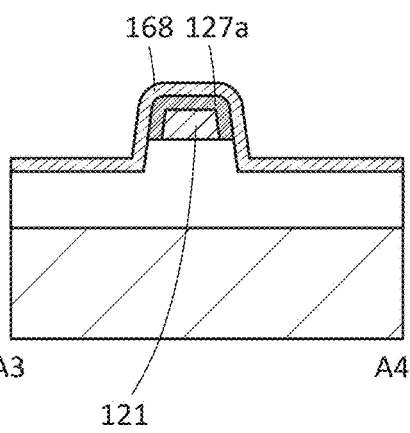

Next, heat treatment is performed, whereby metal atoms included in the conductive layer 168 are diffused into the oxide layer 121 and the mixed layer 127a is formed in a region of the oxide layer 121 that is in contact with the conductive layer 168 (see FIGS. 29E and 29F).

Figure 30A:
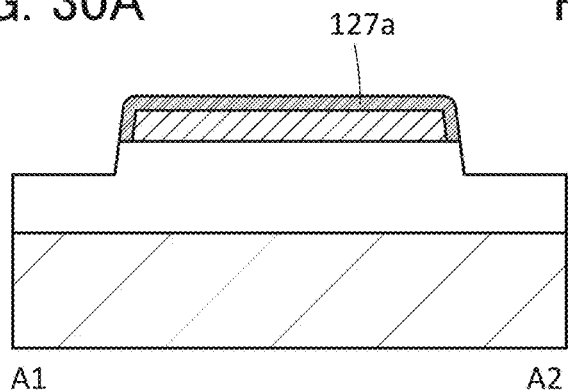
FIGS. 30A to 30F are cross-sectional views illustrating a method for manufacturing a transistor of one embodiment of the present invention.
Figure 30B:
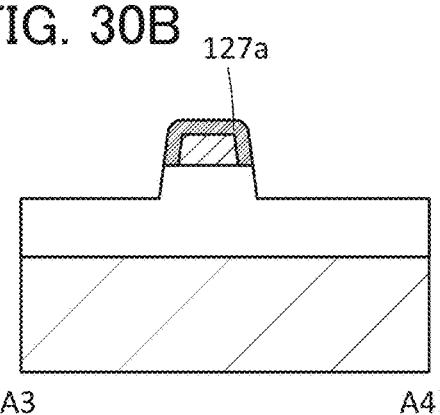

After the formation of the mixed layer 127a, the conductive layer 168 is removed (see FIGS. 30A and 30B).

Figure 30C:
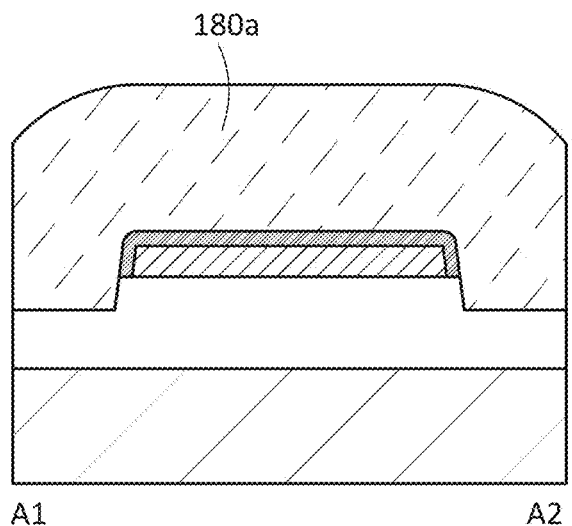
Figure 30D:
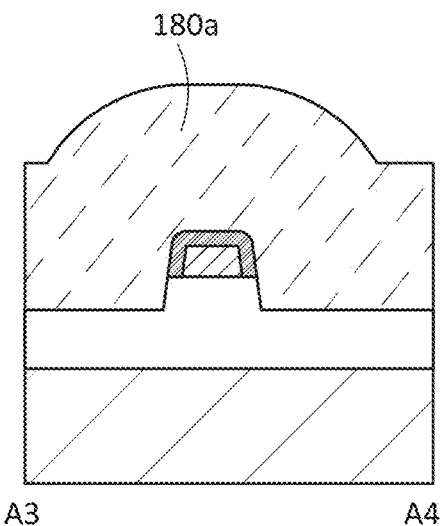

Then, the insulating layer 180a is formed (see FIGS. 30C and 30D).

Figure 30E:
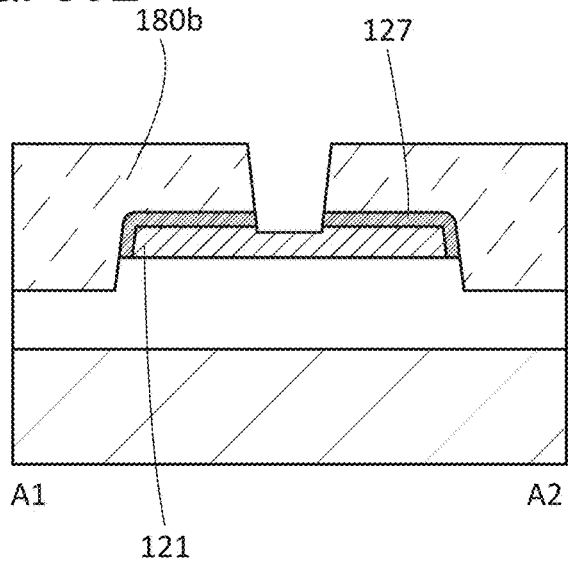
Figure 30F:
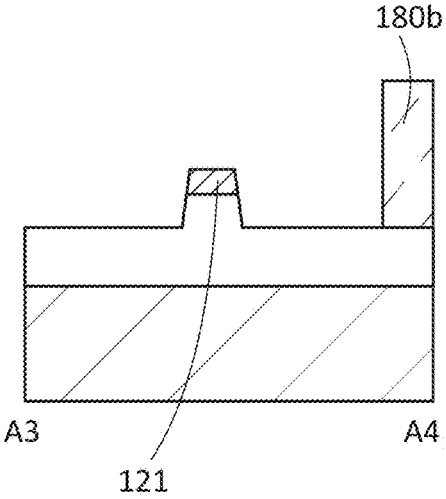

After the planarization of the insulating layer 180a, a resist or the like is formed over the insulating layer 180a. With use of the resist or the like, the insulating layer 180a is processed to form an insulating layer 180b and the mixed layer 127a is processed to form the mixed layer 127. This process allows the top surface of the oxide layer 121 to be partly exposed. Note that as illustrated in FIGS. 30E and 30F, the exposed surface of the oxide layer 121 is sometimes removed when the mixed layer 127 is formed.

After the top surface of the oxide layer 121 is partly exposed, oxygen may be added by ion implantation, ion doping, plasma treatment, or the like.

Figure 31A:
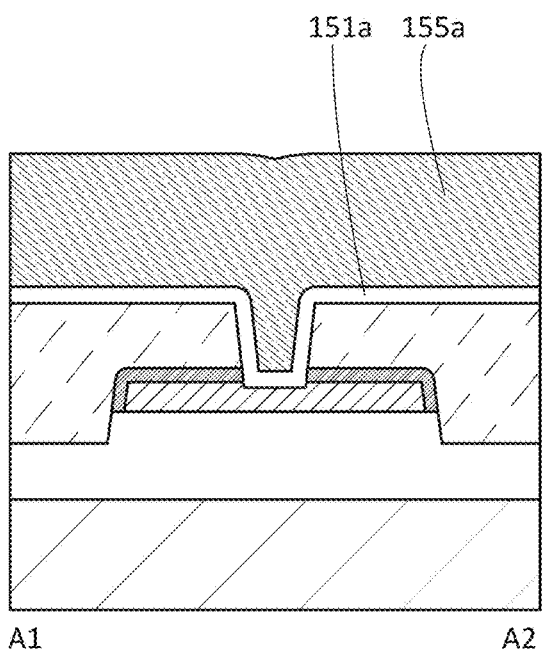
FIGS. 31A to 31D are cross-sectional views illustrating a method for manufacturing a transistor of one embodiment of the present invention.
Figure 31B:
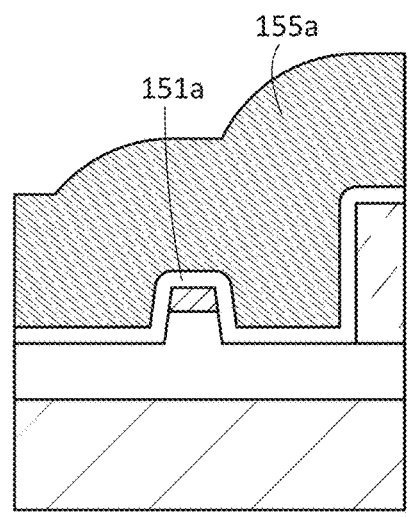

Then, as illustrated in FIGS. 31A and 31B, an insulating layer 151a and a conductive layer 155a are formed.

Figure 31C:
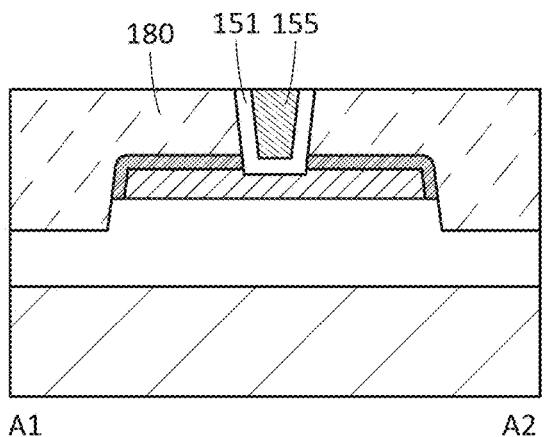
Figure 31D:
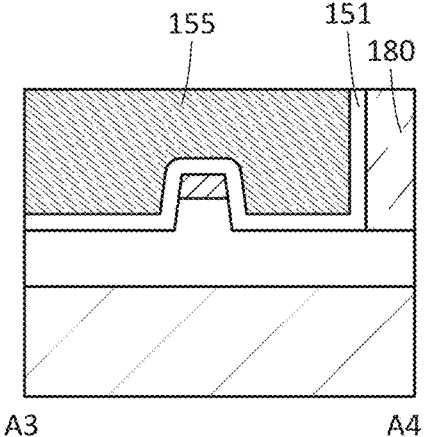

Next, CMP treatment is performed to form the insulating layer 180, the insulating layer 151, and the conductive layer 155 (see FIGS. 31C and 31D).

After that, the conductive layers 190 and 195 are formed with a method similar to the manufacturing methods of the transistors 10 and 11, so that the transistor 12 can be formed (see FIGS. 3A to 3C).

Note that in the above manufacturing method of the transistor, the conductive layer 168 is not necessarily removed after the formation of the mixed layer 127a. With the conductive layer 168 left, the transistor 12b illustrated in FIGS. 21A to 21C can be manufactured.

<Modification Example of Manufacturing Method of Transistor>

A modification example of the manufacturing method of the transistor will be described with reference to FIG. 32A to FIG. 36F. Note that FIGS. 32A, 32C, 33A, 33C, 33E, 34A, 34C, 35A, 35C, 36A, 36C, and 36E illustrate structures of the transistor in the channel length direction, and FIGS. 32B, 32D, 33B, 33D, 33F, 34B, 34D, 35B, 35D, 36B, 36D, and 36F illustrate structures of the transistor in the channel width direction. Note that the same method as the aforementioned manufacturing methods of the transistors 10, 11, and 12 is not repeatedly described in some cases.

<<Manufacturing Method of Transistor Including Insulating layer 176>>

A method for forming the transistor 10a, which includes the insulating layer 176 in contact with the side surfaces of the insulating layer 150 and the sacrificial layer 160 will be described with reference to FIG. 32A to FIG. 33F.

First, an insulating layer 176a is formed over the substrate 100 over which the insulating layer 110, the oxide layer 121, the insulating layer 150, and the sacrificial layer 160 have been formed (see FIGS. 32A and 32B).

Then, the insulating layer 176a is subjected to dry etching, whereby the insulating layer 176 can be formed (see FIGS. 32C and 32D).

It is more preferable to perform heat treatment after the etching treatment. The heat treatment is performed in an oxygen-containing atmosphere or an air atmosphere at a temperature higher than or equal to 200° C. and lower than or equal to 400° C. This heat treatment results in a reduction in oxygen vacancies formed in the oxide layer 121.

With the above manufacturing method, the insulating layer 176 in contact with the side surfaces of the insulating layer 150 and the sacrificial layer 160 can be formed. After that, the mixed layers 127 and 162 are formed in a manner similar to that illustrated in FIGS. 24C and 24D and FIGS. 25A to 25D, and the conductive layers 190 and 195 are formed with reference to FIGS. 6A to 6C, so that the transistor 10a can be manufactured.

After the mixed layers 127 and 162 are formed, the insulating layer 180a is formed in a manner similar to that described with reference to FIGS. 26C and 26D. Then, part of the insulating layer 180a and the insulating layer 176, and the mixed layer 162 are removed, so that the insulating layer 180 is formed and the top surface of the sacrificial layer 160 is exposed (see FIGS. 33A and 33B).

Figure 33A:
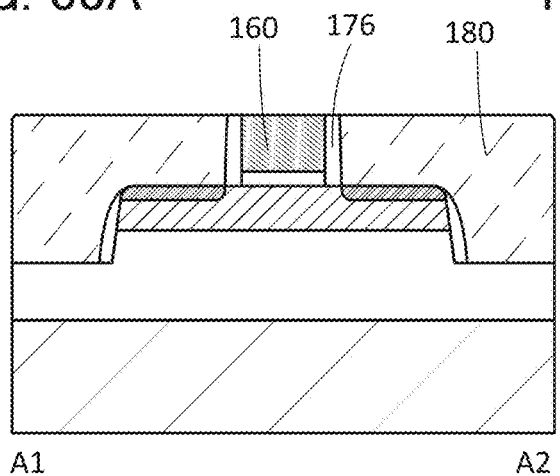
FIGS. 33A to 33F are cross-sectional views illustrating a method for manufacturing a transistor of one embodiment of the present invention.
Figure 33B:
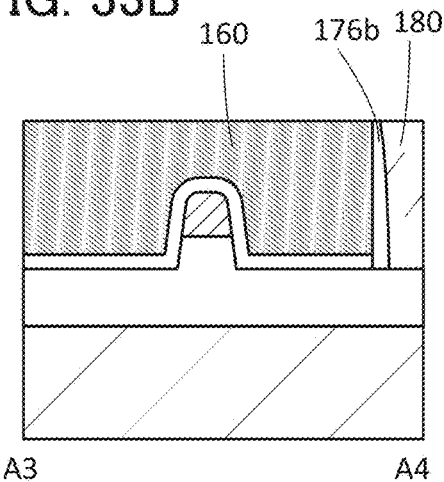
Figure 33C:
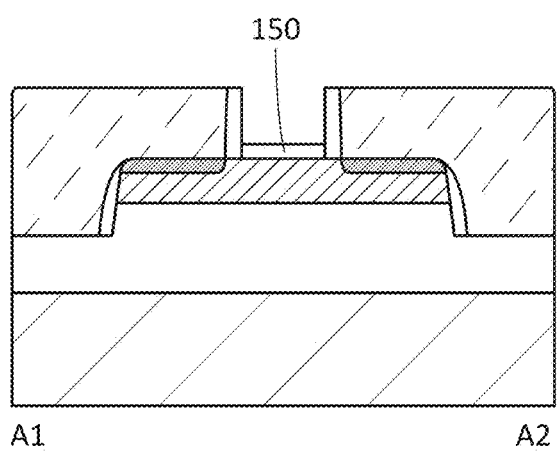
Figure 33D:
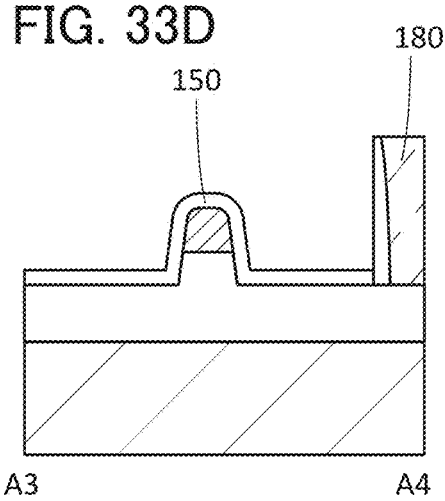

Next, as illustrated in FIGS. 33C and 33D, the sacrificial layer 160 is removed by etching to expose the insulating layer 150.

Figure 33E:
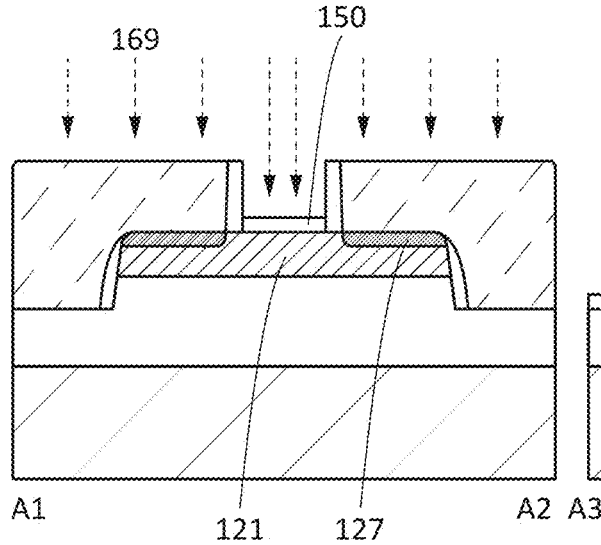
Figure 33F:
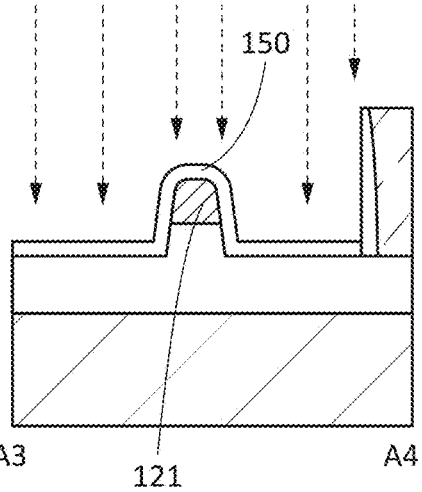

After that, as illustrated in FIGS. 33E and 33F, the oxygen 169 is added by heat treatment, ion implantation, high-density plasma treatment, or the like. The addition of oxygen results in a reduction in oxygen vacancies formed in the channel region of the oxide layer 121.

The insulating layer 176 contributes to adjusting the width of a region to which the oxygen 169 is added. This prevents the diffusion of the oxygen 169 into the mixed layer 127 and a decrease in the conductivity of the mixed layer 127.

After that, the mixed layer 127 and the conductive layers 170 and 175 are formed in a manner similar to that illustrated in FIGS. 28A to 28D, and the conductive layers 190 and 195 are formed with reference to FIGS. 16A to 16C, so that the transistor 10a can be manufactured (see FIGS. 6A to 6C).

<<Forming Method of Low-Resistance Region 125>>

A method for forming the low-resistance region 125 in the oxide layer 121 will be described with reference to FIGS. 34A to 34D. For example, the low-resistance region 125 can be formed with this method when the transistor 10b illustrated in FIGS. 7A to 7C and the transistor 11b illustrated in FIGS. 17A to 17C are manufactured.

Figure 34A:
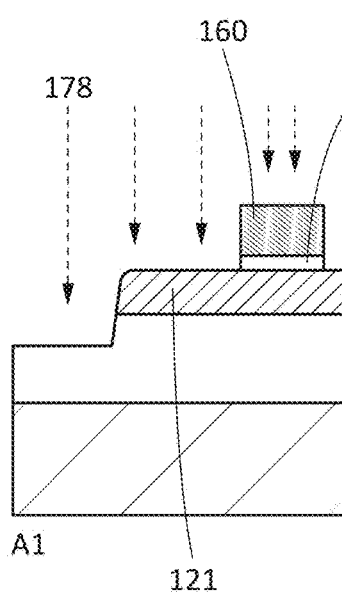
FIGS. 34A to 34D are cross-sectional views illustrating a method for manufacturing a transistor of one embodiment of the present invention.
Figure 34B:
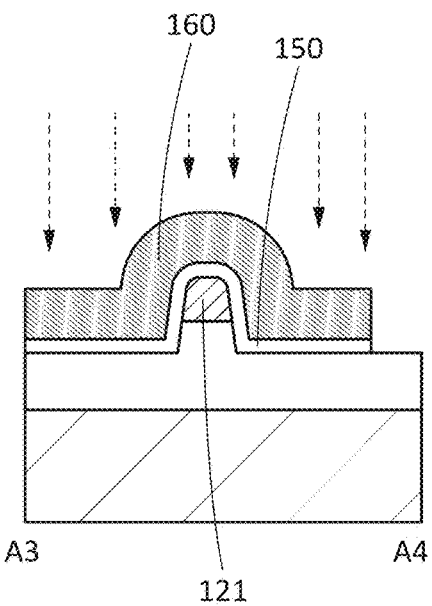

As illustrated in FIGS. 34A and 34B, ions 178 are added to the oxide layer 121 with the sacrificial layer 160 and the insulating layer 150 used as a mask. As a material to be added, hydrogen (H), fluorine (F), boron (B), phosphorus (P), helium (He), neon (Ne), argon (Ar), krypton (Kr), xenon (Xe), tungsten (W), aluminum (Al), molybdenum (Mo), indium (In), or the like can be used. The ions can be added by an ion doping method, an ion implantation method, a plasma immersion ion implantation method, high-density plasma treatment, or the like. Note that an ion implantation method is preferable for miniaturization because the addition of impurities other than predetermined ions can be suppressed. An ion doping method or a plasma immersion ion implantation method are effective for processing a large area.

In the addition treatment of the ions 178, the acceleration voltage is preferably adjusted in accordance with the ion species and the implantation depth, and can be higher than or equal to 1 kV and lower than or equal to 100 kV, or higher than or equal to 3 kV and lower than or equal to 60 kV, for example. The dose of the ions is preferably greater than or equal to 1×10$^{12}$ ions/cm$^2$ and less than or equal to 1×10$^{17}$ ions/cm$^2$, and preferably greater than or equal to 1×10$^{13}$ ions/cm$^2$ and less than or equal to 5×10$^{16}$ ions/cm$^2$.

Figure 34C:
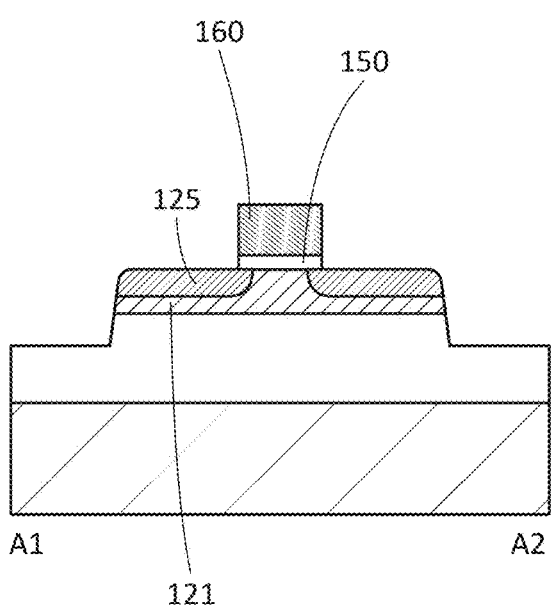
Figure 34D:
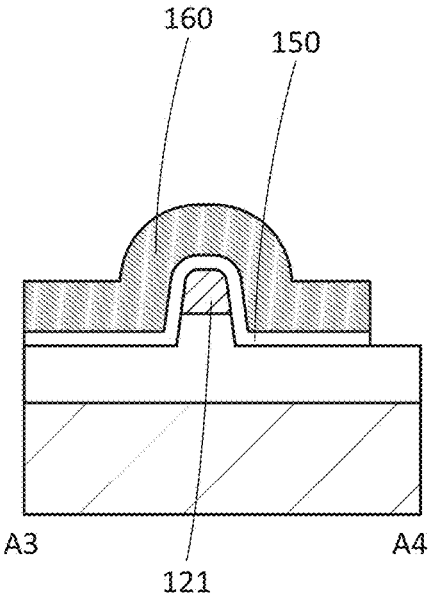

By the ion addition treatment, oxygen vacancies are formed in the oxide layer 121, so that the low-resistance region 125 is formed (see FIGS. 34C and 34D).

By performing heat treatment after the ion addition treatment, damage caused to the oxide layer 121 during the ion addition treatment can be repaired. The heat treatment also allows the added ions to be diffused into a wider region of the oxide layer 121.

Note that in the addition treatment of the ions 178, the ions may also be added to the sacrificial layer 160.

Note that the ion addition treatment may be performed after the formation of the insulating layer 176, which is in contact with the side surfaces of the sacrificial layer 160 and the insulating layer 150. Since the ion addition treatment can be performed with both the sacrificial layer 160 and the insulating layer 176 used as a mask, an effective channel length can be prevented from shortening particularly in the manufacture of a minute transistor.

<<Forming Method of Low-Resistance Region 126>>

A method for forming the low-resistance region 126 and the sacrificial layer 165 which is an oxide conductor will be described with reference to FIGS. 35A to 35D. For example, the low-resistance region 126 and the sacrificial layer 165 can be formed with this method when the transistor 10*d* illustrated in FIGS. 9A to 9C or the transistor 10*e* illustrated in FIGS. 10A to 10C is manufactured.

First, as illustrated in FIGS. 35A and 35B, the insulating layer 177 is formed over the oxide layer 121 and the sacrificial layer 160. Here, the sacrificial layer 160 preferably includes an oxide. The mixed layer 127 may be formed in the oxide layer 121, or the mixed layer 162 may be formed in the sacrificial layer 160.

Next, heat treatment is performed, so that nitrogen or hydrogen is supplied from the insulating layer 177 to the oxide layer 121 and the sacrificial layer 160. Thus, the low-resistance region 126 in the oxide layer 121 and the sacrificial layer 165 which is an oxide conductor can be formed (see FIGS. 35C and 35D).

Note that FIGS. 35A to 35D show an example in which the insulating layer 177 is formed after the mixed layer 127 and the mixed layer 162 are formed in the oxide layer 121 and the sacrificial layer 160, respectively. Alternatively, the insulating layer 177 may be formed over the oxide layer 121 and the sacrificial layer 160 without forming the oxide layer 121 and the mixed layer 127. As a result, for example, the transistor 10*e* illustrated in FIGS. 10A to 10C can be manufactured.

<<Forming Method of Oxide Insulating Layer 121*a*, Oxide Semiconductor Layer 121*b*, and Oxide Insulating Layer 121*c*>>

Description is made on a forming method of the oxide insulating layer 121*a*, the oxide semiconductor layer 121*b*, and the oxide insulating layer 121*c* included in the oxide layer 121.

As an example, a forming method of the oxide insulating layer 121*a*, the oxide semiconductor layer 121*b*, and the oxide insulating layer 121*c* included in the transistor 10*g* will be described with reference to FIGS. 36A to 36F.

First, an insulator which is to be the oxide insulating layer 121*a* in a later step is deposited over the insulating layer 110 over the substrate 100. For the insulator, any of the oxides that can be used for the oxide insulating layer 121*a* may be used. The insulator can be deposited by a sputtering method, a CVD method, an MBE method, a PLD method, an ALD method, or the like.

The insulator to be the oxide insulating layer 121*a* is preferably deposited by a sputtering method, further preferably by a sputtering method in an atmosphere containing oxygen. In the sputtering method, either a parallel-plate-type sputtering apparatus or a facing-target sputtering apparatus may be used. As will be described later, deposition using a facing-target sputtering apparatus causes less damage to a formation surface and thus facilitates the formation of a film with high crystallinity. For this reason, a facing-target sputtering apparatus is preferably used for the deposition of a CAAC-OS described later in some cases.

During the deposition of the insulator to be the oxide insulating layer 121*a* by a sputtering method, oxygen is sometimes added to a surface of the insulating layer 110 (interface between the oxide insulating layer 121*a* and the insulating layer 110 after the formation of the oxide insulating layer 121*a*) and the vicinity thereof. Oxygen is added to the insulating layer 110 as an oxygen radical, for example; however, the state of oxygen at the time of being added is not limited thereto. Oxygen may be added to the insulating layer 110 as an oxygen atom, an oxygen ion, or the like. By adding oxygen to the insulating layer 110 in this manner, the insulating layer 110 can contain excess oxygen.

In a region in the vicinity of the interface between the insulating layer 110 and the insulator to be the oxide insulating layer 121*a*, a mixed region is formed in some cases. The mixed region contains components of the insulating layer 110 and the insulator to be the oxide insulating layer 121*a*.

Next, a semiconductor to be the oxide semiconductor layer 121*b* in a later step is deposited (see FIGS. 36A and 36B). For the semiconductor, any of the oxides that can be used as the oxide semiconductor layer 121*b* may be used. The oxide can be deposited by a sputtering method, a CVD method, an MBE method, a PLD method, an ALD method, or the like. Note that successive deposition of the insulator to be the oxide insulating layer 121*a* and the semiconductor to be the oxide semiconductor layer 121*b* without exposure to the air can reduce the entry of impurities into the films and their interface.

A mixed gas of oxygen and a rare gas such as argon (or helium, neon, krypton, xenon, or the like) is preferably used as the deposition gas. For example, the proportion of oxygen in the whole deposition gas may be less than 50 vol %, preferably less than or equal to 33 vol %, further preferably less than or equal to 20 vol %, and still further preferably less than or equal to 15 vol %.

When deposition is performed by a sputtering method, the substrate temperature may be set high. A high substrate temperature can promote migration of sputtered particles over the top surface of the substrate. Thus, an oxide with higher density and higher crystallinity can be deposited. Note that the substrate temperature may be, for example, higher than or equal to 100° C. and lower than or equal to 450° C., preferably higher than or equal to 150° C. and lower than or equal to 400° C., and further preferably higher than or equal to 170° C. and lower than or equal to 350° C.

Next, heat treatment is preferably performed. The heat treatment can reduce the hydrogen concentration in the oxide insulating layer 121*a* and the oxide semiconductor layer 121*b* formed in later steps in some cases. The heat treatment can also reduce oxygen vacancies in the oxide insulating layer 121*a* and the oxide semiconductor layer 121*b* formed in later steps in some cases. The heat treatment may be performed at a temperature higher than or equal to 250° C. and lower than or equal to 650° C., preferably higher than or equal to 450° C. and lower than or equal to 600° C., and further preferably higher than or equal to 520° C. and lower than or equal to 570° C. The heat treatment is performed in an inert gas atmosphere or an atmosphere containing an oxidation gas at 10 ppm or more, 1% or more, or 10% or more. The heat treatment may be performed under a reduced pressure. Alternatively, the heat treatment may be performed in the following manner: heat treatment is performed in an inert gas atmosphere, and then, another heat treatment is performed in an atmosphere containing an oxidation gas at 10 ppm or more, 1% or more, or 10% or more in order to compensate desorbed oxygen. The heat treatment can increase the crystallinity of the oxide insulating layer 121a and the oxide semiconductor layer 121b formed in later steps and remove impurities such as hydrogen and water, for example. As the heat treatment, lamp heating can be performed with an RTA apparatus.

By the heat treatment, oxygen can be supplied from the insulating layer 110 to the insulator to be the oxide insulating layer 121a and the semiconductor to be the oxide semiconductor layer 121b. By the heat treatment performed on the insulating layer 110, oxygen can be supplied to the insulator to be the oxide insulating layer 121a and the semiconductor to be the oxide semiconductor layer 121b very easily.

Oxygen is supplied to the insulator to be the oxide insulating layer 121a and the semiconductor to be the oxide semiconductor layer 121b in this manner to reduce oxygen vacancies, whereby a highly purified intrinsic or substantially highly purified intrinsic oxide semiconductor with a low density of defect states can be obtained.

Furthermore, high-density plasma treatment or the like may be performed. The high-density plasma treatment may be performed before the deposition of the insulator to be the oxide insulating layer 121a, after the formation of the oxide layer 121, or after the formation of the insulating layer 180, for example.

Then, a resist or the like is formed over the semiconductor to be the oxide semiconductor layer 121b and processing is performed using the resist or the like, whereby the oxide insulating layer 121a and the oxide semiconductor layer 121b are formed (see FIGS. 36C and 36D). As illustrated in FIGS. 36C and 36D, an exposed surface of the insulating layer 110 is removed at the time of the formation of the oxide semiconductor layer 121b in some cases.

Then, an insulator to be the oxide insulating layer 121c in a later step is deposited. As the insulator, any of the above-described insulators, semiconductors, and conductors may be used. The insulator can be deposited by a sputtering method, a CVD method, an MBE method, a PLD method, an ALD method, or the like.

Then, a resist or the like is formed over the insulator to be the oxide insulating layer 121c and processing is performed with use of the resist or the like, whereby the oxide insulating layer 121c is formed (see FIGS. 36E and 36F). Note that an exposed surface of the insulating layer 110 is sometimes removed when the oxide insulating layer 121c is formed.

Here, patterning is performed such that the end portion of the side surface of the oxide insulating layer 121c is located outward from the end portions of the side surfaces of the oxide insulating layer 121a and the oxide semiconductor layer 121b. It is particularly preferable that as illustrated in FIG. 36F, patterning be performed such that the end portions of the side surfaces of the oxide insulating layer 121a and the oxide insulating layer 121c in the channel width direction are located outward from the end portion of the side surface of the oxide semiconductor layer 121b in the channel width direction. When the oxide insulating layer 121a and the oxide insulating layer 121c are formed in this manner, the oxide semiconductor layer 121b is surrounded by the oxide insulating layer 121a and the oxide insulating layer 121c.

In the above structure, the end portion of the side surface of the oxide semiconductor layer 121b, particularly in the channel width direction, is in contact with the oxide insulating layer 121c. As a result, in the end portion of the side surface of the oxide semiconductor layer 121b, continuous junction is formed between the oxide semiconductor layer 121b and the oxide insulating layer 121a or the oxide insulating layer 121c, whereby the density of defect states is reduced.

Note that this embodiment can be combined with any of the other embodiments in this specification as appropriate.

Embodiment 3

In this embodiment, the structures of the aforementioned oxide will be described with reference to FIG. 37A to FIG. 41.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 37A:
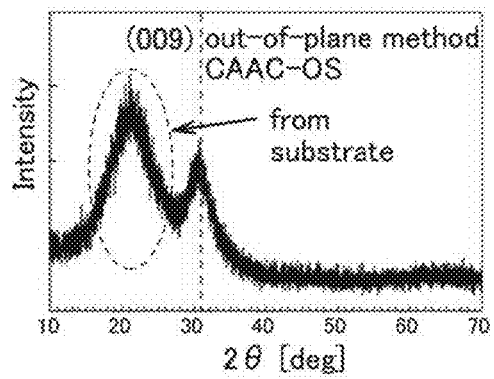
FIGS. 37A to 37E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 37A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ f around 31°. The peak at a 2θ of around 36° is derived from a crystal structure that is classified into the space group Fd-3m; thus, this peak is preferably not exhibited in a CAAC-OS.

Figure 37B:
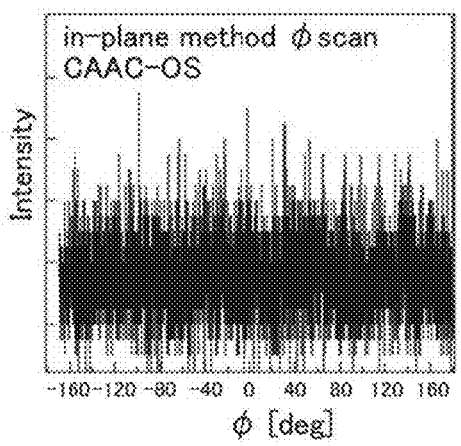
Figure 37C:
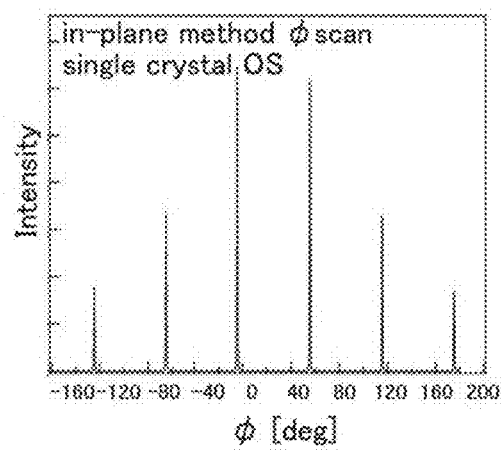
Figure 37D:
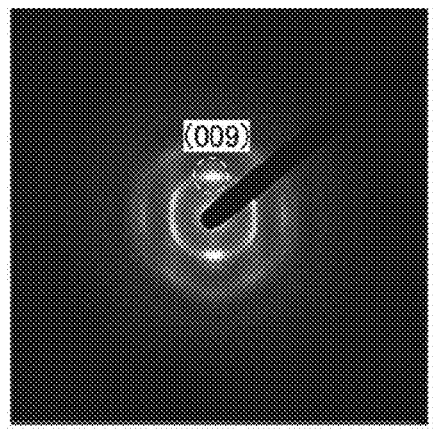

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 37B, a peak is not clearly observed. In contrast, in the case where single crystal $InGaZnO_4$ is subjected to φ scan with 2θ fixed at around 56°, as shown in FIG. 37C, six peaks which are derived from crystal planes equivalent to the (110) plane are observed. Accordingly, the structural analysis using XRD shows that the directions of a-axes and b-axes are irregularly oriented in the CAAC-OS.

Figure 37E:
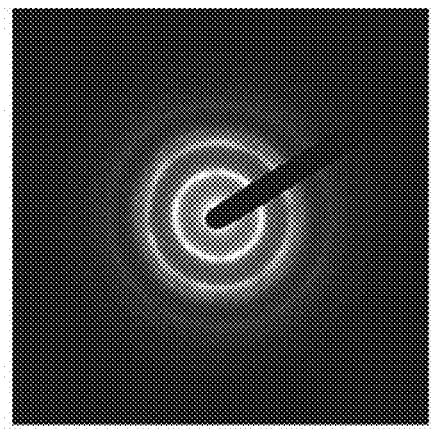

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 37D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 37E shows a diffraction pattern obtained in such a manner that an electron beam with a probe diameter of 300 nm is incident on the same sample in a direction perpendicular to the sample surface. As shown in FIG. 37E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 37E is considered to be derived from the (010) plane, the (100) plane, and the like of the $InGaZnO_4$ crystal. The second ring in FIG. 37E is considered to be derived from the (110) plane and the like.

In a combined analysis image (also referred to as a high-resolution TEM image) of a bright-field image and a diffraction pattern of a CAAC-OS, which is obtained with a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 38A:
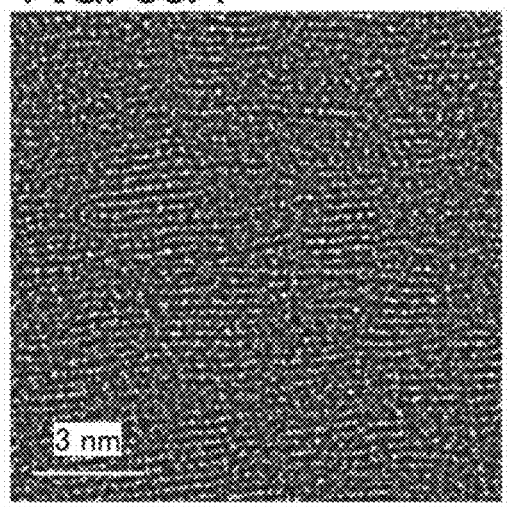
FIGS. 38A to 38E show a cross-sectional TEM image and plan-view TEM images of a CAAC-OS and images obtained through analysis thereof.

FIG. 38A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 38A shows pellets in which metal atoms are arranged in a layered manner. FIG. 38A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 38B:
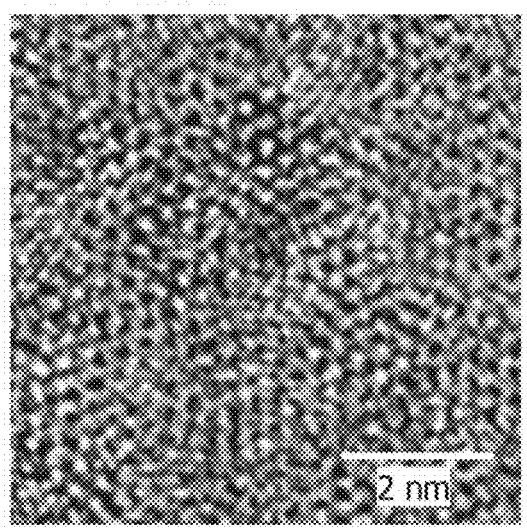
Figure 38C:
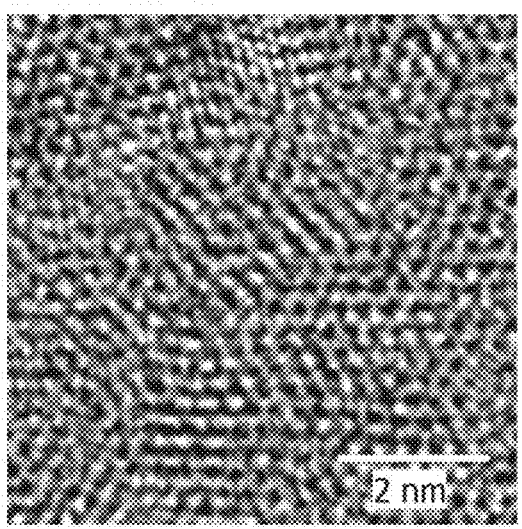
Figure 38D:
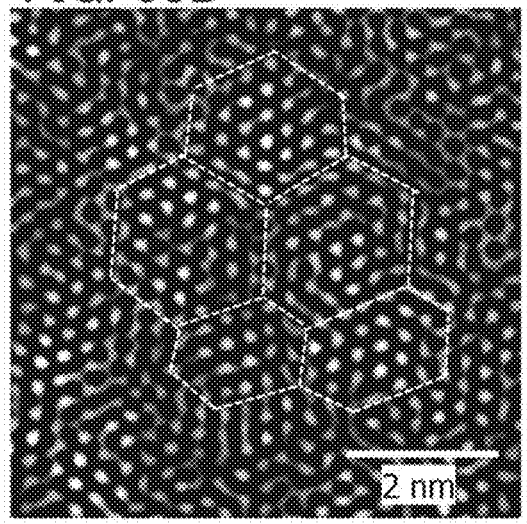
Figure 38E:
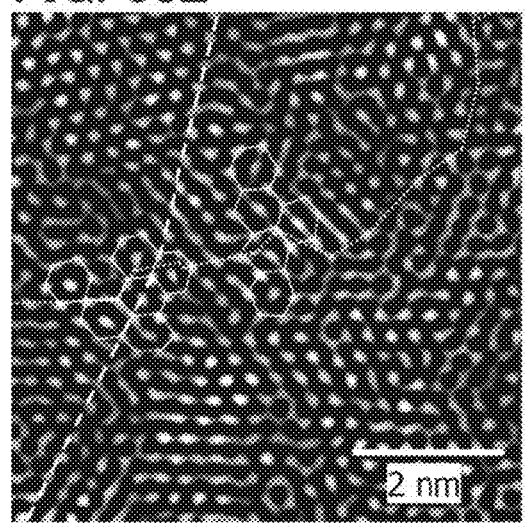

FIGS. 38B and 38C show Cs-corrected high-resolution TEM images of a plane of the CAAC-OS observed from a direction substantially perpendicular to the sample surface. FIGS. 38D and 38E are images obtained through image processing of FIGS. 38B and 38C. The method of image processing is as follows. The image in FIG. 38B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 38D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 38E, a dotted line denotes a portion between a region with a regular lattice arrangement and another region with a regular lattice arrangement, and a dashed line denotes the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancy in the oxide semiconductor serves as a carrier trap or serves as a carrier generation source when hydrogen is captured therein.

The CAAC-OS having small amounts of impurities and oxygen vacancies is an oxide semiconductor with low carrier density. Specifically, an oxide semiconductor with a carrier density of lower than $8 \times 10^{11}$ cm$^{-3}$, preferably lower than $1 \times 10^{11}$ cm$^{-3}$, further preferably lower than $1 \times 10^{10}$ cm$^{-3}$, and higher than or equal to $1 \times 10^{-9}$ cm$^{-3}$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 39A:
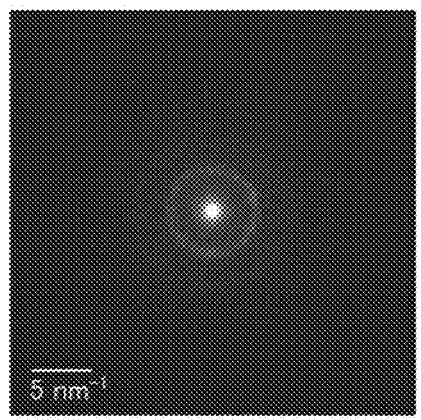
FIGS. 39A to 39D show electron diffraction patterns and a cross-sectional TEM image of an nc-OS.
Figure 39B:
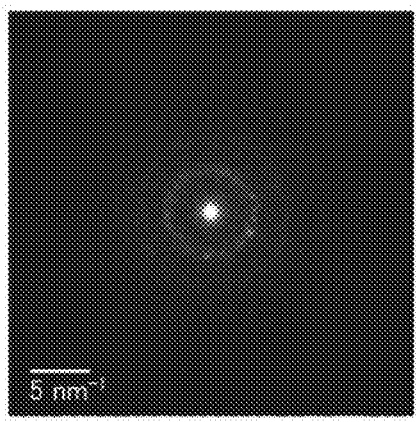

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 39A is observed. FIG. 39B shows a diffraction pattern obtained when an electron beam with a probe diameter of 1 nm is incident on the same sample. As shown in FIG. 39B, a plurality of spots are observed in a ring-like region. In other words, ordering in an nc-OS is not observed with an electron beam with a probe diameter of 50 nm but is observed with an electron beam with a probe diameter of 1 nm.

Figure 39C:
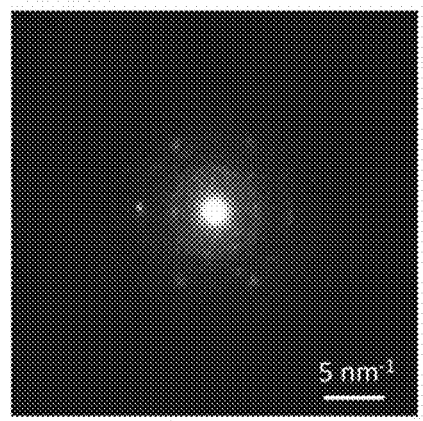

Furthermore, an electron diffraction pattern in which spots are arranged in an approximately regular hexagonal shape is observed in some cases as shown in FIG. 39C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 39D:
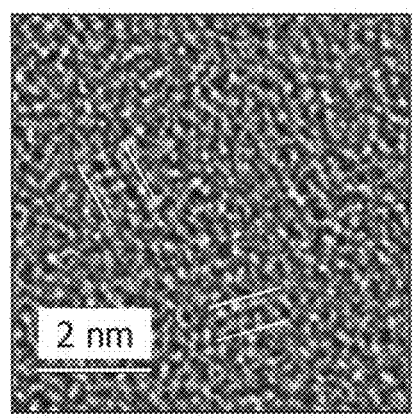

FIG. 39D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 39D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS is an oxide semiconductor having a structure between the nc-OS and the amorphous oxide semiconductor.

FIGS. 40A and 40B are high-resolution cross-sectional TEM images of an a-like OS. FIG. 40A is the high-resolution cross-sectional TEM image of the a-like OS at the start of the electron irradiation. FIG. 40B is the high-resolution cross-sectional TEM image of a-like OS after the electron (e) irradiation at $4.3 \times 10^8$ e$^-$/nm$^2$. FIGS. 40A and 40B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 41:
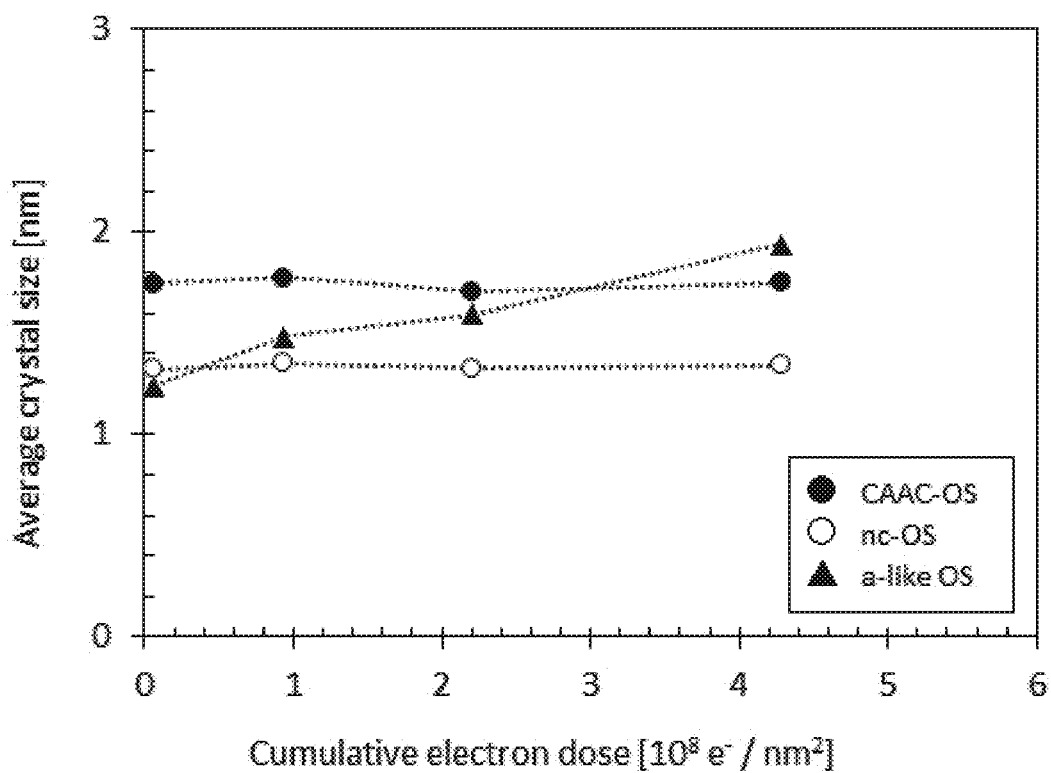
FIG. 41 shows a change of crystal parts of an In—Ga—Zn oxide owing to electron irradiation.

FIG. 41 shows change in the average size of crystal parts (at 22 points to 30 points) in each sample. Note that the crystal part size corresponds to the length of a lattice fringe. FIG. 41 indicates that the crystal part size in the a-like OS increases with an increase in the cumulative electron dose in obtaining TEM images, for example. As shown in FIG. 41, a crystal part of approximately 1.2 nm (also referred to as an initial nucleus) at the start of TEM observation grows to a size of approximately 1.9 nm at a cumulative electron (e⁻) dose of $4.2\times10^8$ e⁻/nm². In contrast, the crystal part size in the nc-OS and the CAAC-OS shows little change from the start of electron irradiation to a cumulative electron dose of $4.2\times10^8$ e⁻/nm². As shown in FIG. 41, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ e⁻/nm²·s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO₄ with a rhombohedral crystal structure is 6.357 g/cm³. Accordingly, in the case of the oxide semiconductor having an atomic ratio of In:Ga:Zn=1:1:1, the density of the a-like OS is higher than or equal to 5.0 g/cm³ and lower than 5.9 g/cm³. For example, in the case of the oxide semiconductor having an atomic ratio of In:Ga:Zn=1:1:1, the density of each of the nc-OS and the CAAC-OS is higher than or equal to 5.9 g/cm³ and lower than 6.3 g/cm³.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Note that this embodiment can be combined with any of the other embodiments in this specification as appropriate.

Embodiment 4

In this embodiment, an example of a circuit including the transistor of one embodiment of the present invention will be described with reference to drawings.

<Cross-Sectional Structure>

Figure 42A:
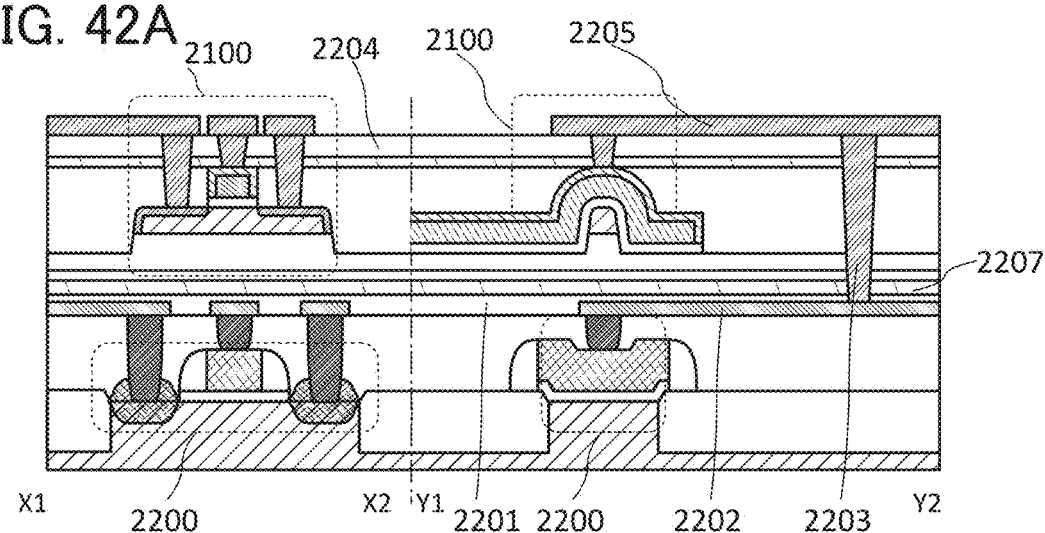
FIGS. 42A to 42D are cross-sectional views and circuit diagrams of semiconductor devices.

FIG. 42A is a cross-sectional view of a semiconductor device of one embodiment of the present invention. In FIG. 42A, the X1-X2 direction and the Y1-Y2 direction represent a channel length direction and a channel width direction, respectively. The semiconductor device illustrated in FIG. 42A includes a transistor 2200 using a first semiconductor material in a lower portion and a transistor 2100 using a second semiconductor material in an upper portion. FIG. 42A shows an example in which the transistor described in the above embodiment as an example is used as the transistor 2100 using the second semiconductor material. A cross-sectional view of the transistors in a channel length direction is on the left side of a dashed-dotted line, and a cross-sectional view of the transistors in a channel width direction is on the right side of the dashed-dotted line.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor using an oxide semiconductor and described in the above embodiment as an example can have a small subthreshold value (S value) and a minute structure. Furthermore, the transistor can operate at a high speed because of its high switching speed and has low leakage current because of its low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 42A illustrates a structure in which the transistor 2100 is provided over the transistor 2200 with an insulator 2201 and an insulator 2207 provided therebetween. A plurality of wirings 2202 are provided between the transistor 2200 and the transistor 2100. Furthermore, wirings and electrodes provided over and under the insulators are electrically connected to each other through a plurality of plugs 2203 embedded in the insulators. An insulator 2204 covering the transistor 2100 and a wiring 2205 over the insulator 2204 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulator provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulator provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, providing the insulator 2207 having a function of preventing diffusion of hydrogen between the transistors 2100 and 2200 is particularly effective. The insulator 2207 makes hydrogen remain in the lower portion, thereby improving the reliability of the transistor 2200. In addition, since the insulator 2207 suppresses diffusion of hydrogen from the lower portion to the upper portion, the reliability of the transistor 2100 can also be improved.

The insulator 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing diffusion of hydrogen is preferably formed over the transistor 2100 to cover the transistor 2100 including an oxide semiconductor film. For the blocking film, a material that is similar to that of the insulator 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the blocking film covering the transistor 2100, release of oxygen from the oxide semiconductor film included in the transistor 2100 can be prevented and entry of water and hydrogen into the oxide semiconductor film can be prevented. Note that as the block film, the insulator 2204 having a stacked-layer structure may be used, or the block film may be provided under the insulator 2204.

Note that the transistor 2200 can be a transistor of various types without being limited to a planar type transistor. For example, the transistor 2200 can be a fin-type transistor, a tri-gate transistor, or the like. An example of a cross-sectional view in this case is illustrated in FIG. 42D. An insulator 2212 is provided over a semiconductor substrate 2211. The semiconductor substrate 2211 includes a projecting portion with a thin tip (also referred to a fin). Note that an insulator may be provided over the projecting portion. The projecting portion does not necessarily have the thin tip; a projecting portion with a cuboid-like projecting portion and a projecting portion with a thick tip are permitted, for example. A gate insulator 2214 is provided over the projecting portion of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

<Circuit Configuration Example>

In the above structure, electrodes of the transistor 2100 and the transistor 2200 can be connected as appropriate; thus, a variety of circuits can be formed. Examples of the circuit configurations which can be achieved by using a semiconductor device of one embodiment of the present invention will be described below.

<CMOS Inverter Circuit>

Figures 42B, 42C:
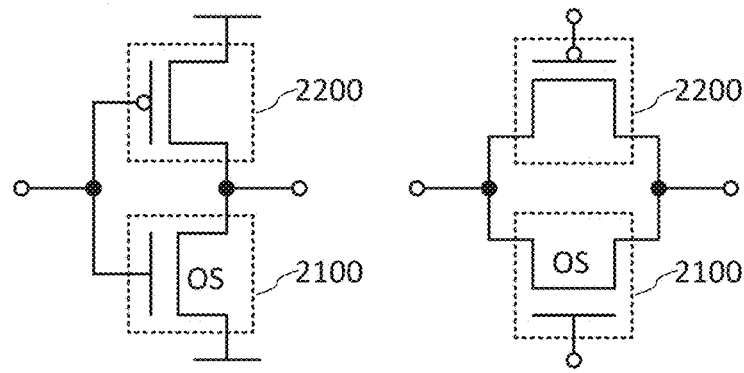
Figure 42D:
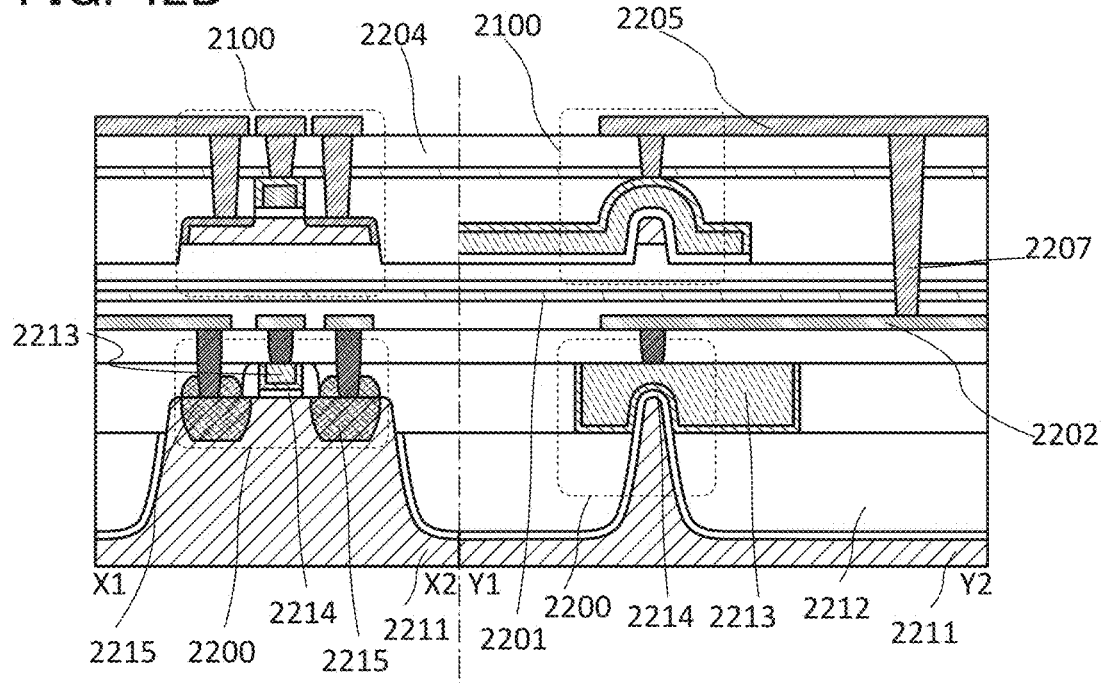

A circuit diagram in FIG. 42B illustrates a configuration of a CMOS inverter in which the p-channel transistor 2200 and the n-channel transistor 2100 are connected in series and gates of them are connected to each other.

<CMOS Analog Switch>

A circuit diagram in FIG. 42C illustrates a configuration in which sources of the transistors 2100 and 2200 are connected to each other and drains of the transistors 2100 and 2200 are connected to each other. With such a configuration, the transistors can function as a CMOS analog switch.

<Memory Device Example>

Figure 43A:
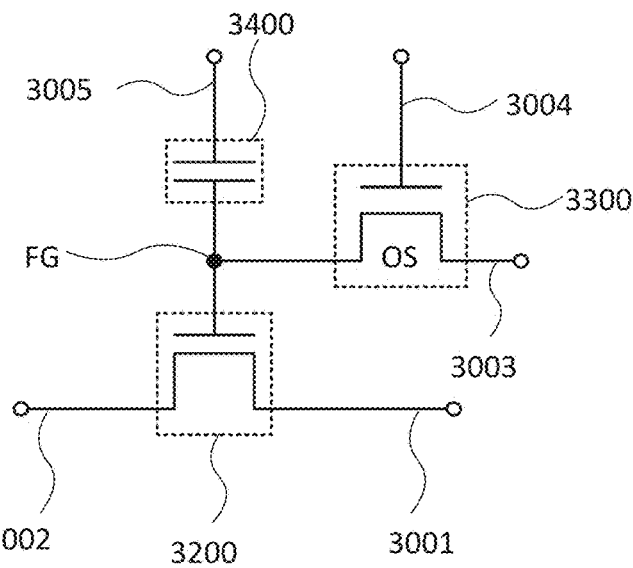
FIGS. 43A to 43C are a cross-sectional view and circuit diagrams of semiconductor devices.
Figure 43B:
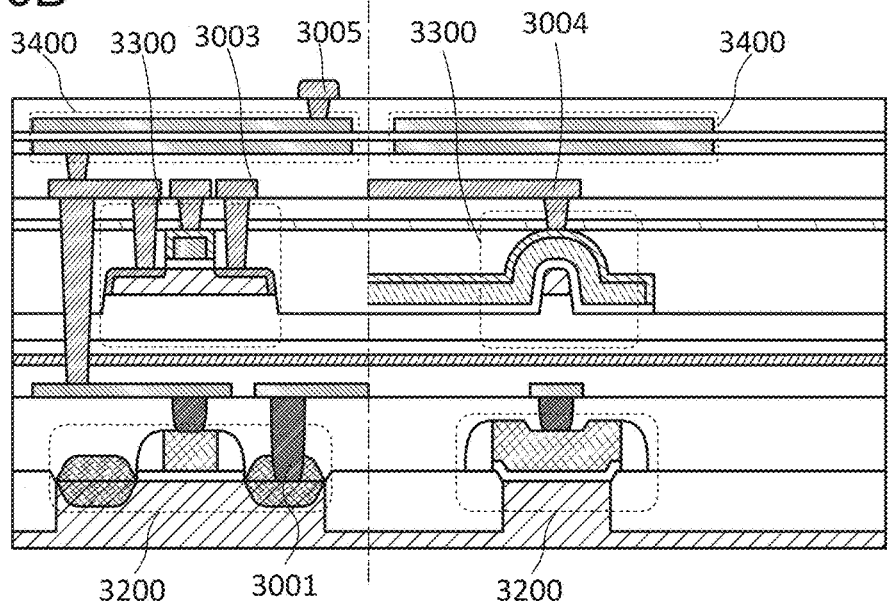
Figure 43C:
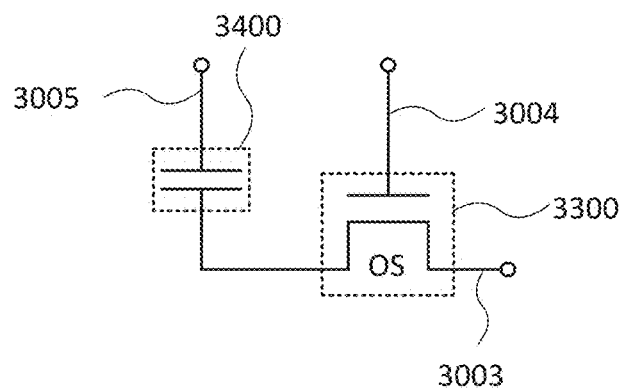

FIGS. 43A to 43C illustrate an example of a semiconductor device (memory device) that includes the transistor of one embodiment of the present invention, which can retain stored data even when not powered, and which has an unlimited number of write cycles.

The semiconductor device illustrated in FIG. 43A includes a transistor 3200 using a first semiconductor material, a transistor 3300 using a second semiconductor material, and a capacitor 3400. Note that any of the above-described transistors can be used as the transistor 3300.

FIG. 43B is a cross-sectional view of the semiconductor device illustrated in FIG. 43A. The semiconductor device in the cross-sectional view has a structure in which the transistor 3300 is provided with a back gate; however, a structure without a back gate may be employed.

The transistor 3300 is a transistor in which a channel is formed in a semiconductor including an oxide semiconductor. Since the off-state current of the transistor 3300 is low, stored data can be retained for a long period. In other words, power consumption can be sufficiently reduced because a semiconductor memory device in which refresh operation is unnecessary or the frequency of refresh operation is extremely low can be provided.

In FIG. 43A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 is electrically connected to the other of the source electrode and the drain electrode of the transistor 3300 and a first terminal of the capacitor 3400. A fifth wiring 3005 is electrically connected to a second terminal of the capacitor 3400.

The semiconductor device in FIG. 43A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off. Thus, the retained data can be read by determining the potential of the second wiring 3002.

Note that in the case where memory cells are arrayed to be used, it is necessary that only data of a desired memory cell be able to be read. For example, the fifth wiring 3005 of memory cells from which data is not read may be supplied with a potential at which the transistor 3200 is turned off regardless of the state of the gate electrode, that is, a potential lower than $V_{th\_H}$, whereby only data of a desired memory cell can be read. Alternatively, the fifth wiring 3005 of the memory cells from which data is not read may be supplied with a potential at which the transistor 3200 is turned on regardless of the state of the gate electrode, that is, a potential higher than $V_{th\_L}$, whereby only data of a desired memory cell can be read.

The semiconductor device illustrated in FIG. 43C is different from the semiconductor device illustrated in FIG. 43A in that the transistor 3200 is not provided. Also in this case, writing and retaining of data can be performed in a manner similar to the above.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in the potential of the third wiring 3003 varies depending on the potential of a first terminal of the capacitor 3400 (or the charge accumulated in the capacitor 3400).

For example, the potential of the third wiring 3003 after the charge redistribution is $(C_B \times V_{B0} C \times V)/(C_B+C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1>V_0$), the potential of the third wiring 3003 in the case of retaining the potential $V_1$ ($=(C_B \times V_{B0}+C \times V_1)/(C_B+C)$) is higher than the potential of the third wiring 3003 in the case of retaining the potential $V_0$ ($=(C_B \times V_{B0}+C \times V_0)/(C_B+C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer is not caused at all. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

With the use of the semiconductor device described in this embodiment, a memory device with low power consumption and high capacity (e.g., 1 terabit or more) can be fabricated.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. In the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. It can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. Therefore, for example, in a diagram or text in which one or more active elements (e.g., transistors or diodes), wirings, passive elements (e.g., capacitors or resistors), conductive layers, insulating layers, semiconductors, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flowchart in which N elements (N is an integer) are provided.

<Imaging Device>

An imaging device of one embodiment of the present invention will be described below.

Figure 44A:
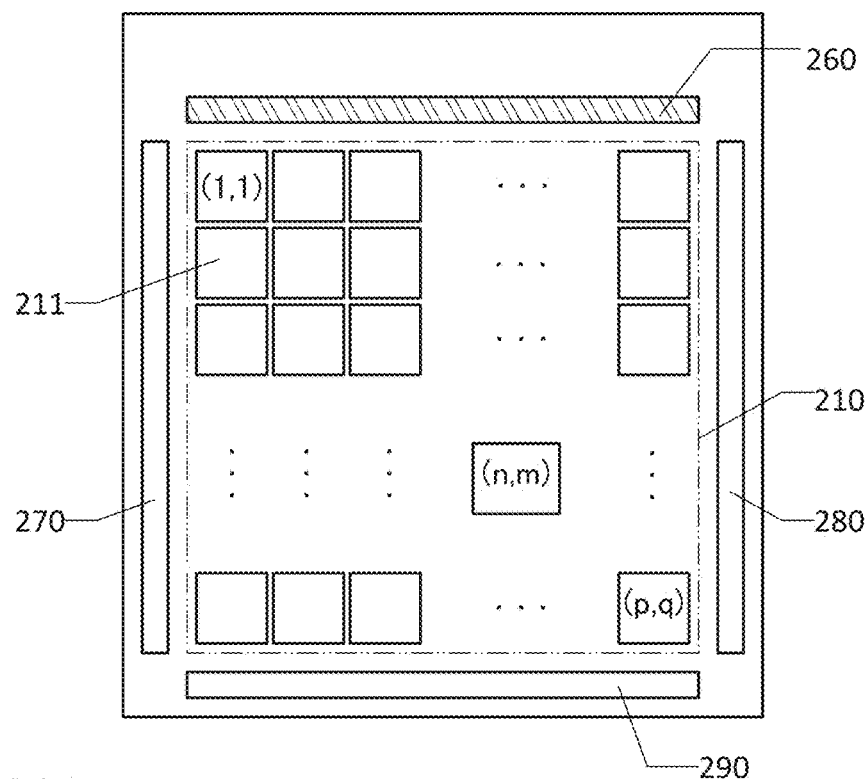
FIGS. 44A and 44B are plan views each illustrating an imaging device.

FIG. 44A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer greater than or equal to 2). The peripheral circuit 260, the peripheral circuit 270, the peripheral circuit 280, and the peripheral circuit 290 are each connected to a plurality of pixels 211 and each have a function of supplying a signal for driving the plurality of pixels 211. In this specification and the like, in some cases, "a peripheral circuit" or "a driver circuit" indicates all of the peripheral circuits 260, 270, 280, and 290. For example, the peripheral circuit 260 can be regarded as part of the peripheral circuit.

The peripheral circuit includes at least one of a logic circuit, a switch, a buffer, an amplifier circuit, and a converter circuit. The peripheral circuit may be provided over a substrate where the pixel portion 210 is formed. A semiconductor device such as an IC chip may be used as part or the whole of the peripheral circuit. Note that as the peripheral circuit, one or more of the peripheral circuits 260, 270, 280, and 290 may be omitted.

Figure 44B:
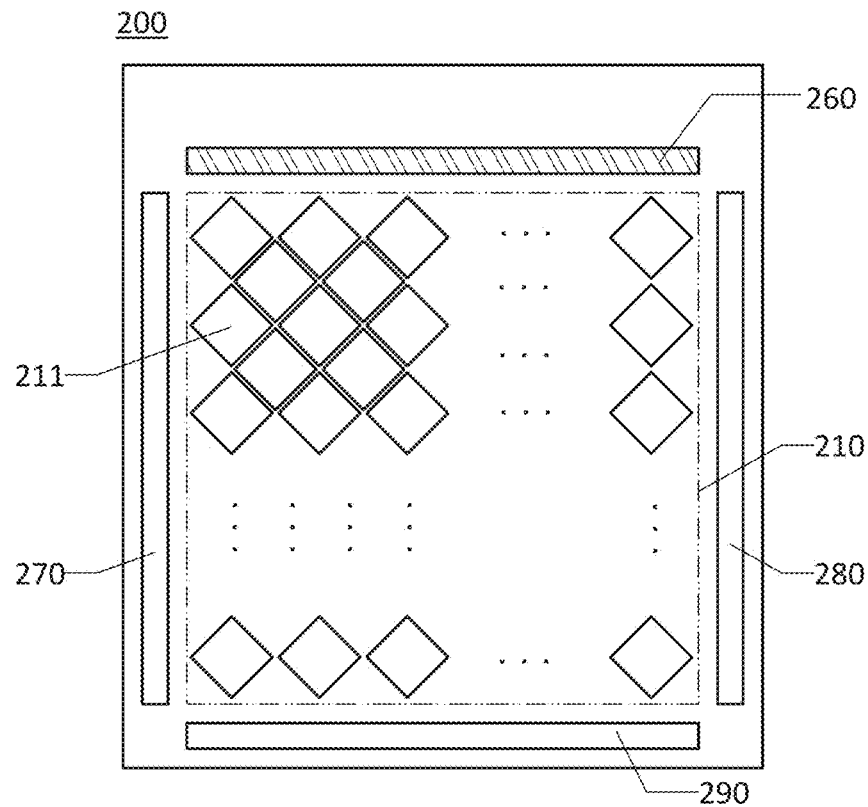

As illustrated in FIG. 44B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter which transmits light in a specific wavelength range (color filter), whereby data for achieving color image display can be obtained.

Figure 45A:
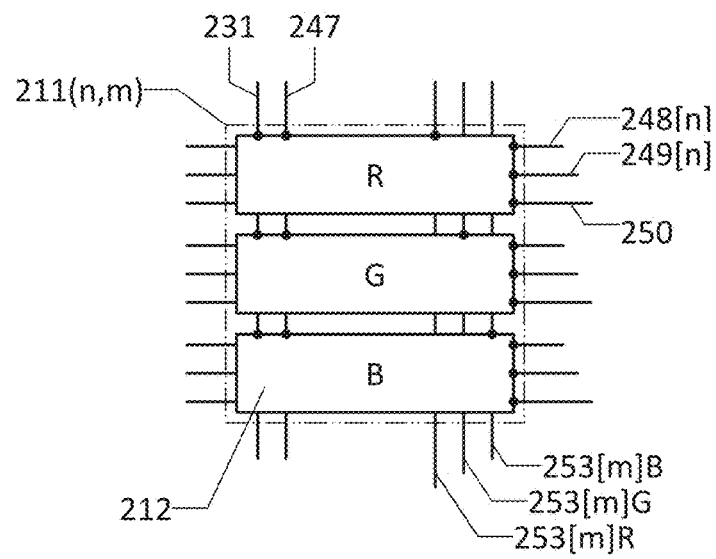
FIGS. 45A and 45B are plan views illustrating pixels of an imaging device.

FIG. 45A is a plan view illustrating an example of the pixel 211 with which a color image is obtained. The pixel 211 illustrated in FIG. 45A includes a subpixel 212 provided with a color filter transmitting light in a red (R) wavelength range (also referred to as a subpixel 212R), a subpixel 212 provided with a color filter transmitting light in a green (G) wavelength range (also referred to as a subpixel 212G), and a subpixel 212 provided with a color filter transmitting light in a blue (B) wavelength range (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent of one another. In this specification and the like, for example, the wiring 248 and the wiring 249 that are connected to the pixel 211 in the n-th row (n is an integer greater than or equal to 1 and less than or equal top) are referred to as a wiring 248[n] and a wiring 249[n]. For example, the wiring 253 connected to the pixel 211 in the m-th column (m is an integer greater than or equal to 1 and less than or equal to q) is referred to as a wiring 253[m]. Note that in FIG. 45A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 45B:
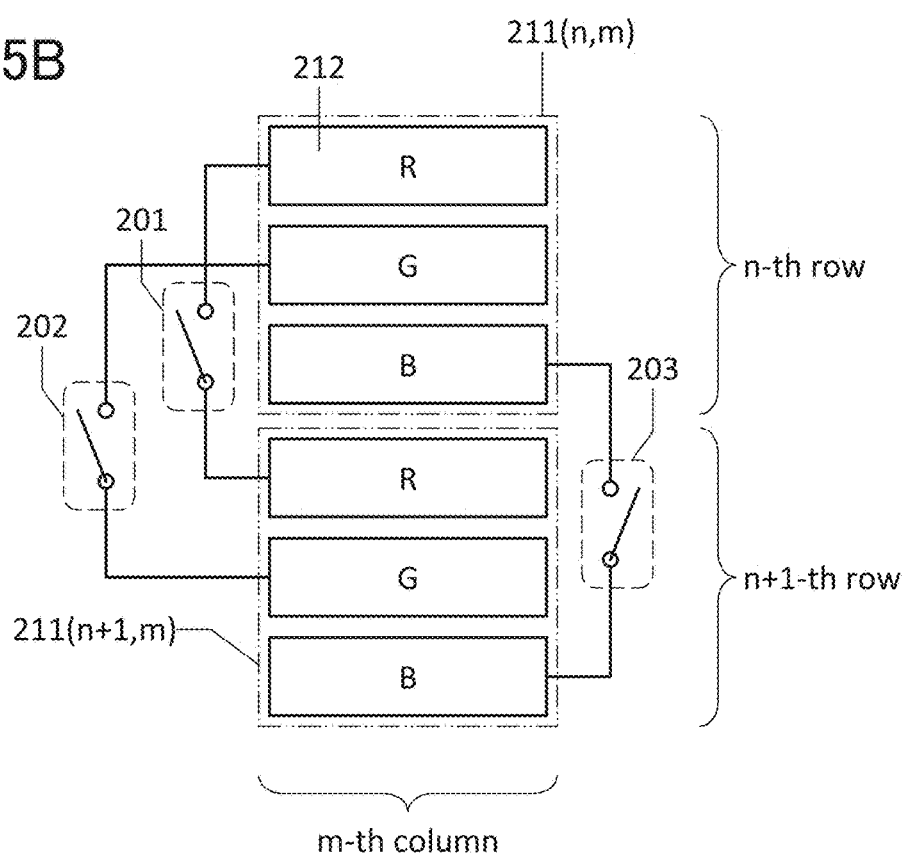

The imaging device 200 has a structure in which the subpixel 212 is electrically connected to the subpixel 212 in an adjacent pixel 211 which is provided with a color filter transmitting light in the same wavelength range as the subpixel 212, via a switch. FIG. 45B illustrates a connection example of the subpixels 212: the subpixel 212 in the pixel 211 arranged in an n-th (n is an integer greater than or equal to 1 and less than or equal to p) row and an m-th (m is an integer greater than or equal to 1 and less than or equal to q) column and the subpixel 212 in the adjacent pixel 211 arranged in an (n+1)-th row and the m-th column. In FIG. 45B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light in three different wavelength ranges in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light in four different wavelength ranges are provided in one pixel 211, the reproducibility of colors of an obtained image can be increased.

For example, in FIG. 45A, in regard to the subpixel 212 sensing light in a red wavelength range, the subpixel 212 sensing light in a green wavelength range, and the subpixel 212 sensing light in a blue wavelength range, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red to green and blue may be 1:6:1.

Although the number of subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an infrared (IR) filter that transmits infrared light and absorbs or reflects visible light is used as the filter, the imaging device 200 that senses infrared light can be provided.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 46A and 46B. With the lens 255, the photoelectric conversion element can receive incident light efficiently. Specifically, as illustrated in FIG. 46A, light 256 enters a photoelectric conversion element 220 through the lens 255, the filter 254 (a filter 254R, a filter 254G, and a filter 254B), a pixel circuit 230, and the like which are provided in the pixel 211.

However, as indicated by a region surrounded with dashed-dotted lines, part of the light 256 indicated by arrows might be blocked by some wirings 257. Thus, a preferable structure is that the lens 255 and the filter 254 are provided on the photoelectric conversion element 220 side, so that the photoelectric conversion element 220 can efficiently receive the light 256 as illustrated in FIG. 46B. When the light 256 enters the photoelectric conversion element 220 from the photoelectric conversion element 220 side, the imaging device 200 with high detection sensitivity can be provided.

Figure 46A:
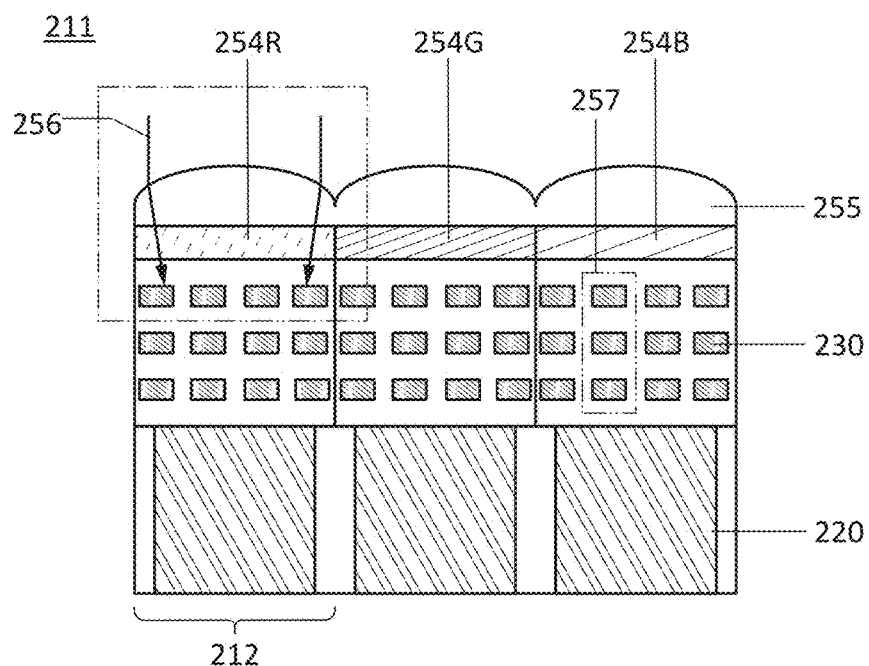
FIGS. 46A and 46B are cross-sectional views each illustrating an imaging device.
Figure 46B:
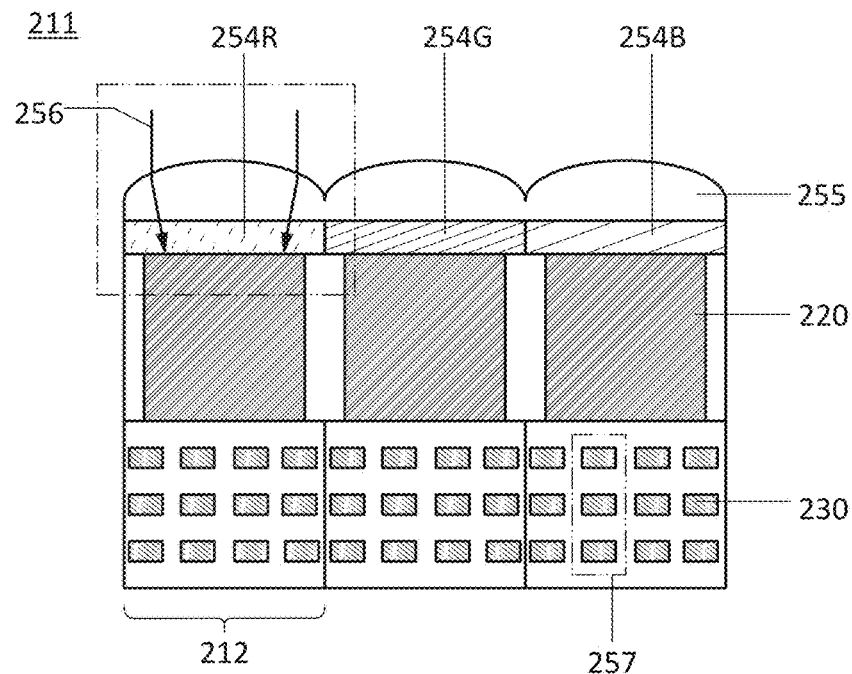

As the photoelectric conversion element 220 illustrated in FIGS. 46A and 46B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and a cadmium-zinc alloy.

For example, when selenium is used for the photoelectric conversion element 220, the photoelectric conversion element 220 can have an absorption coefficient of light in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 45A and 45B.

<Configuration Example 2 of Pixel>

An example of a pixel including a transistor using silicon and a transistor using an oxide semiconductor will be described below.

Figure 47A:
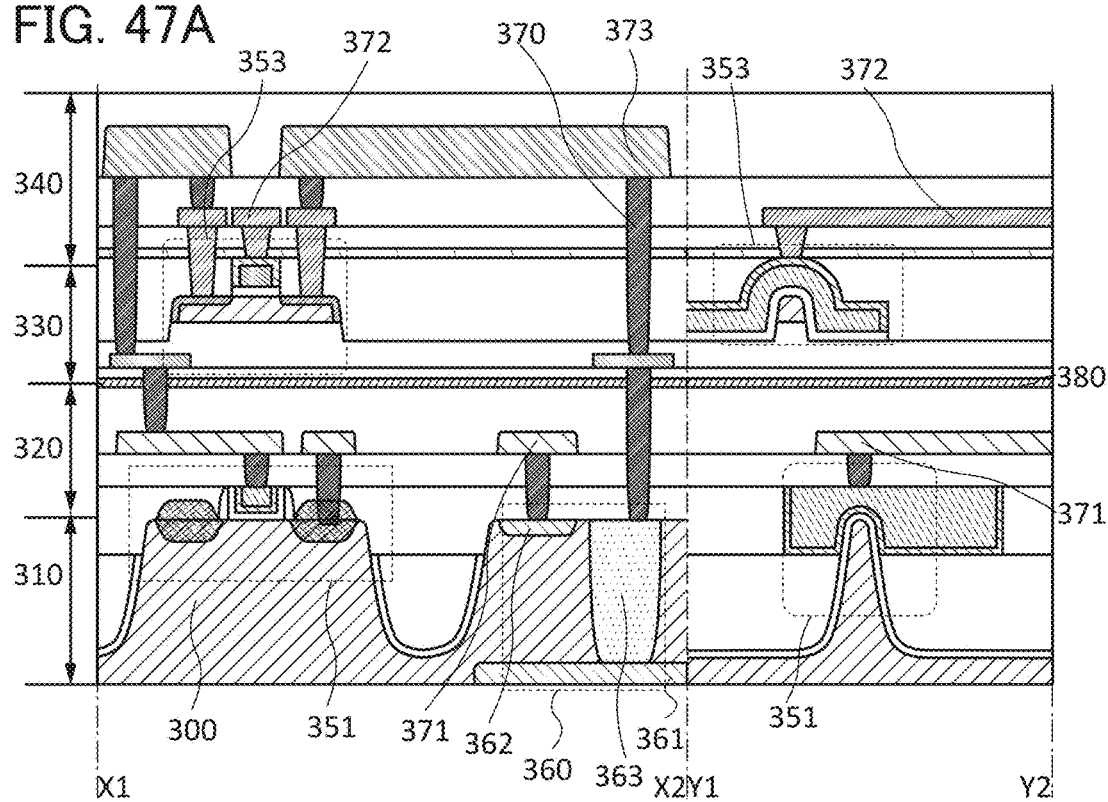
FIGS. 47A and 47B are cross-sectional views each illustrating an imaging device.
Figure 47B:
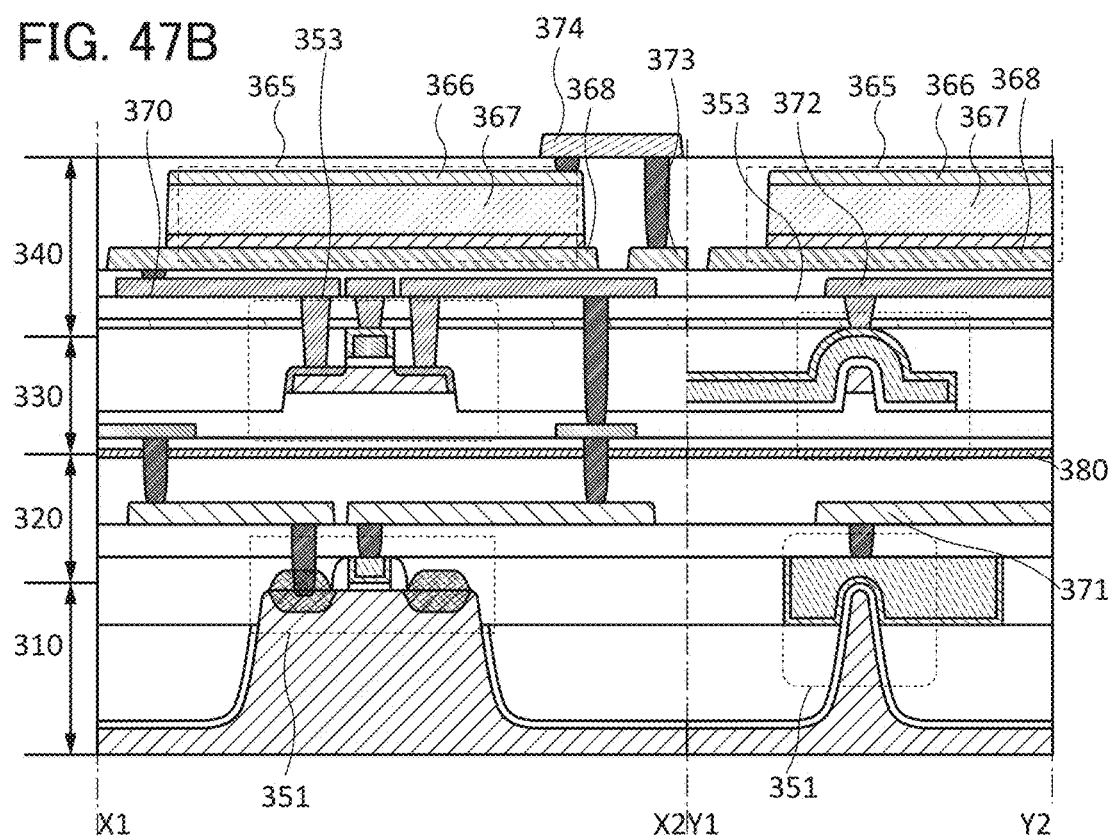

FIGS. 47A and 47B are each a cross-sectional view of an element included in an imaging device.

The imaging device illustrated in FIG. 47A includes a transistor 351 including silicon on a silicon substrate 300, a transistor 353 which includes an oxide semiconductor and is stacked over the transistor 351, and a photodiode 360 provided in a silicon substrate 300 and including an anode 361 and a cathode 362. The transistors and the photodiode 360 are electrically connected to various plugs 370 and wirings 371, 372, and 373. In addition, an anode 361 of the photodiode 360 is electrically connected to the plug 370 through a low-resistance region 363.

The imaging device includes a layer 310 including the transistor 351 and the photodiode 360 provided on the silicon substrate 300, a layer 320 which is in contact with the layer 310 and includes the wirings 371, a layer 330 which is in contact with the layer 320 and includes the transistor 353 and an insulating layer 380, and a layer 340 which is in contact with the layer 330 and includes the wiring 372 and the wiring 373.

Note that in the example of the cross-sectional view in FIG. 47A, a light-receiving surface of the photodiode 360 is provided on the side opposite to a surface of the silicon substrate 300 where the transistor 351 is formed. In the structure, an optical path can be obtained without the influence by the transistors, wirings, and the like. Thus, a pixel with a high aperture ratio can be formed. Note that the light-receiving surface of the photodiode 360 can be the same as the surface where the transistor 351 is formed.

In the case where a pixel is formed only with transistors using an oxide semiconductor, the layer 310 may include the transistor using an oxide semiconductor. Alternatively, the layer 310 may be omitted, and the pixel may include only transistors using an oxide semiconductor.

In addition, in the cross-sectional view in FIG. 47A, the photodiode 360 in the layer 310 and the transistor in the layer 330 can be formed so as to overlap with each other. Thus, the degree of integration of pixels can be increased. In other words, the resolution of the imaging device can be increased.

An imaging device illustrated in FIG. 47B includes a photodiode 365 in the layer 340 and over the transistor. In FIG. 47B, the layer 310 includes the transistor 351 using silicon, the layer 320 includes the wiring 371, the layer 330 includes the transistor 353 using an oxide semiconductor and the insulating layer 380, and the layer 340 includes the photodiode 365. The photodiode 365 is electrically connected to the wiring 373 and a wiring 374 through the plug 370.

The element structure illustrated in FIG. 47B can increase the aperture ratio.

Alternatively, a PIN diode element formed using an amorphous silicon film, a microcrystalline silicon film, or the like may be used as the photodiode 365. In the photodiode 365, an n-type semiconductor 368, an i-type semiconductor 367, and a p-type semiconductor 366 are stacked in this order. The i-type semiconductor 367 is preferably formed using amorphous silicon. The p-type semiconductor 366 and the n-type semiconductor 368 can each be formed using amorphous silicon, microcrystalline silicon, or the like which includes a dopant imparting the corresponding conductivity type. The photodiode 365 in which a photoelectric conversion layer is formed using amorphous silicon has high sensitivity in a visible light wavelength region, and therefore can easily sense weak visible light.

Note that this embodiment can be combined with any of the other embodiments in this specification as appropriate.

Embodiment 5

In this embodiment, circuit configuration examples to which the transistors described in the above embodiments with reference to FIGS. 15A to 15C, FIGS. 19A to 19C, and FIGS. 22A to 22C can be applied will be described with reference to FIG. 48A to FIG. 51B.

Figure 48A:
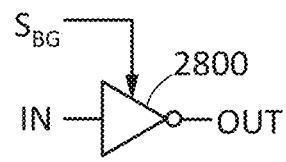
FIGS. 48A to 48C are circuit diagrams and a timing chart illustrating a semiconductor device of one embodiment of the present invention.

FIG. 48A is a circuit diagram of an inverter applicable to a memory, an FPGA, a CPU, or the like. An inverter 2800 outputs a signal whose logic is inverted from the logic of a signal supplied to an input terminal IN to an output terminal OUT. The inverter 2800 includes a plurality of OS transistors. A signal $S_{BG}$ can switch the electrical characteristics of the OS transistors.

Figure 48B:
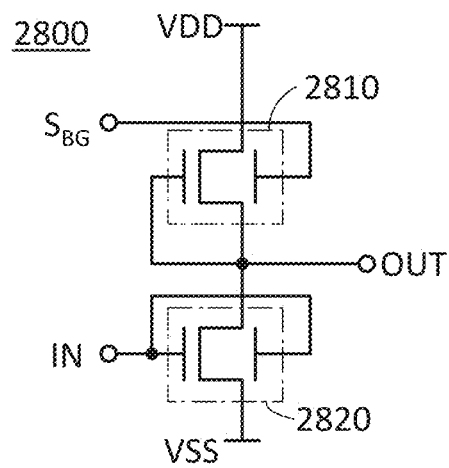

FIG. 48B is a circuit diagram illustrating an example of the inverter 2800. The inverter 2800 includes an OS transistor 2810 and an OS transistor 2820. The inverter 2800 can be formed using n-channel transistors and can have a circuit configuration in which all the transistors have the same conductivity. With the circuit configuration in which all the transistors have the same conductivity, the inverter can be formed at lower costs than an inverter formed using a complementary metal oxide semiconductor circuit (i.e., a CMOS inverter).

Note that the inverter 2800 including the OS transistors can be provided over a CMOS circuit including Si transistors. Since the inverter 2800 can be provided so as to overlap with the CMOS circuit, no additional area is required for the inverter 2800, and thus, an increase in the circuit area can be suppressed.

Each of the OS transistors 2810 and 2820 includes a first gate functioning as a front gate, a second gate functioning as a back gate, a first terminal functioning as one of a source and a drain, and a second terminal functioning as the other of the source and the drain.

The first gate of the OS transistor 2810 is connected to its second terminal. The second gate of the OS transistor 2810 is connected to a wiring that transmits the signal $S_{BG}$. The first terminal of the OS transistor 2810 is connected to a wiring that supplies a voltage VDD. The second terminal of the OS transistor 2810 is connected to the output terminal OUT.

The first gate of the OS transistor 2820 is connected to the input terminal IN. The second gate of the OS transistor 2820 is connected to the input terminal IN. The first terminal of the OS transistor 2820 is connected to the output terminal OUT. The second terminal of the OS transistor 2820 is connected to a wiring that supplies a voltage VSS.

Figure 48C:
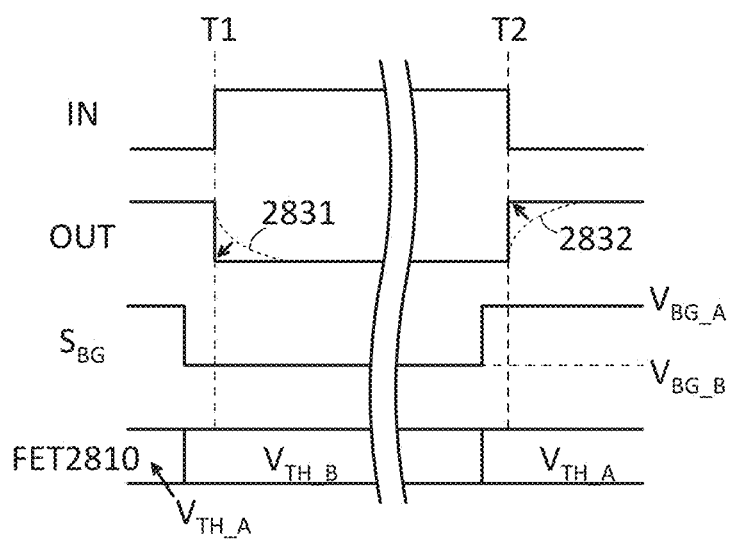

FIG. 48C is a timing chart illustrating the operation of the inverter 2800. The timing chart in FIG. 48C illustrates a signal waveform of the input terminal IN, a signal waveform of the output terminal OUT, a signal waveform of the signal $S_{BG}$, and a change in the threshold voltage of the OS transistor 2810.

The signal $S_{BG}$ supplied to the second gate of the OS transistor 2810 can control the threshold voltage of the OS transistor 2810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 2810 can be shifted in the negative direction to be a threshold voltage $V_{TH\_A}$ when the voltage $V_{BG\_A}$ is applied to the second gate. The threshold voltage of the OS transistor 2810 can be shifted in the positive direction to be a threshold voltage $V_{TH\_B}$ when the voltage $V_{BG\_B}$ is applied to the second gate.

Figure 49A:
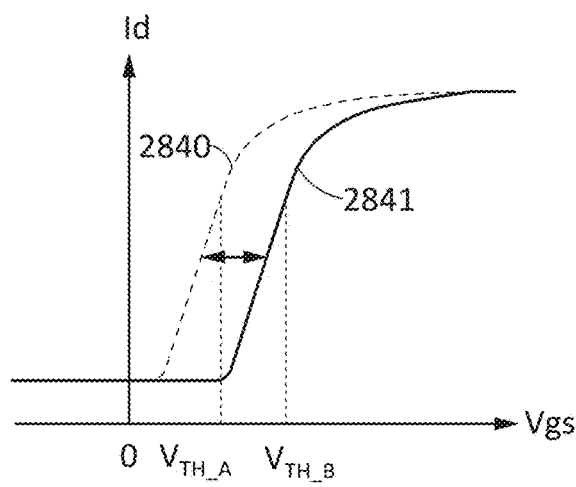
FIGS. 49A to 49C are a graph and circuit diagrams illustrating a semiconductor device of one embodiment of the present invention.

To visualize the above description, FIG. 49A shows a $V_g$-$I_d$ curve, which is one of the electrical characteristics of a transistor.

When a high voltage such as the voltage $V_{BG\_A}$ is applied to the second gate, the electrical characteristics of the OS transistor 2810 can be shifted to match a curve shown by a dashed line 2840 in FIG. 49A. When a low voltage such as the voltage $V_{BG\_B}$ is applied to the second gate, the electrical characteristics of the OS transistor 2810 can be shifted to match a curve shown by a solid line 2841 in FIG. 49A. As shown in FIG. 49A, switching the signal $S_{BG}$ between the voltage $V_{BG\_A}$ and the voltage $V_{BG\_B}$ enables the threshold voltage of the OS transistor 2810 to shift in the positive or the negative direction.

Figure 49B:
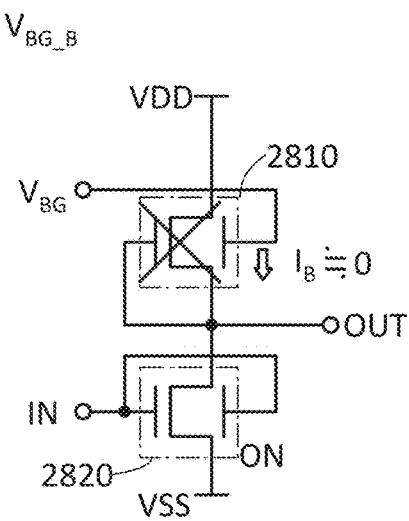

The shift of the threshold voltage in the positive direction toward the threshold voltage $V_{TH\_B}$ can make current less likely to flow in the OS transistor 2810. FIG. 49B visualizes the state. As illustrated in FIG. 49B, a current $I_B$ that flows in the OS transistor 2810 can be extremely low. Thus, when a signal supplied to the input terminal IN is at a high level and the OS transistor 2820 is on (ON), the voltage of the output terminal OUT can drop sharply.

Since a state in which current is less likely to flow in the OS transistor 2810 as illustrated in FIG. 49B can be obtained, a signal waveform 2831 of the output terminal in the timing chart in FIG. 48C can be made steep. Shoot-through current between the wiring that supplies the voltage VDD and the wiring that supplies the voltage VSS can be low, leading to low-power operation.

Figure 49C:
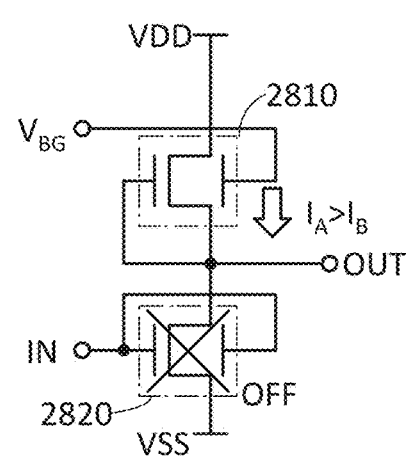

The shift of the threshold voltage in the negative direction toward the threshold voltage $V_{TH\_A}$ can make current flow easily in the OS transistor 2810. FIG. 49C visualizes the state. As illustrated in FIG. 49C, a current $I_A$ flowing at this time can be higher than at least the current $I_B$. Thus, when a signal supplied to the input terminal IN is at a low level and the OS transistor 2820 is off (OFF), the voltage of the output terminal OUT can be increased sharply.

Since a state in which current is likely to flow in the OS transistor 2810 as illustrated in FIG. 49C can be obtained, a signal waveform 2832 of the output terminal in the timing chart in FIG. 48C can be made steep.

Note that the threshold voltage of the OS transistor 2810 is preferably controlled by the signal $S_{BG}$ before the state of the OS transistor 2820 is switched, i.e., before Time T1 or T2. For example, as in FIG. 48C, it is preferable that the threshold voltage of the OS transistor 2810 be switched from the threshold voltage $V_{TH\_A}$ to the threshold voltage $V_{TH\_B}$ before Time T1 at which the level of the signal supplied to the input terminal IN is switched to a high level. Moreover, as in FIG. 48C, it is preferable that the threshold voltage of the OS transistor 2810 be switched from the threshold voltage $V_{TH\_B}$ to the threshold voltage $V_{TH\_A}$ before Time T2 at which the level of the signal supplied to the input terminal IN is switched to a low level.

Figure 50A:
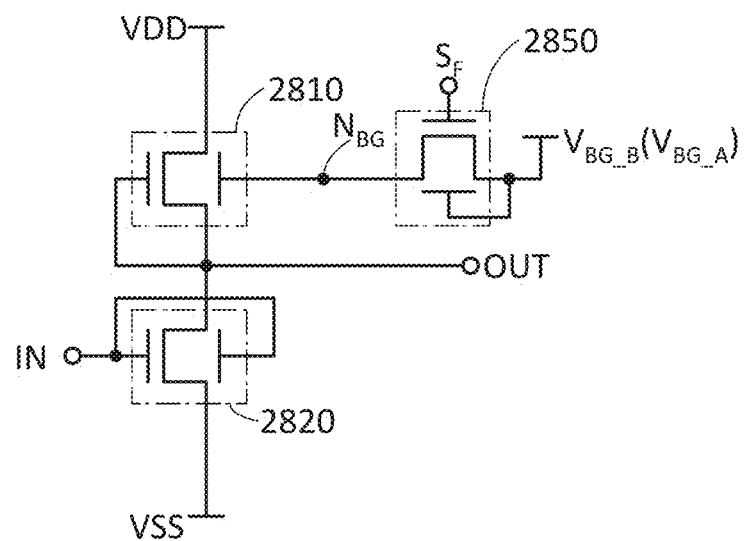
FIGS. 50A and 50B are a circuit diagram and a timing chart illustrating a semiconductor device of one embodiment of the present invention.

Although the timing chart in FIG. 48C illustrates the configuration in which the level of the signal $S_{BG}$ is switched in accordance with the signal supplied to the input terminal IN, a different configuration may be employed in which voltage for controlling the threshold voltage is held by the second gate of the OS transistor 2810 in a floating state, for example. FIG. 50A illustrates an example of such a circuit configuration.

The circuit configuration in FIG. 50A is the same as that in FIG. 48B, except that an OS transistor 2850 is additionally provided. A first terminal of the OS transistor 2850 is connected to the second gate of the OS transistor 2810. A second terminal of the OS transistor 2850 is connected to a wiring that supplies the voltage $V_{BG\_B}$ (or the voltage $V_{BG\_A}$). A first gate of the OS transistor 2850 is connected to a wiring that supplies a signal $S_F$. A second gate of the OS transistor 2850 is connected to the wiring that supplies the voltage $V_{BG\_B}$ (or the voltage $V_{BG\_A}$).

Figure 50B:
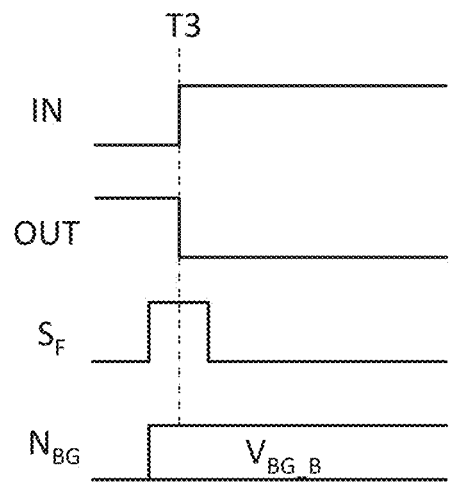

The operation with the circuit configuration in FIG. 50A will be described with reference to the timing chart in FIG. 50B.

The voltage for controlling the threshold voltage of the OS transistor 2810 is supplied to the second gate of the OS transistor 2810 before Time T3 at which the level of the signal supplied to the input terminal IN is switched to a high level. The signal $S_F$ is set to a high level and the OS transistor 2850 is turned on, so that the voltage $V_{BG\_B}$ for controlling the threshold voltage is supplied to a node $N_{BG}$.

The OS transistor 2850 is turned off after the voltage of the node $N_{BG}$ becomes $V_{BG\_B}$. Since the off-state current of the OS transistor 2850 is extremely low, the voltage $V_{BG\_B}$ held by the node $N_{BG}$ can be retained while the OS transistor 2850 remains off. Therefore, the number of times the voltage $V_{BG\_B}$ is supplied to the second gate of the OS transistor 2850 can be reduced and accordingly, the power consumption for rewriting the voltage $V_{BG\_B}$ can be reduced.

Figure 51A:
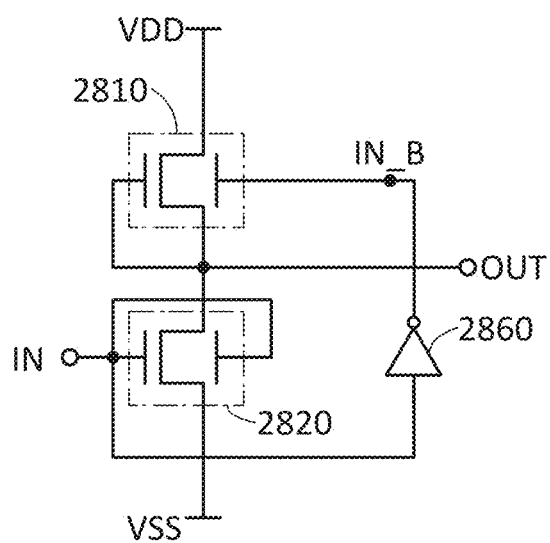
FIGS. 51A and 51B are a circuit diagram and a timing chart illustrating a semiconductor device of one embodiment of the present invention.

Although FIG. 48B and FIG. 50A each illustrate the case where the voltage is supplied to the second gate of the OS transistor 2810 by control from the outside, a different configuration may be employed in which voltage for controlling the threshold voltage is generated on the basis of the signal supplied to the input terminal IN and supplied to the second gate of the OS transistor 2810, for example. FIG. 51A illustrates an example of such a circuit configuration.

The circuit configuration in FIG. 51A is the same as that in FIG. 48B, except that a CMOS inverter 2860 is provided between the input terminal IN and the second gate of the OS transistor 2810. An input terminal of the CMOS inverter 2860 is connected to the input terminal IN. An output terminal of the CMOS inverter 2860 is connected to the second gate of the OS transistor 2810.

The operation with the circuit configuration in FIG. 51A is described with reference to a timing chart in FIG. 51B. The timing chart in FIG. 51B illustrates a signal waveform of the input terminal IN, a signal waveform of the output terminal OUT, an output waveform IN_B of the CMOS inverter 2860, and a change in the threshold voltage of the OS transistor 2810.

The output waveform IN_B which corresponds to a signal whose logic is inverted from the logic of the signal supplied to the input terminal IN can be used as a signal that controls the threshold voltage of the OS transistor 2810. Therefore, the threshold voltage of the OS transistor 2810 can be controlled as described with reference to FIGS. 49A to 49C. For example, the signal supplied to the input terminal IN is at a high level and the OS transistor 2820 is turned on at Time T4 in FIG. 51B. At this time, the output waveform IN_B is at a low level. Accordingly, current can be made less likely to flow in the OS transistor 2810; thus, a drop in the voltage of the output terminal OUT can be made steep.

Figure 51B:
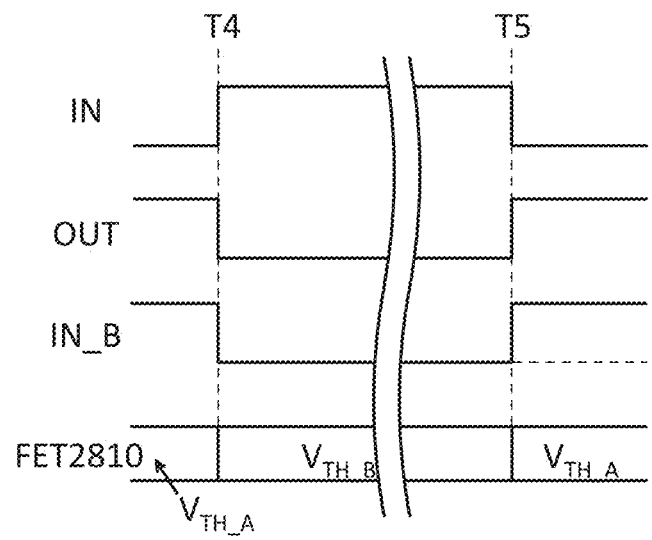

Moreover, the signal supplied to the input terminal IN is at a low level and the OS transistor 2820 is turned off at Time T5 in FIG. 51B. At this time, the output waveform IN_B is at a high level. Accordingly, current can easily flow in the OS transistor 2810; thus, a rise in the voltage of the output terminal OUT can be made steep.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can make a change in the voltage of the output terminal OUT steep. Moreover, shoot-through current between the wirings that supply power supply voltages can be reduced. Thus, power consumption can be reduced.

Note that this embodiment can be combined with any of the other embodiments in this specification as appropriate.

Embodiment 6

<RF Tag>

In this embodiment, an RF tag that includes the transistor or the memory device described in the above embodiment will be described with reference to FIG. 52.

The RF tag of this embodiment includes a memory circuit, stores necessary data in the memory circuit, and transmits and receives data to/from the outside by using a contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 52. FIG. 52 is a block diagram illustrating a configuration example of an RF tag.

Figure 52:
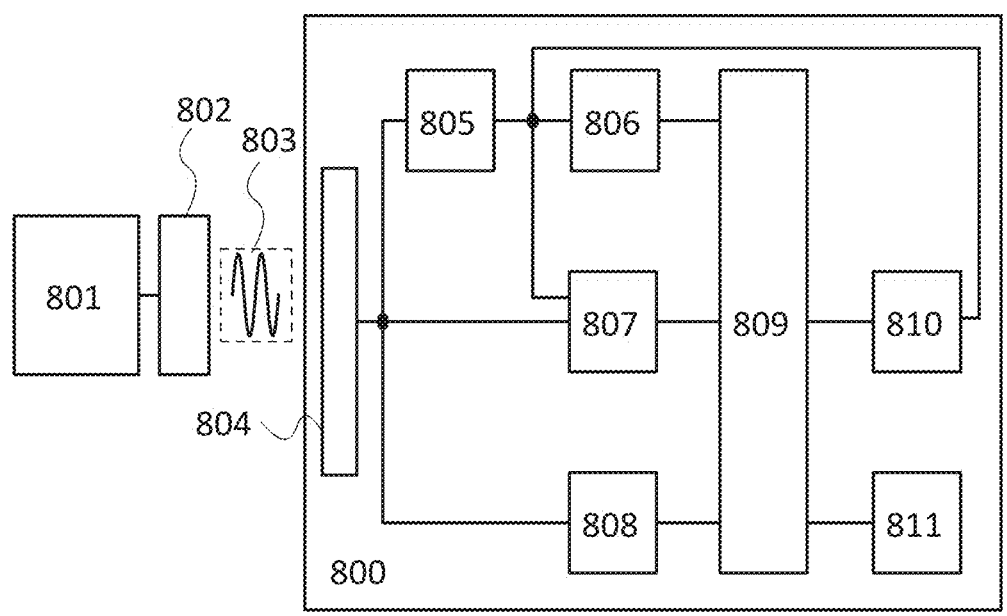
FIG. 52 illustrates a configuration example of an RF tag.

As shown in FIG. 52, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables reverse current to be low enough, for example, an oxide semiconductor. This can suppress the phenomenon of a rectifying function becoming weaker due to generation of reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils are provided so as to face each other and communicate with each other by mutual induction, an electromagnetic induction method in which communication is performed using an induction field, and a radio wave method in which communication is performed using a radio wave.

Any of these methods can be used in the RF tag 800 described in this embodiment.

Next, the configuration of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the semiconductor device described in the above embodiment can be used for the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

Note that this embodiment can be combined with any of the other embodiments in this specification as appropriate.

Embodiment 7

In this embodiment, a CPU that includes the memory device described in the above embodiment will be described.

Figure 53:
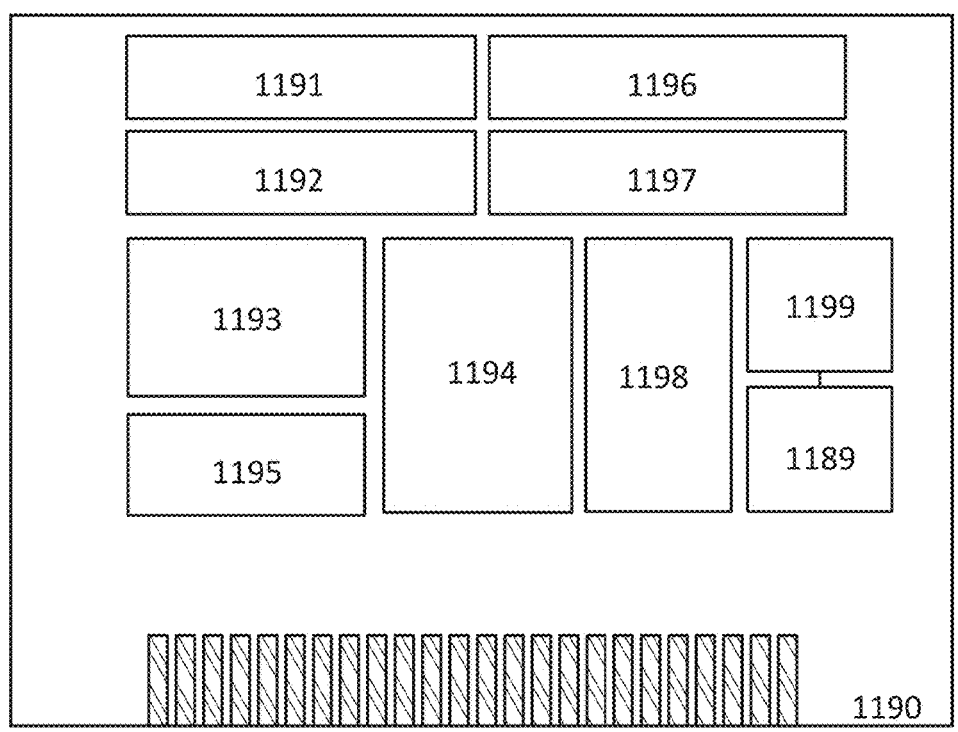
FIG. 53 illustrates a configuration example of a CPU.

FIG. 53 is a block diagram illustrating a configuration example of a CPU at least partly including the transistor described in the above embodiment as a component.

<Circuit Diagram of CPU>

The CPU illustrated in FIG. 53 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 53 is only an example with a simplified configuration, and an actual CPU may have a variety of configurations depending on the application. For example, the CPU may have the following configuration: a structure including the CPU illustrated in FIG. 53 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 53, a memory cell is provided in the register 1196. For the memory cell of the register 1196, the transistor described in Embodiment 1 can be used.

In the CPU illustrated in FIG. 53, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of power supply voltage to the memory cell in the register 1196 can be stopped.

<Memory Circuit>

Figure 54:
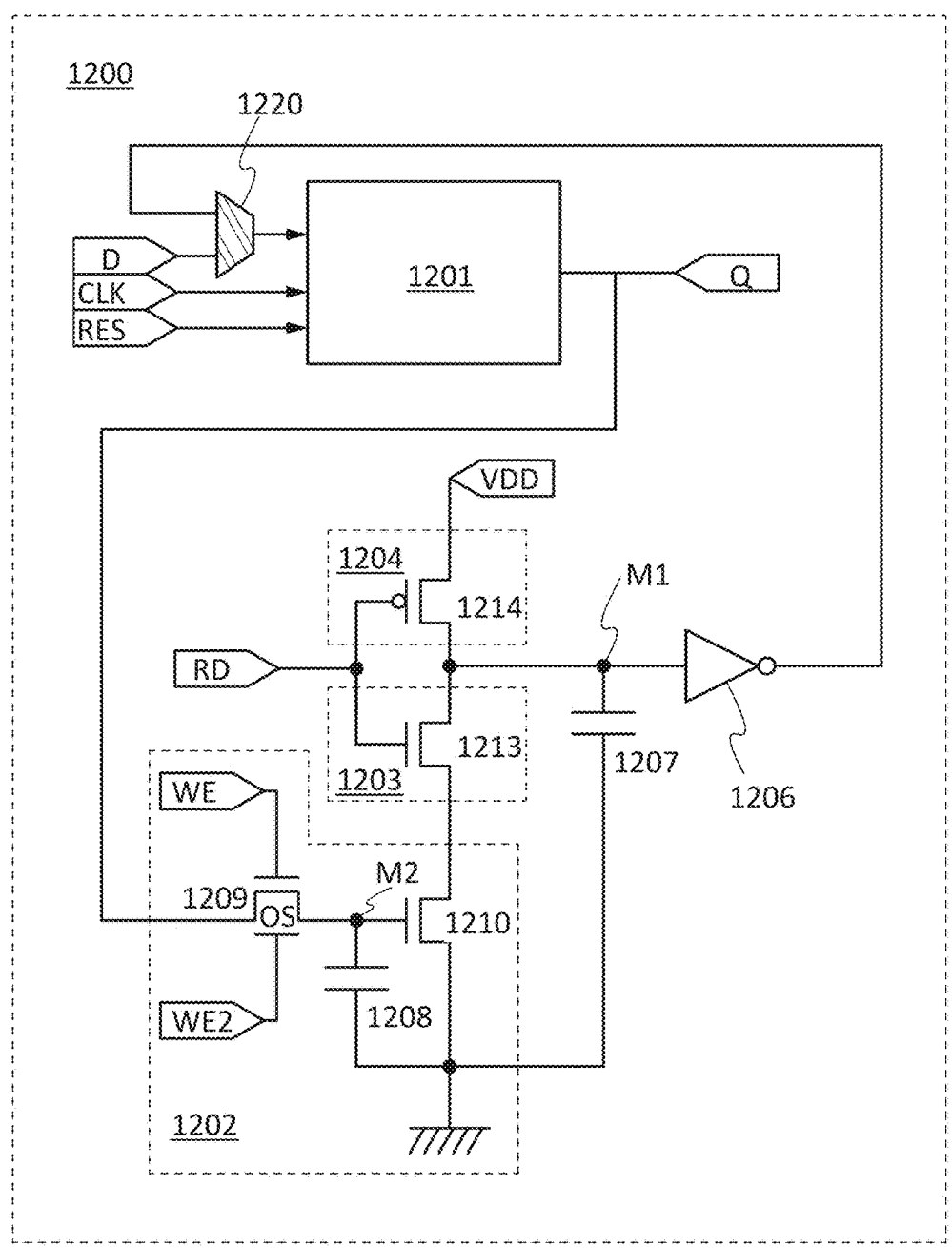
FIG. 54 is a circuit diagram of a memory element.

FIG. 54 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to a first terminal of the capacitor 1208 and a gate of the transistor 1210. Here, the connection portion is referred to as a node M2. One of a source and a drain of the transistor 1210 is electrically connected to a line that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and a first terminal of the capacitor 1207 are electrically connected to each other. Here, the connection portion is referred to as a node M1. A second terminal of the capacitor 1207 can be supplied with a constant potential, for example, a low power supply potential (e.g., GND) or a high power supply potential (e.g., VDD). The second terminal of the capacitor 1207 is electrically connected to the line that can supply a low power supply potential (e.g., a GND line). A second terminal of the capacitor 1208 can be supplied with a constant potential, for example, a low power supply potential (e.g., GND) or a high power supply potential (e.g., VDD). The second terminal of the capacitor 1208 is electrically connected to the line that can supply a low power supply potential (e.g., a GND line).

The capacitor 1207 and the capacitor 1208 are not necessarily provided in the case where the parasitic capacitance of the transistor, the wiring, or the like is actively utilized.

A control signal WE is input to the first gate (first gate electrode) of the transistor 1209. As for each of the switches 1203 and 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

Note that the transistor 1209 in FIG. 54 has a structure with a second gate (second gate electrode: back gate). The control signal WE can be input to the first gate and the control signal WE2 can be input to the second gate. The control signal WE2 is a signal having a constant potential. As the constant potential, for example, a ground potential GND or a potential lower than a source potential of the transistor 1209 is selected. The control signal WE2 is a potential signal for controlling the threshold voltage of the transistor 1209, and a current when gate voltage $V_G$ is 0 V can be further reduced. The control signal WE2 may be a signal having the same potential as the control signal WE. Note that as the transistor 1209, a transistor without a second gate may be used.

A signal corresponding to data retained in the circuit 1201 is input to the other of the source and the drain of the transistor 1209. FIG. 54 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 54, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 54, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer including a semiconductor other than an oxide semiconductor or in the substrate 1190 can be used for the rest of the transistors.

As the circuit 1201 in FIG. 54, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switches 1203 and 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after the supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency (RF) tag.

Note that this embodiment can be combined with any of the other embodiments in this specification as appropriate.

Embodiment 8

In this embodiment, configuration examples of a display device using a transistor of one embodiment of the present invention will be described.

<Circuit Configuration Example of Display Device>

Figure 55A:
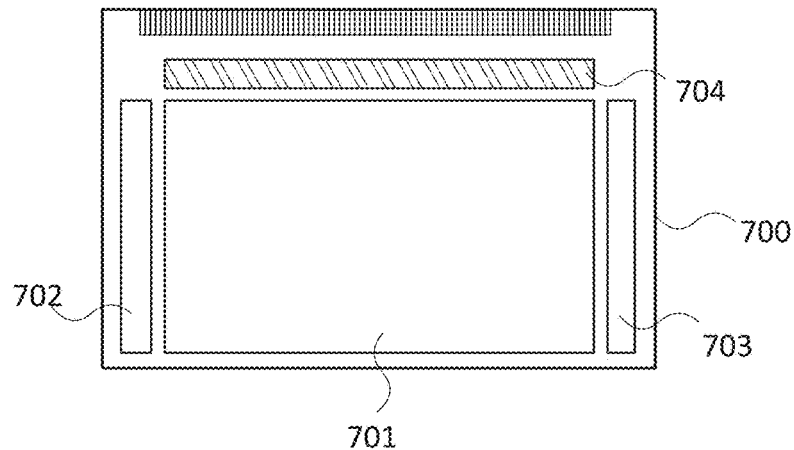
FIGS. 55A to 55C illustrate a configuration example of a display device and circuit diagrams of pixels.
Figure 55B:
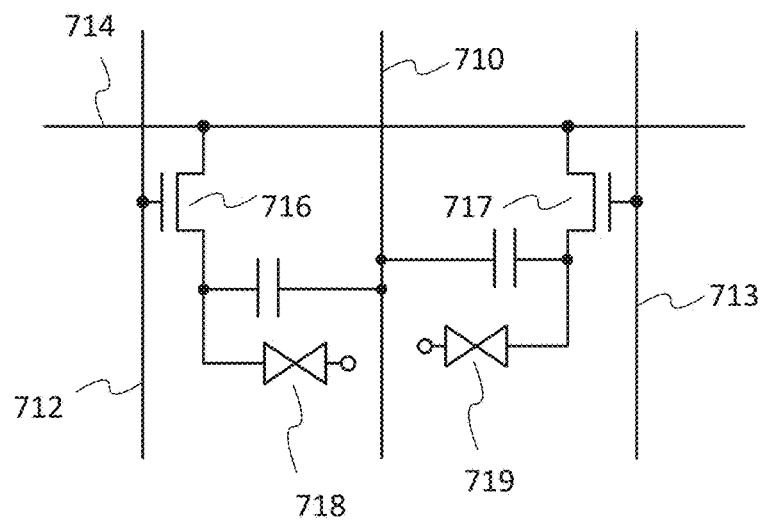

FIG. 55A is a top view of the display device of one embodiment of the present invention. FIG. 55B is a circuit diagram illustrating a pixel circuit that can be used in the case where a liquid crystal element is used in a pixel in the display device of one embodiment of the present invention.

Figure 55C:
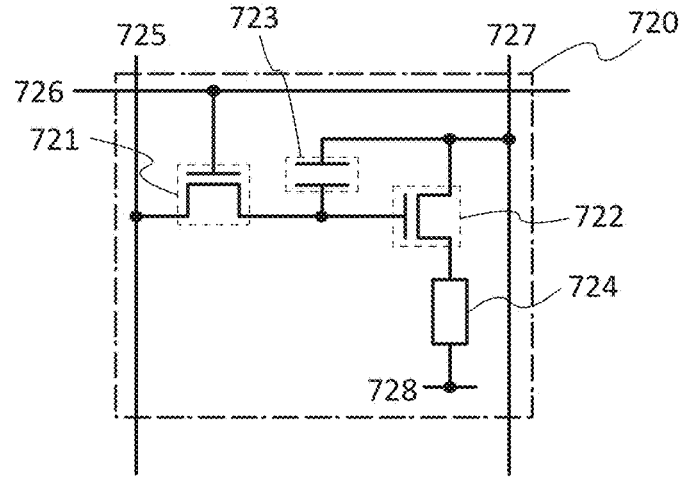

FIG. 55C is a circuit diagram illustrating a pixel circuit that can be used in the case where an organic EL element is used in a pixel in the display device of one embodiment of the present invention.

The transistor in the pixel portion can be formed in accordance with Embodiment 1. The transistor can be easily formed as an n-channel transistor, and thus part of a driver circuit that can be formed using an n-channel transistor can be formed over the same substrate as the transistor of the pixel portion. With the use of the transistor described in the above embodiment for the pixel portion or the driver circuit in this manner, a highly reliable display device can be provided.

FIG. 55A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extending from the signal line driver circuit 704 are arranged and a plurality of scan lines extending from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 55A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to extend and the number of wiring connections would increase. When the driver circuit is provided over the substrate 700, the number of wiring connections can be reduced. Consequently, an improvement in reliability or yield can be achieved. One or more of the first scan line driver circuit 702, the second scan line driver circuit 703, and the signal line driver circuit 704 may be mounted on the substrate 700 or provided outside the substrate 700.

<Liquid Crystal Display Device>

FIG. 55B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A scan line 712 of a transistor 716 and a scan line 713 of a transistor 717 are separated so that different gate signals can be supplied thereto. In contrast, a signal line 714 is shared by the transistors 716 and 717. The transistor described in Embodiment 1 can be used as appropriate as each of the transistors 716 and 717. Thus, a highly reliable liquid crystal display device can be provided.

A first pixel electrode layer is electrically connected to the transistor 716 and a second pixel electrode layer is electrically connected to the transistor 717. The first pixel electrode layer and the second pixel electrode layer are separated. There is no particular limitation on the shapes of the first pixel electrode layer and the second pixel electrode layer. For example, the first pixel electrode layer may have a V-like shape.

A gate electrode of the transistor 716 is connected to the scan line 712, and a gate electrode of the transistor 717 is connected to the scan line 713. When different gate signals are supplied to the scan line 712 and the scan line 713, operation timings of the transistor 716 and the transistor 717 can be varied. As a result, alignment of liquid crystals can be controlled.

Furthermore, a storage capacitor may be formed using a capacitor wiring 710, a gate insulating layer functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that illustrated in FIG. 55B. For example, a switch, a resistor, a capacitor, a transistor, a sensor, a logic circuit, or the like may be added to the pixel circuit illustrated in FIG. 55B.

The transistor described in the above embodiment can be used as each of the transistors 716 and 717.

FIGS. 56A and 56B are examples of a top view and a cross-sectional view of a liquid crystal display device. Note that FIG. 56A illustrates a typical structure including a display device 20, a display region 21, a peripheral circuit 22, and flexible printed circuits (FPCs) 42. The display device illustrated in FIGS. 56A and 56B uses a reflective liquid crystal element.

FIG. 56B is a cross-sectional view taken along dashed lines A1-A2, B1-B2, C1-C2, and D1-D2 in FIG. 56A. The cross section taken along dashed line A1-A2 illustrates the peripheral circuit portion, the cross section taken along dashed line B1-B2 illustrates the display region, and the cross sections taken along dashed lines C1-C2 and D1-D2 illustrate a portion connected to the FPC.

The display device 20 using the liquid crystal element includes the following in addition to transistors 50 and 52 (the transistor 10 described in Embodiment 1): a conductive layer 465, a conductive layer 497, an insulating layer 420, a liquid crystal layer 490, a liquid crystal element 80, a capacitor 60, a capacitor 62, an insulating layer 430, a spacer 440, a coloring layer 460, a bonding layer 470, a conductive layer 480, a light-shielding layer 418, a substrate 400, a bonding layer 473, a bonding layer 474, a bonding layer 475, a bonding layer 476, a polarizing plate 403, a protective substrate 405, a protective substrate 402, and an anisotropic conductive layer 510.

<Organic EL Display Device>

FIG. 55C illustrates another example of a circuit configuration of the pixel. Here, a pixel structure of a display device using an organic EL element is illustrated.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 55C illustrates an applicable example of a pixel circuit. Here, one pixel includes two n-channel transistors. Furthermore, digital time grayscale driving can be employed for the pixel circuit.

The configuration of the applicable pixel circuit and the operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in Embodiment 1 can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727, and can be, for example, GND or 0 V. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that the gate capacitance of the driver transistor 722 may be used as a substitute for the capacitor 723, so that the capacitor 723 can be omitted.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that a voltage higher than or equal to a voltage which is the sum of power supply line voltage and the threshold voltage $V_{th}$ of the driver transistor 722 is applied to the signal line 725.

In the case of performing analog grayscale driving, a voltage higher than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that illustrated in FIG. 55C. For example, a switch, a resistor, a capacitor, a sensor, a transistor, a logic circuit, or the like may be added to the pixel circuit illustrated in FIG. 55C.

In the case where the transistor described in the above embodiment is used for the circuit illustrated in FIG. 55C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

As the switching transistor 721 and the driver transistor 722, the transistor described in the above embodiment can be used.

Figure 57A:
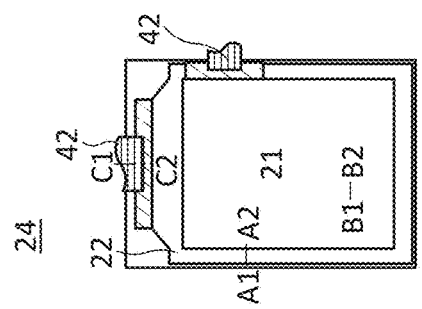
FIGS. 57A and 57B are a top view and a cross-sectional view of a light-emitting device.
Figure 57B:
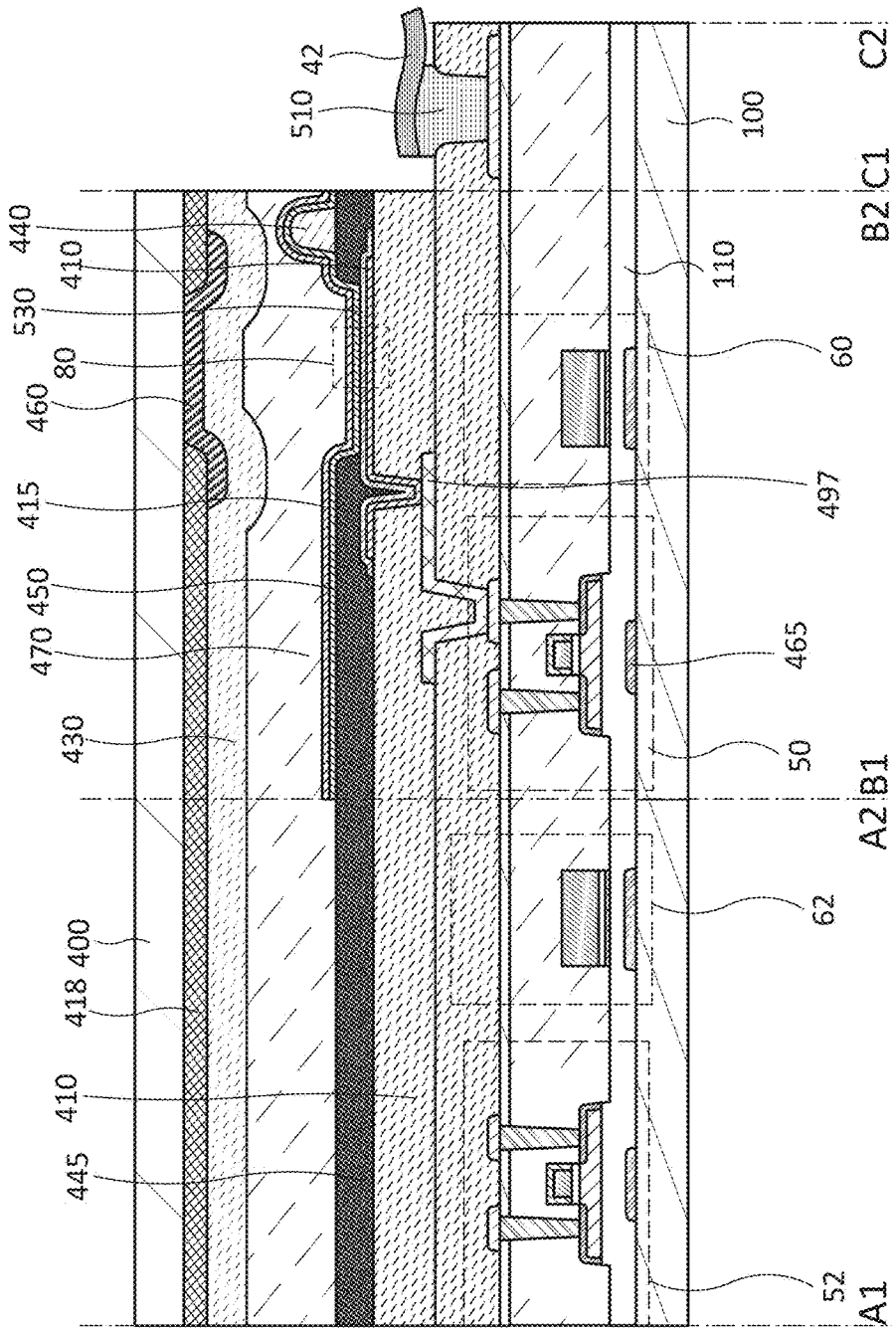

FIGS. 57A and 57B are examples of a top view and a cross-sectional view of a display device using a light-emitting element. Note that FIG. 57A illustrates a typical structure including a display device 24, the display region 21, the peripheral circuit 22, and the flexible printed circuit (FPC) 42.

FIG. 57B is a cross-sectional view taken along dashed lines A1-A2, B1-B2, and C1-C2 in FIG. 57A. The cross section taken along dashed line A1-A2 illustrates the peripheral circuit portion, the cross section taken along dashed line B1-B2 illustrates the display region, and the cross section taken along dashed line C1-C2 illustrates a portion connected to the FPC.

The display device 24 using the light-emitting element includes the following in addition to the transistors 50 and 52 (the transistor 10 described in Embodiment 1): the conductive layer 465, the conductive layer 497, a conductive layer 410, an optical adjustment layer 530, an EL layer 450, a conductive layer 415, a light-emitting element 70, the capacitor 60, the capacitor 62, the insulating layer 430, the spacer 440, the coloring layer 460, the bonding layer 470, a partition 445, the light-shielding layer 418, the substrate 400, and the anisotropic conductive layer 510.

In this specification and the like, a display element, a display device which is a device including a display element, a light-emitting element, and a light-emitting device which is a device including a light-emitting element can employ a variety of modes or can include a variety of elements, for example. A display element, a display device, a light-emitting element, or a light-emitting device include at least one of the following, for example: an EL (electroluminescent) element (e.g., an EL element including organic and inorganic materials, an organic EL element, or an inorganic EL element), an LED (e.g., a white LED, a red LED, a green LED, or a blue LED), a quantum dot, a transistor (a transistor which emits light depending on current), an electron emitter, a liquid crystal element, electronic ink, an electrophoretic element, a grating light valve (GLV), a plasma display panel (PDP), micro electro mechanical systems (MEMS), a digital micromirror device (DMD), a digital micro shutter (DMS), MIRASOL (registered trademark), an interferometric modulator display (IMOD) element, an electrowetting element, a piezoelectric ceramic display, and a display element using a carbon nanotube. Other than the above, display media whose contrast, luminance, reflectivity, transmittance, or the like is changed by electric or electromagnetic action may be included. Note that examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices including electronic ink or electrophoretic elements include electronic paper.

Note that this embodiment can be combined with any of the other embodiments in this specification as appropriate.

Embodiment 9

In this embodiment, a display module using a semiconductor device of one embodiment of the present invention will be described with reference to FIG. 58.

<Display Module>

Figure 58:
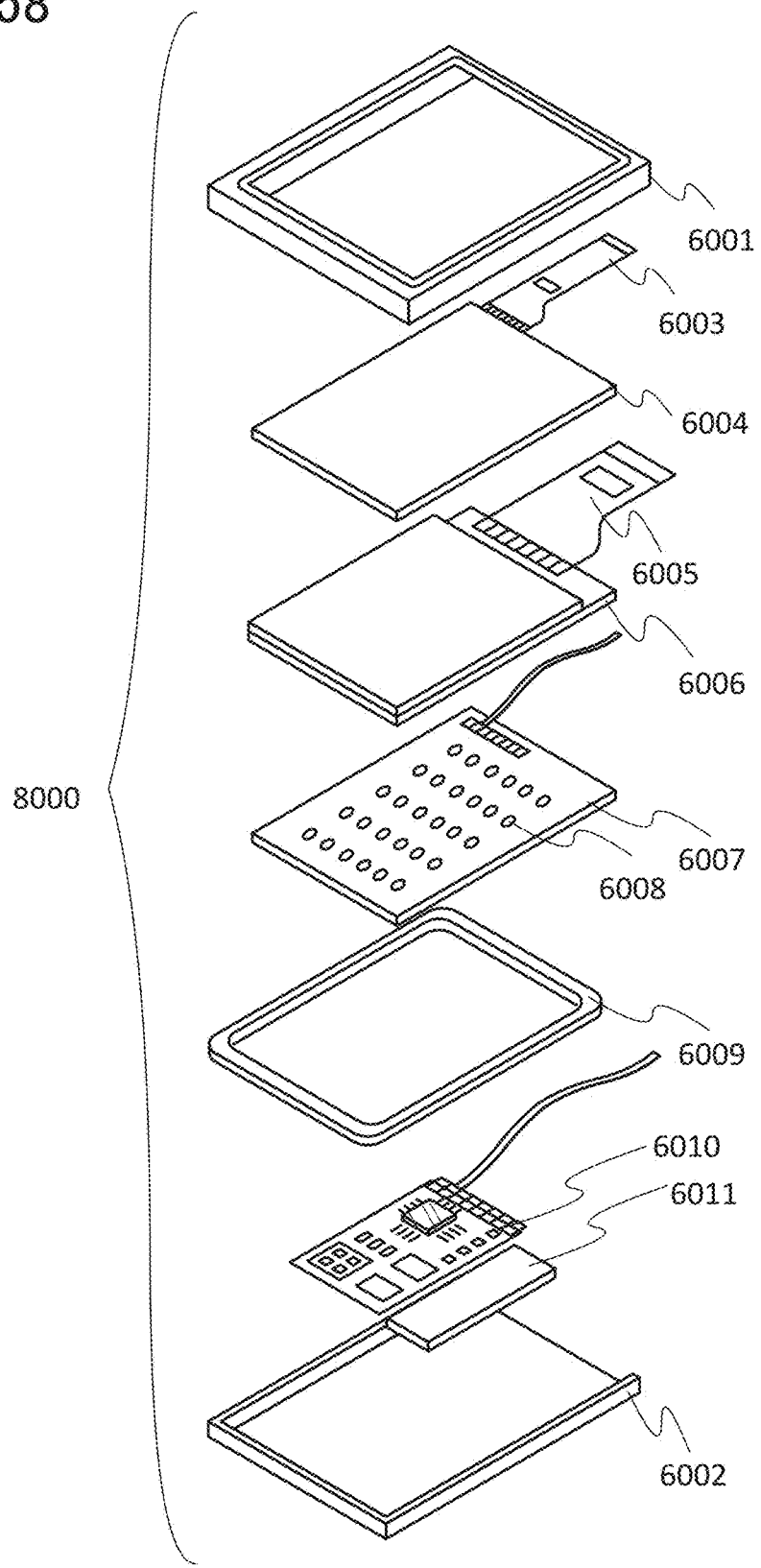
FIG. 58 illustrates a display module.

In a display module 6000 in FIG. 58, a touch panel 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch panel 6004, and the like are not provided in some cases.

The semiconductor device of one embodiment of the present invention can be used for, for example, the display panel 6006 and an integrated circuit mounted on a printed circuit board.

The shapes and sizes of the upper cover 6001 and the lower cover 6002 can be changed as appropriate in accordance with the sizes of the touch panel 6004 and the display panel 6006.

The touch panel 6004 can be a resistive touch panel or a capacitive touch panel and may be formed to overlap with the display panel 6006. A counter substrate (sealing substrate) of the display panel 6006 can have a touch panel function. A photosensor may be provided in each pixel of the display panel 6006 so that an optical touch panel function is added. An electrode for a touch sensor may be provided in each pixel of the display panel 6006 so that a capacitive touch panel function is added.

The backlight unit 6007 includes a light source 6008. The light source 6008 may be provided at an end portion of the backlight unit 6007 and a light diffusing plate may be used.

The frame 6009 protects the display panel 6006 and also functions as an electromagnetic shield for blocking electromagnetic waves generated from the printed circuit board 6010. The frame 6009 may function as a radiator plate.

The printed circuit board 6010 has a power supply circuit and a signal processing circuit for outputting a video signal and a clock signal. As a power source for supplying power to the power supply circuit, an external commercial power source or the battery 6011 provided separately may be used. Note that the battery 6011 is not necessary in the case where a commercial power source is used.

The display module 6000 can be additionally provided with a member such as a polarizing plate, a retardation plate, or a prism sheet.

Note that this embodiment can be combined with any of the other embodiments in this specification as appropriate.

Embodiment 10

In this embodiment, application examples of the semiconductor device of one embodiment of the present invention will be described.

<Package Using Lead Frame Interposer>

Figure 59A:
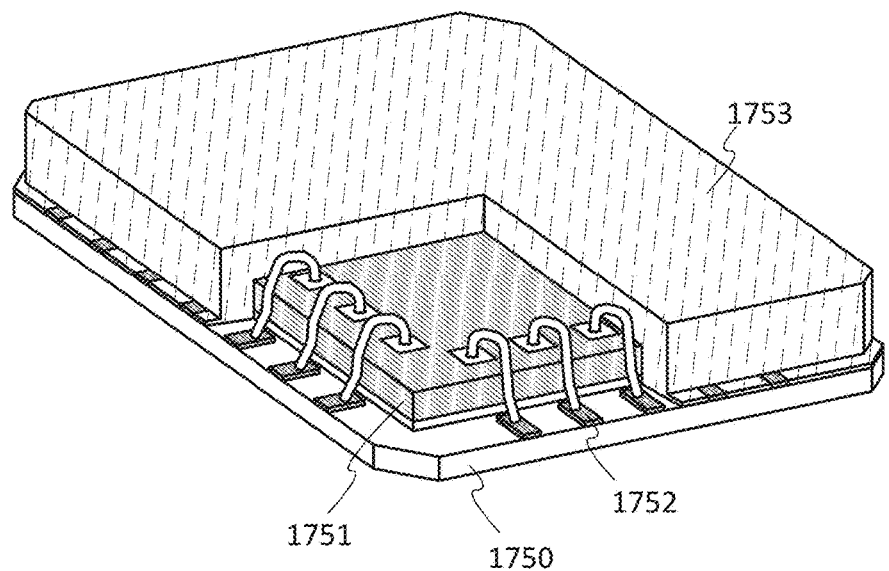
FIGS. 59A and 59B illustrate a package using a lead frame interposer.

FIG. 59A is a perspective view illustrating a cross-sectional structure of a package using a lead frame interposer. In the package illustrated in FIG. 59A, a chip 1751 corresponding to the semiconductor device of one embodiment of the present invention is connected to a terminal 1752 over an interposer 1750 by wire bonding. The terminal 1752 is placed on a surface of the interposer 1750 on which the chip 1751 is mounted. The chip 1751 may be sealed by a mold resin 1753, in which case the chip 1751 is sealed such that part of each of the terminals 1752 is exposed.

Figure 59B:
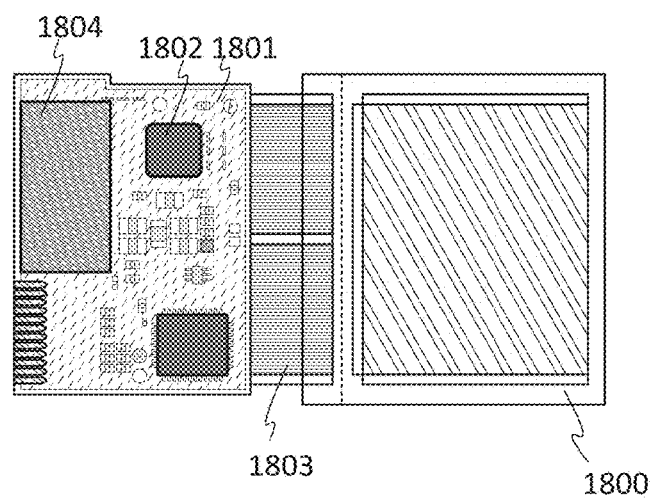

FIG. 59B illustrates the structure of a module of an electronic appliance (mobile phone) in which a package is mounted on a circuit board. In the module of the mobile phone in FIG. 59B, a package 1802 and a battery 1804 are mounted on a printed wiring board 1801. The printed wiring board 1801 is mounted on a panel 1800 including a display element by an FPC 1803.

Note that this embodiment can be combined with any of the other embodiments in this specification as appropriate.

Embodiment 11

In this embodiment, electronic appliances and lighting devices of embodiments of the present invention will be described with reference to drawings.

<Electronic Appliance>

Electronic appliances and lighting devices can be fabricated using the semiconductor device of one embodiment of the present invention. In addition, highly reliable electronic appliances and lighting devices can be fabricated using the semiconductor device of one embodiment of the present invention. Furthermore, electronic appliances and lighting devices including touch sensors with improved detection sensitivity can be fabricated using the semiconductor device of one embodiment of the present invention.

Examples of electronic appliances are television devices (also referred to as TVs or television receivers), monitors for computers and the like, cameras such as digital cameras and digital video cameras, digital photo frames, cellular phones (also referred to as mobile phones or portable telephone devices), portable game machines, portable information terminals, audio playback devices, large game machines such as pin-ball machines, and the like.

In the case of having flexibility, the electronic appliance or lighting device of one embodiment of the present invention can be incorporated along a curved inside/outside wall surface of a house or a building or a curved interior/exterior surface of a car.

Furthermore, the electronic appliance of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic appliance of one embodiment of the present invention may include an antenna. When a signal is received by the antenna, the electronic appliance can display an image, data, or the like on a display portion. When the electronic appliance includes a secondary battery, the antenna may be used for non-contact power transmission.

Figure 60A:
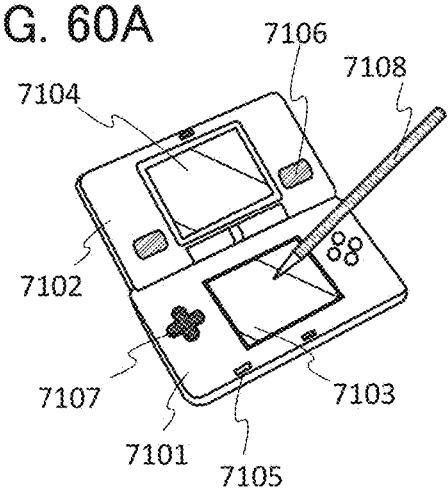
FIGS. 60A to 60E illustrate electronic appliances.

FIG. 60A illustrates a portable game machine including a housing 7101, a housing 7102, a display portion 7103, a display portion 7104, a microphone 7105, speakers 7106, an operation key 7107, a stylus 7108, and the like. The semiconductor device of one embodiment of the present invention can be used for an integrated circuit, a CPU, or the like incorporated in the housing 7101. When a normally-off CPU is used as the CPU, power consumption can be reduced, allowing a user to enjoy playing a game for longer than before. When the semiconductor device of one embodiment of the present invention is used as the display portion 7103 or 7104, it is possible to provide a user-friendly portable game machine with quality that hardly deteriorates. Although the portable game machine illustrated in FIG. 60A includes two display portions, the display portion 7103 and the display portion 7104, the number of display portions included in the portable game machine is not limited to two.

Figure 60B:
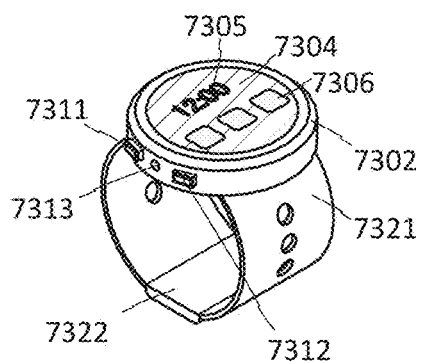

FIG. 60B illustrates a smart watch, which includes a housing 7302, a display portion 7304, operation buttons 7311 and 7312, a connection terminal 7313, a band 7321, a clasp 7322, and the like. The semiconductor device of one embodiment of the present invention can be used for a memory, a CPU, or the like incorporated in the housing 7302. Note that when the display is a reflective liquid crystal panel and the CPU is a normally-off CPU in FIG. 60B, power consumption can be reduced, leading to a reduction in the number of times of daily charging.

Figure 60C:
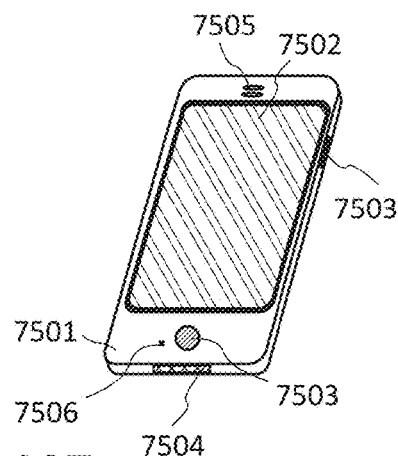

FIG. 60C illustrates a portable information terminal, which includes a display portion 7502 incorporated in a housing 7501, operation buttons 7503, an external connection port 7504, a speaker 7505, a microphone 7506, a display portion 7502, and the like. The semiconductor device of one embodiment of the present invention can be used for a mobile memory, a CPU, or the like incorporated in the housing 7501. Note that when a normally-off CPU is used, the number of times of charging can be reduced. The display portion 7502 is small- or medium-sized but can perform full high vision, 4 k, or 8 k display because it has greatly high resolution; therefore, a significantly clear image can be obtained.

Figure 60D:
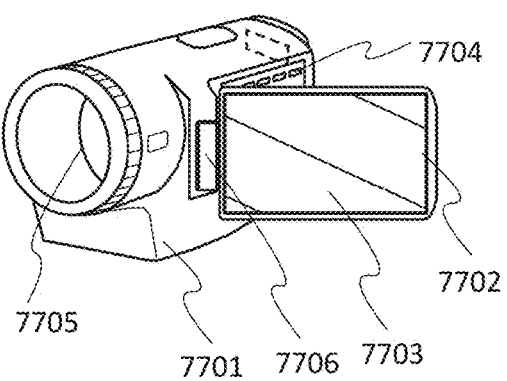

FIG. 60D illustrates a video camera including a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. The first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The imaging device of one embodiment of the present invention can be used in a portion corresponding to a focus of the lens 7705. The semiconductor device of one embodiment of the present invention can be used for an integrated circuit, a CPU, or the like incorporated in the first housing 7701.

Figure 60E:
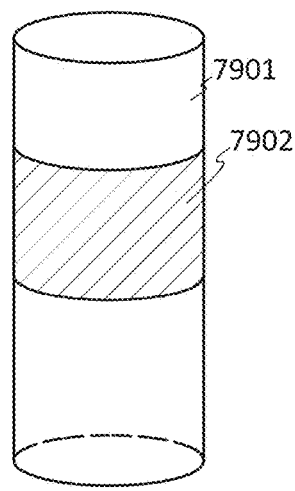

FIG. 60E illustrates a digital signage including a display portion 7902 provided on a utility pole 7901. The semiconductor device of one embodiment of the present invention can be used for a display panel of the display portion 7902 and an incorporated control circuit.

Figure 61A:
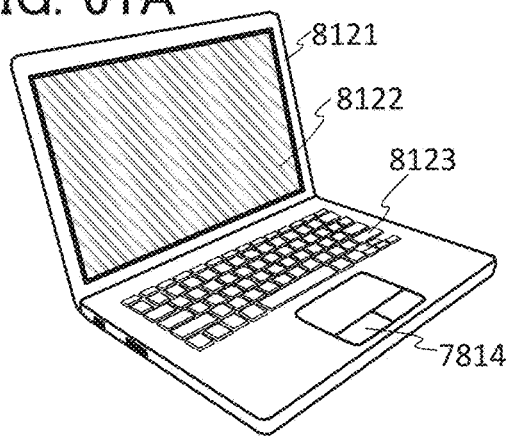
FIGS. 61A to 61D illustrate electronic appliances.

FIG. 61A illustrates a notebook personal computer, which includes a housing 8121, a display portion 8122, a keyboard 8123, a pointing device 8124, and the like. The semiconductor device of one embodiment of the present invention can be used for a CPU, a memory, or the like incorporated in the housing 8121. Note that the display portion 8122 is small- or medium-sized but can perform 8 display because it has greatly high resolution; therefore, a significantly clear image can be obtained.

Figure 61B:
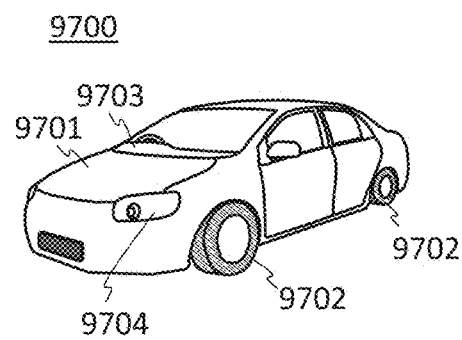
Figure 61C:
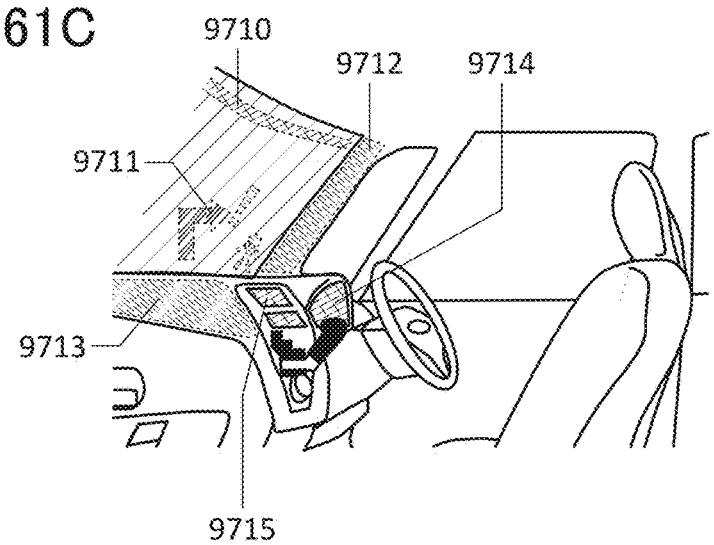

FIG. 61B is an external view of an automobile 9700. FIG. 61C illustrates a driver's seat of the automobile 9700. The automobile 9700 includes a car body 9701, wheels 9702, a dashboard 9703, lights 9704, and the like. The semiconductor device of one embodiment of the present invention can be used in a display portion and a control integrated circuit of the automobile 9700. For example, the semiconductor device of one embodiment of the present invention can be used in display portions 9710 to 9715 illustrated in FIG. 61C.

The display portion 9710 and the display portion 9711 are display devices or input/output devices provided in an automobile windshield. The display device or input/output device of one embodiment of the present invention can be a see-through display device or input/output device, through which the opposite side can be seen, by using a light-transmitting conductive material for its electrodes. Such a see-through display device or input/output device does not hinder driver's vision during the driving of the automobile 9700. Therefore, the display device or input/output device of one embodiment of the present invention can be provided in the windshield of the automobile 9700. Note that in the case where a transistor or the like for driving the display device or input/output device is provided in the display device or input/output device, a transistor having light-transmitting properties, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar portion by showing an image taken by an imaging unit provided on the car body. The display portion 9713 is a display device provided on a dashboard portion. For example, the display portion 9713 can compensate for the view hindered by the dashboard portion by showing an image taken by an imaging unit provided on the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

Figure 61D:
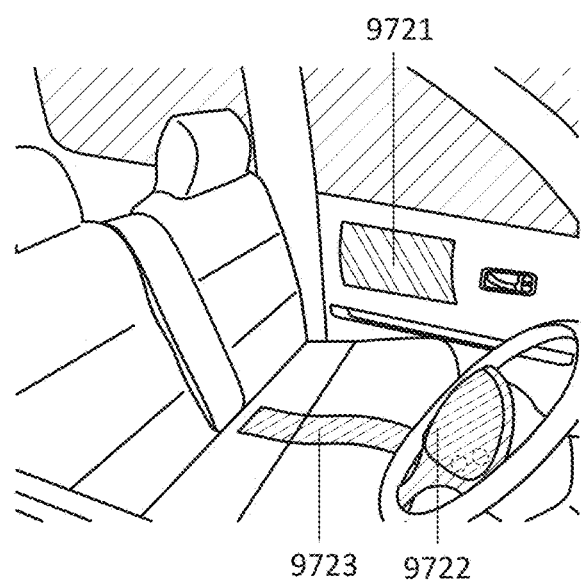

FIG. 61D illustrates the inside of a car in which a bench seat is used as a driver seat and a front passenger seat. A display portion 9721 is a display device or an input/output device provided in a door portion. For example, the display portion 9721 can compensate for the view hindered by the door portion by showing an image taken by an imaging unit provided on the car body. A display portion 9722 is a display device provided in a steering wheel. A display portion 9723 is a display device provided in the middle of a seating face of the bench seat. Note that the display device can be used as a seat heater by providing the display device on the seating face or backrest and by using heat generated by the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Figure 62A:
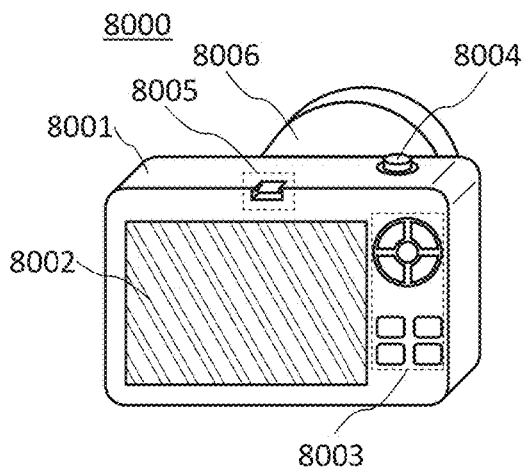
FIGS. 62A to 62C illustrate electronic appliances.

FIG. 62A is an external view of a camera 8000. The camera 8000 includes a housing 8001, a display portion 8002, an operation button 8003, a shutter button 8004, a connection portion 8005, and the like. A lens 8006 can be put on the camera 8000.

The connection portion 8005 includes an electrode to connect a finder 8100, which will be described below, a stroboscope, or the like.

Although the lens 8006 of the camera 8000 here is detachable from the housing 8001 for replacement, the lens 8006 may be included in the housing 8001.

Images can be taken at the press of the shutter button 8004. In addition, images can be taken at the touch of the display portion 8002 which serves as a touch panel.

The display device or input/output device of one embodiment of the present invention can be used in the display portion 8002.

Figure 62B:
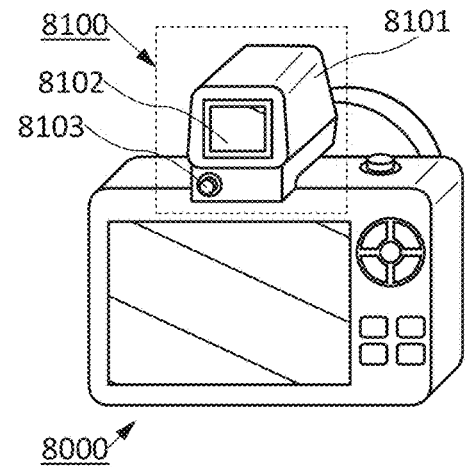

FIG. 62B illustrates the camera 8000 with the finder 8100 connected.

The finder 8100 includes a housing 8101, a display portion 8102, a button 8103, and the like.

The housing 8101 includes a connection portion for engagement with the connection portion 8005 of the camera 8000 so that the finder 8100 can be connected to the camera 8000. The connection portion includes an electrode, and an image or the like received from the camera 8000 through the electrode can be displayed on the display portion 8102.

The button 8103 has a function of a power button, and the display portion 8102 can be turned on and off with the button 8103.

The semiconductor device of one embodiment of the present invention can be used for an integrated circuit and an image sensor included in the housing 8101.

Although the camera 8000 and the finder 8100 are separate and detachable electronic appliances in FIGS. 62A and 62B, the housing 8001 of the camera 8000 may include a finder having the display device or input/output device of one embodiment of the present invention.

Figure 62C:
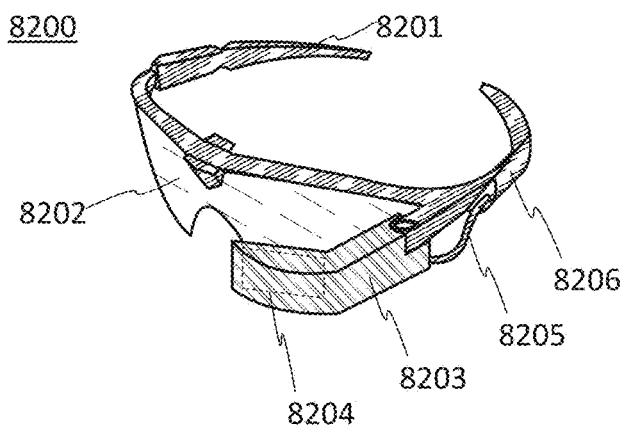

FIG. 62C is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye point of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The semiconductor device of one embodiment of the present invention can be used for an integrated circuit included in the main body 8203.

At least part of this embodiment can be implemented in combination with any of the embodiments described in this specification as appropriate.

Embodiment 12

In this embodiment, application examples of an RF tag using the semiconductor device of one embodiment of the present invention will be described with reference to FIGS. 63A to 63F.

<Application Examples of RF Tag>

Figure 63A:
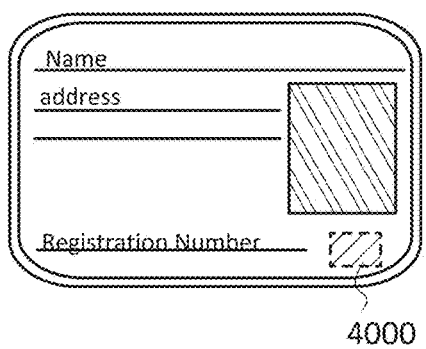
FIGS. 63A to 63F illustrate electronic appliances.
Figure 63B:
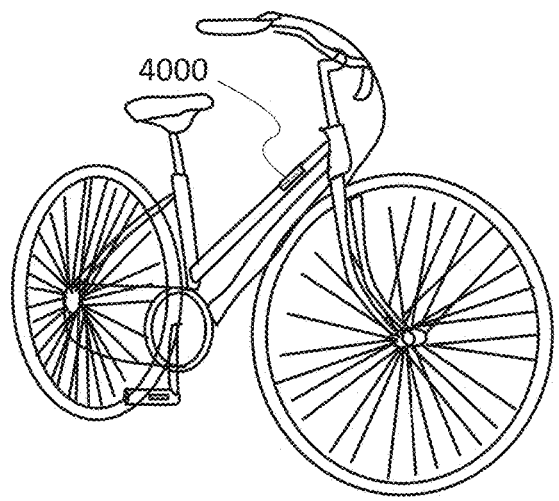
Figure 63C:
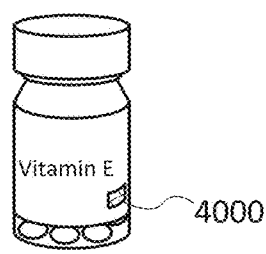
Figure 63D:
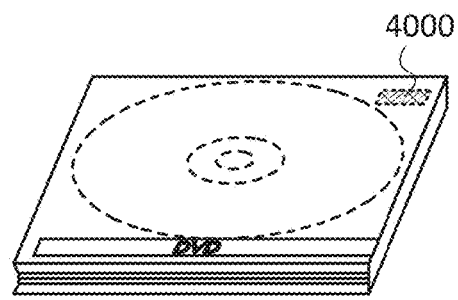
Figure 63E:
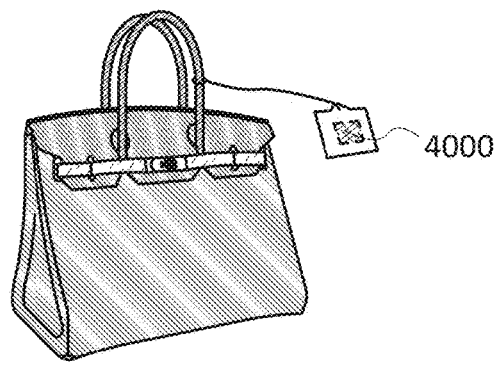
Figure 63F:
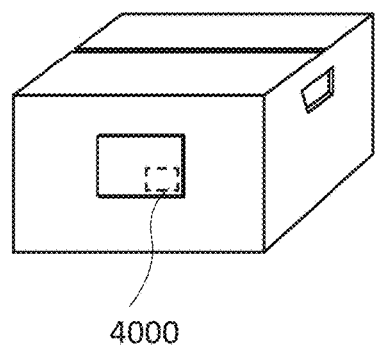

The RF tag is widely used and can be provided for, for example, products such as bills, coins, securities, bearer bonds, documents (e.g., driver's licenses or resident's cards, see FIG. 63A), vehicles (e.g., bicycles, see FIG. 63B), packaging containers (e.g., wrapping paper or bottles, see FIG. 63C), recording media (e.g., DVD or video tapes, see FIG. 63D), personal belongings (e.g., bags or glasses), foods, plants, animals, human bodies, clothing, household goods, medical supplies such as medicine and chemicals, and electronic appliances (e.g., liquid crystal display devices, EL display devices, television sets, or mobile phones), or tags on products (see FIGS. 63E and 63F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic appliances, or the like. Vehicles can also have higher security against theft or the like by being provided with the RF tag of one embodiment of the present invention.

As described above, by using the RF tag including the semiconductor device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be favorably used for application in which data is not frequently written or read.

Note that this embodiment can be combined with any of the other embodiments in this specification as appropriate.

This application is based on Japanese Patent Application serial No. 2015-187038 filed with Japan Patent Office on Sep. 24, 2015, the entire contents of which are hereby incorporated by reference.

What is claimed is:

1. A method for manufacturing a semiconductor device, comprising the steps of:
    forming a first oxide layer;
    selectively processing the first oxide layer to form a second oxide layer;
    forming a first insulating layer over the second oxide layer;
    forming a first sacrificial layer over the first insulating layer;
    selectively processing the first insulating layer and the first sacrificial layer to form a second insulating layer and a second sacrificial layer;
    forming a conductive layer over the second oxide layer, the second insulating layer, and the second sacrificial layer; and
    performing heat treatment after formation of the conductive layer, whereby forming a first mixed layer in a region of the second oxide layer that is in contact with the conductive layer and forming a second mixed layer in a region of the second sacrificial layer that is in contact with the conductive layer,
    wherein the first mixed layer includes at least one of elements included in the conductive layer,
    wherein the second mixed layer includes at least one of elements included in the conductive layer,
    wherein the conductive layer includes at least one of aluminum, molybdenum, titanium, tantalum, tungsten, nickel, cobalt, and platinum,
    wherein a resistance value of the first mixed layer is smaller than that of the second oxide layer, and
    wherein the second sacrificial layer and the second mixed layer serve as a gate electrode.

2. The method according to claim 1,
    wherein a resistance value of the second mixed layer is smaller than that of the second sacrificial layer.

3. The method according to claim 1,
    wherein the conductive layer is removed after formation of the first mixed layer and the second mixed layer.

4. The method according to claim 1,
    wherein the heat treatment is performed at a temperature higher than or equal to 200° C. and lower than or equal to 400° C.

5. A method for manufacturing a semiconductor device, comprising the steps of:
    forming a first oxide layer;
    selectively processing the first oxide layer to form a second oxide layer;
    forming a first insulating layer over the second oxide layer;
    forming a first sacrificial layer over the first insulating layer;
    selectively processing the first insulating layer and the first sacrificial layer to form a second insulating layer and a second sacrificial layer;

forming a first conductive layer over the second oxide layer, the second insulating layer, and the second sacrificial layer;

performing heat treatment after formation of the first conductive layer, whereby forming a mixed layer in a region of the second oxide layer that is in contact with the first conductive layer;

forming a third insulating layer over the mixed layer and the second sacrificial layer;

removing part of the third insulating layer to expose a top surface of the second sacrificial layer;

removing the second sacrificial layer; and forming a second conductive layer over the second insulating layer, wherein the mixed layer includes at least one of elements included in the first conductive layer, wherein the first conductive layer includes at least one of aluminum, molybdenum, titanium, tantalum, tungsten, nickel, cobalt, and platinum, and wherein a resistance value of the mixed layer is smaller than that of the second oxide layer.

6. The method according to claim 5,
wherein oxygen is added to the second semiconductor through the second insulating layer.

7. The method according to claim 5,
wherein the first sacrificial layer includes at least one of indium, gallium, and zinc.

8. The method according to claim 5,
wherein the first sacrificial layer includes silicon.

9. The method according to claim 5,
wherein a fourth insulating layer is formed over the second oxide layer and the second sacrificial layer after formation of the second insulating layer and the second sacrificial layer, and wherein the fourth insulating layer is processed to form a fifth insulating layer in contact with side surfaces of the second insulating layer and the second sacrificial layer.

10. The method according to claim 5,
wherein the first conductive layer is removed after formation of the mixed layer.

11. The method according to claim 5,
wherein the heat treatment is performed at a temperature higher than or equal to 200° C. and lower than or equal to 400° C.

12. A method for manufacturing a semiconductor device, comprising the steps of:

forming a first oxide layer;

selectively processing the first oxide layer to form a second oxide layer;

forming a first conductive layer over the second oxide layer;

performing heat treatment after formation of the first conductive layer, whereby forming a mixed layer in a region of the second oxide layer that is in contact with the first conductive layer;

forming a first insulating layer over the mixed layer;

removing part of the first insulating layer, the mixed layer, and the second oxide layer to form a third oxide layer;

forming a second insulating layer over the third oxide layer; and forming a second conductive layer over the second insulating layer, wherein the mixed layer includes at least one of elements included in the first conductive layer, wherein the first conductive layer includes at least one of aluminum, molybdenum, titanium, tantalum, tungsten, nickel, cobalt, and platinum, and wherein a resistance value of the mixed layer is smaller than that of the second oxide layer.

13. The method according to claim 12,
wherein the first conductive layer is removed after formation of the mixed layer.

14. The method according to claim 12,
wherein the heat treatment is performed at a temperature higher than or equal to 200° C. and lower than or equal to 400° C.

* * * * *